United States Patent
Kirino et al.

(10) Patent No.: US 10,651,138 B2
(45) Date of Patent: May 12, 2020

(54) MICROWAVE IC WAVEGUIDE DEVICE MODULE

(71) Applicants: Nidec Corporation, Minami-ku, Kyoto (JP); WGR Co., Ltd., Shimogyo-ku, Kyoto, Kyoto (JP)

(72) Inventors: Hideki Kirino, Kyoto (JP); Hiroyuki Kamo, Kyoto (JP)

(73) Assignees: NIDEC CORPORATION, Kyoto (JP); WGR CO., LTD., Kyoto (JP)

( * ) Notice: Subject to any disclaimer, the term of this patent is extended or adjusted under 35 U.S.C. 154(b) by 43 days.

(21) Appl. No.: 16/145,491

(22) Filed: Sep. 28, 2018

(65) Prior Publication Data
US 2019/0139914 A1 May 9, 2019

Related U.S. Application Data

(63) Continuation of application No. PCT/JP2017/012349, filed on Mar. 27, 2017.

(30) Foreign Application Priority Data

Mar. 29, 2016 (JP) .................................. 2016-065282

(51) Int. Cl.
*H01L 23/34* (2006.01)
*H01L 23/66* (2006.01)
(Continued)

(52) U.S. Cl.
CPC .............. *H01L 23/66* (2013.01); *G01S 13/34* (2013.01); *G01S 13/931* (2013.01);
(Continued)

(58) Field of Classification Search
CPC ............. H01L 23/66; H01L 2924/1423; H01L 2223/6683; H01L 23/481;
(Continued)

(56) References Cited

U.S. PATENT DOCUMENTS

| 5,471,181 | A | 11/1995 | Park |
| 6,124,636 | A * | 9/2000 | Kusamitsu .............. H01L 23/66 |
| | | | 257/532 |

(Continued)

FOREIGN PATENT DOCUMENTS

| CN | 103650236 A | 3/2014 |
| CN | 105144481 A | 12/2015 |

(Continued)

OTHER PUBLICATIONS

Kirino et al., "A 76 GHz Multi-Layered Phased Array Antenna Using a Non-Metal Contact Metamaterial Waveguide", IEEE Transactions on Antennas and Propagation, vol. 60, No. 2, Feb. 2012, pp. 840-853.

(Continued)

*Primary Examiner* — S. V. Clark
(74) *Attorney, Agent, or Firm* — Keating & Bennett

(57) ABSTRACT

A microwave IC waveguide device module includes: a substrate having a throughhole; a microwave IC provided on or above the first face of the substrate; a waveguide member provided below the second face of the substrate opposite from the first face, the waveguide member having an electrically conductive waveguide face which opposes the throughhole; an electrically conductive member covering at least a portion of the second face that extends in a manner of following along the waveguide face; and an artificial magnetic conductor on both sides of the waveguide member. The substrate includes an inner-wall electrically conductive portion covering an inner wall of the throughhole and being electrically connected with the electrically conductive member. The signal terminal and the ground terminal of the IC are electrically connected respectively with two portions of the inner-wall electrically conductive portion opposing each other with the throughhole interposed therebetween.

26 Claims, 36 Drawing Sheets

(51) Int. Cl.
*H01P 3/08* (2006.01)
*H01P 3/123* (2006.01)
*G01S 13/34* (2006.01)
*G01S 13/931* (2020.01)
*H01L 23/367* (2006.01)
*H01P 3/12* (2006.01)
*H01P 5/12* (2006.01)
*H01P 3/02* (2006.01)
*G01S 13/93* (2020.01)

(52) U.S. Cl.
CPC ............ *H01L 23/367* (2013.01); *H01P 3/085* (2013.01); *H01P 3/121* (2013.01); *H01P 3/123* (2013.01); *G01S 2013/9371* (2013.01); *H01L 2223/6616* (2013.01); *H01L 2223/6627* (2013.01); *H01L 2223/6683* (2013.01); *H01P 3/026* (2013.01); *H01P 5/12* (2013.01)

(58) Field of Classification Search
CPC ..... H01L 2924/1461; H01L 2223/6616; H01L 2223/6627
USPC .................................................. 257/728, 678
See application file for complete search history.

(56) References Cited

U.S. PATENT DOCUMENTS

| | | |
|---|---|---|
| 6,191,704 B1 | 2/2001 | Takenaga et al. |
| 6,339,395 B1 | 1/2002 | Hazumi et al. |
| 6,403,942 B1 | 6/2002 | Stam |
| 6,611,610 B1 | 8/2003 | Stam et al. |
| 6,628,299 B2 | 9/2003 | Kitayama |
| 6,661,367 B2 | 12/2003 | Sugiyama et al. |
| 6,703,967 B1 | 3/2004 | Kuroda et al. |
| 6,903,677 B2 | 6/2005 | Takashima et al. |
| 6,943,726 B2 | 9/2005 | Schneider |
| 7,161,561 B2 | 1/2007 | Kitayama |
| 7,355,524 B2 | 4/2008 | Schofield |
| 7,358,889 B2 | 4/2008 | Abe et al. |
| 7,417,580 B2 | 8/2008 | Abe et al. |
| 7,420,159 B2 | 9/2008 | Heslin et al. |
| 7,425,983 B2 | 9/2008 | Izumi et al. |
| 7,570,198 B2 | 8/2009 | Tokoro |
| 7,619,567 B2 * | 11/2009 | Lynch .................. H01Q 9/0457 343/700 MS |
| 7,978,122 B2 | 7/2011 | Schmidlin |
| 8,068,134 B2 | 11/2011 | Yoshizawa |
| 8,446,312 B2 | 5/2013 | Kanamoto et al. |
| 8,543,277 B2 | 9/2013 | Higgins-Luthman |
| 8,593,521 B2 | 11/2013 | Schofield et al. |
| 8,604,968 B2 | 12/2013 | Alland et al. |
| 8,610,620 B2 | 12/2013 | Katoh |
| 8,614,640 B2 | 12/2013 | Lynam |
| 8,636,393 B2 | 1/2014 | Schofield |
| 8,730,096 B2 | 5/2014 | Kanamoto et al. |
| 8,730,099 B2 | 5/2014 | Kanamoto et al. |
| 8,779,995 B2 | 7/2014 | Kirino et al. |
| 8,803,638 B2 | 8/2014 | Kildal |
| 8,861,842 B2 | 10/2014 | Jung et al. |
| 9,286,524 B1 | 3/2016 | Mei et al. |
| 9,786,995 B2 | 10/2017 | Kirino et al. |
| 2001/0033211 A1 | 10/2001 | Nakada |
| 2002/0044033 A1 | 4/2002 | Tamaki |
| 2005/0029632 A1 * | 2/2005 | McKinzie, III ........... H01P 1/16 257/665 |
| 2005/0140470 A1 * | 6/2005 | Tamaki .................... G01S 7/032 333/202 |
| 2007/0120223 A1 * | 5/2007 | McKinzie, III ........... H01P 1/16 257/533 |
| 2009/0079648 A1 | 3/2009 | Matsuo et al. |
| 2010/0148892 A1 | 6/2010 | Tsutsumi et al. |
| 2011/0180917 A1 | 7/2011 | Tang |
| 2011/0187614 A1 | 8/2011 | Kirino et al. |
| 2011/0298568 A1 | 12/2011 | Uchimura et al. |
| 2012/0092224 A1 | 4/2012 | Sauleau et al. |
| 2012/0248587 A1 | 10/2012 | Alleaume et al. |
| 2013/0033404 A1 | 2/2013 | Abe |
| 2014/0111291 A1 | 4/2014 | Kinpara et al. |
| 2015/0264230 A1 | 9/2015 | Takeda |
| 2016/0126636 A1 | 5/2016 | Uemichi |
| 2016/0140424 A1 | 5/2016 | Wang et al. |
| 2016/0264065 A1 | 9/2016 | Takeda |
| 2017/0317427 A1 | 11/2017 | Kirino et al. |
| 2018/0040963 A1 | 2/2018 | Kirino et al. |

FOREIGN PATENT DOCUMENTS

| | | |
|---|---|---|
| EP | 1 263 078 A2 | 12/2002 |
| EP | 1 331 688 A1 | 7/2003 |
| JP | 11-112209 A | 4/1999 |
| JP | 2001-267838 A | 9/2001 |
| JP | 2004-257848 A | 9/2004 |
| JP | 2007-259047 A | 10/2007 |
| JP | 2010-021828 A | 1/2010 |
| JP | 2010-141691 A | 6/2010 |
| JP | 2011-029446 A | 2/2011 |
| JP | 2012-004700 A | 1/2012 |
| JP | 2012-523149 A | 9/2012 |
| JP | 2012-526434 A | 10/2012 |
| JP | 2013-032979 A | 2/2013 |
| JP | 2013-058887 A | 3/2013 |
| WO | 01/67540 A1 | 9/2001 |
| WO | 2008/081807 A1 | 7/2008 |
| WO | 2010/005672 A2 | 1/2010 |
| WO | 2010/050122 A1 | 5/2010 |
| WO | 2015/172948 A2 | 11/2015 |
| WO | 2016/163932 A1 | 10/2016 |

OTHER PUBLICATIONS

Zaman et al., "Ku Band Linear Slot-Array in Ridge Gapwaveguide Technolgy", 7th European Conference on Antennas and Propagation (EUCAP 2013)—Convened Sessions, 2013, pp. 2968-2971.
Kildal et al., "Local Metamaterial-Based Waveguides in Gaps Between Parallel Metal Plates", IEEE Antennas and Wireless Propagation Letters, vol. 8, 2009, pp. 84-87.
Pucci et al., "Design of a Dual-Mode Horn Element for Microstrip Gap Waveguide Fed Array", 7th European Conference on Antennas and Propagation (EUCAP 2013)—Convened Sessions, 2013, pp. 2976-2979.
Kildal, "Metasurfing Since 1987—A Personal Story Involving Soft and Hard Surfaces, EGB Surfaces, Cloaking, Gap Waveguides and Mass Production", 2014 IEEE Antennas and Propagation Society International Symposium, 2014, pp. 529-530.
Sehm et al., "A High-Gain 58-GHz Box-Horn Array Antenna with Suppressed Grating Lobes", IEEE Transactions on Antennas and Propagation, vol. 47, No. 7, Jul. 1999, pp. 1125-1130.
Zaman et al., "Slot Antenna in Ridge Gap Waveguide Technology", 6th European Conference on Antennas and Propagation, Mar. 2012, pp. 3243 & 3244.
Zarifi et al., "Design and Fabrication of a High-Gain 60-GHz Corrugated Slot Antenna Array With Ridge Gap Waveguide Distribution Layer", IEEE Transactions on Antennas and Propagation, vol. 64, No. 7, Jul. 2016, pp. 2905-2913.
Mustafa, "Hybrid Analog-Digital Beam-Steered Slot Antenna Array for mm-Wave Applications in Gap Waveguide Technology", Department of Electronics and Telecommunications Master of Science in Telecommunications Engineering Master's Thesis, Oct. 2015, 67 pages.
Kirino et al., "Simplified Wavelength Calculations for Fast and Slow Wave Metamaterial Ridged Waveguides and their Application to Array Antenna Design", Proceedings of the International Symposium on Antennas & Propagation, Oct. 25, 2013, 4 pages.
Ahmadi et al., "Direct Coupled Resonator Filters Realized by Gap Waveguide Technology", IEEE Transactions on Microwave Theory and Techniques, vol. 63, No. 10, Oct. 2015, pp. 3445-3452.

(56) References Cited

OTHER PUBLICATIONS

Official Communication issued in International Patent Application No. PCT/JP2017/012349, dated Jun. 13, 2017.

* cited by examiner

MICROWAVE IC WAVEGUIDE DEVICE MODULE

This is a continuation of International Application No. PCT/JP2017/12349, with an international filing date of Mar. 27, 2017, which claims priority of Japanese Patent Application No. 2016-065282, filed on Mar. 29, 2016, the entire contents of which are hereby incorporated by reference.

BACKGROUND

1. Technical Field

The present disclosure relates to a microwave integrated circuit, a radar device, and a radar system for connection and use with a waveguide device that guides electromagnetic waves by utilizing an artificial magnetic conductor.

2. Description of the Related Art

Microwaves (including millimeter waves) for use in a radar system are generated by an integrated circuit which is mounted on a substrate (which herein will be referred to as a "microwave IC"). Depending on the method by which it is produced, a microwave IC may be referred to as an "MIC" (Microwave Integrated Circuit) or an "MMIC" (Monolithic Microwave Integrated Circuit; or Microwave and Millimeter wave Integrated Circuit). A microwave IC generates an electrical signal to serve as a basis for a signal wave to be transmitted, and outputs the electrical signal at a signal terminal of the microwave IC. Via a conductor line such as a bonding wire and a waveguide on a substrate as will be described later, the electrical signal arrives at a conversion section which is provided at a site of connection between the aforementioned waveguide and a hollow waveguide, i.e., at a boundary between different kinds of waveguides.

The conversion section includes an RF signal generating section. The "RF (radio frequency) signal generating section" refers to a portion constructed so as to convert an electrical signal which has been led through the conductor line from the signal terminal of the microwave IC into an RF electromagnetic field, right before the hollow waveguide. The electromagnetic wave as converted by the RF signal generating section will be led to the hollow waveguide.

The following two structures have been commonly used as the structure from the signal terminal of the microwave IC to the RF signal generating section right before the hollow waveguide.

A first structure is described for example in Japanese Laid-Open Patent Publication No. 2010-141691, where a signal terminal of a radio frequency circuit module 8 (corresponding to the microwave IC) and feed pins 10 (corresponding to the RF signal generating section) are connected as close to each other as possible, such that an electromagnetic wave that has been converted by the RF signal generating section is received at a hollow waveguide 1. In this structure, the signal terminal of the microwave IC is directly connected to the RF signal generating section via a transmission line 9. As a result, attenuation of the radio frequency signal is reduced. On the other hand, in this first structure, the hollow waveguide needs to extend to near the signal terminal of the microwave IC. The hollow waveguide is made of an electrically conductive metal, and requires fine processing in radio frequency regions, corresponding to the wavelength of the electromagnetic wave to be guided. Conversely, at lower frequencies, the structure requires large size, and the direction of waveguiding is restricted. Thus, the first structure has a problem in that the processing circuitry which is constituted by the microwave IC and the mounting substrate thereof becomes large in size.

A second structure is described for example in Japanese National Phase PCT Laid-Open Publication No. 2012-526434. Via a path called a microstrip line (which herein may be abbreviated as "MSL"), a signal terminal of a millimeter wave IC is led to an MSLRF signal generating section that is formed on a substrate, with a hollow waveguide being connected thereto. An MSL is a type of waveguide which is composed of a strip-shaped conductor on a top face of a substrate and an electrical conductor layer on a bottom face of the substrate, such that a radio wave is propagated as oscillations of an electric field which occurs between the top conductor and the bottom conductor and a magnetic field surrounding the top conductor.

In the second structure, an MSL is present between the signal terminal of the microwave IC and the RF signal generating section connecting to the hollow waveguide. In certain example experiments, an MSL is said to suffer about 0.4 dB of attenuation per 1 mm of its length, thus presenting attenuation problems in radiowave power. Moreover, for stabilization of the state of radio wave oscillation and other purposes, a complicated structure of dielectric layers and conductor layers is required in the RF signal generating section at the terminal end of the MSL (see FIGS. 3 to 8 of Japanese National Phase PCT Laid-Open Publication No. 2012-526434).

On the other hand, this second structure allows the site of connection between the RF signal generating section and the hollow waveguide to be located away from the microwave IC. Since this allows the hollow waveguide structure to be simplified, it is possible to downsize the microwave processing circuitry.

SUMMARY

Conventionally, as radio waves (including millimeter waves) enjoy a broader range of applications, more than one radiowave signal channel tends to be incorporated in a single microwave IC. In addition, downsizing has been furthered based on improvements in the degree of circuit integration. Moreover, plural channels of signal terminals have been densely placed on a single microwave IC. At the site between the signal terminal of the microwave IC and the hollow waveguide, this has made it difficult to adopt the aforementioned first structure; thus, the second structure has mostly been adopted.

In recent years, as the demands for onboard applications have increased, e.g., onboard radar systems utilizing millimeter waves, there has been a desire for an ability to recognize more and more remote situations from the vehicle of interest by using millimeter wave radar. It has also been desired to facilitate radar installation and improve maintainability, as would be realized by installing a millimeter wave radar within the vehicle room. In other words, there is a desire to minimize losses associated with radio wave attenuation in the waveguide from a microwave IC to transmission/reception antennas. Moreover, millimeter wave radar has been applied not only to recognizing situations at the vehicle front, but also to recognizing those on the sides or the rear of the vehicle. In those cases, there are strong demands for downsizing (e.g., installment in the side mirror boxes) and inexpensiveness (in view of a large number of radars being used).

Against these demands, the aforementioned second structure has suffered from problems such as losses in the microstrip line, as well as difficulties of downsizing and needs of fine processing associated with the use of a hollow waveguide.

A microwave IC waveguide device module according to an implementation of the present disclosure comprises a substrate having a throughhole, the substrate having a first face and a second face which is opposite from the first face; a microwave IC provided on or above the first face of the substrate; a waveguide member provided below the second face of the substrate, the waveguide member having an electrically conductive waveguide face which opposes the throughhole, the waveguide face having a stripe shape extending in a manner of following along the substrate; an electrically conductive member covering at least a portion of the second face that extends in a manner of following along the waveguide face; and an artificial magnetic conductor extending on both sides of the waveguide member. The microwave IC includes a terminal pair, the terminal pair comprising a signal terminal and a ground terminal. The substrate includes an inner-wall electrically conductive portion covering an inner wall of the throughhole and being electrically connected with the electrically conductive member. The signal terminal and the ground terminal are electrically connected respectively with two portions of the inner-wall electrically conductive portion opposing each other with the throughhole interposed therebetween.

According to an illustrative embodiment of the present disclosure, a signal terminal and a ground terminal of the microwave IC are electrically connected respectively to two portions of the inner-wall electrically conductive portion opposing each other with the throughhole interposed therebetween. As the microwave IC outputs an RF electrical signal to the signal terminal, an electromagnetic wave occurs from the signal terminal and the ground terminal. The electromagnetic wave is directly radiated into the throughhole to propagate within the throughhole, and further propagates between the waveguide member opposing the throughhole and the electrically conductive member. Thus, without adopting a microstrip line, an electromagnetic wave can be propagated in the throughhole, whereby attenuation of an electromagnetic wave can be greatly reduced, and the structure can be simplified. This realizes downsizing of the microwave IC waveguide device module, and makes for greater ease of module fabrication.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 13, including (a) to (d), is a diagram showing other example cross-sectional shapes for the throughhole 140 and the inner-wall conductive portion 140a.

FIG. 19C is a diagram showing a planar layout of waveguide members 322U in a first waveguide device 350a.

DETAILED DESCRIPTION

<Terminology>

Figure 1:
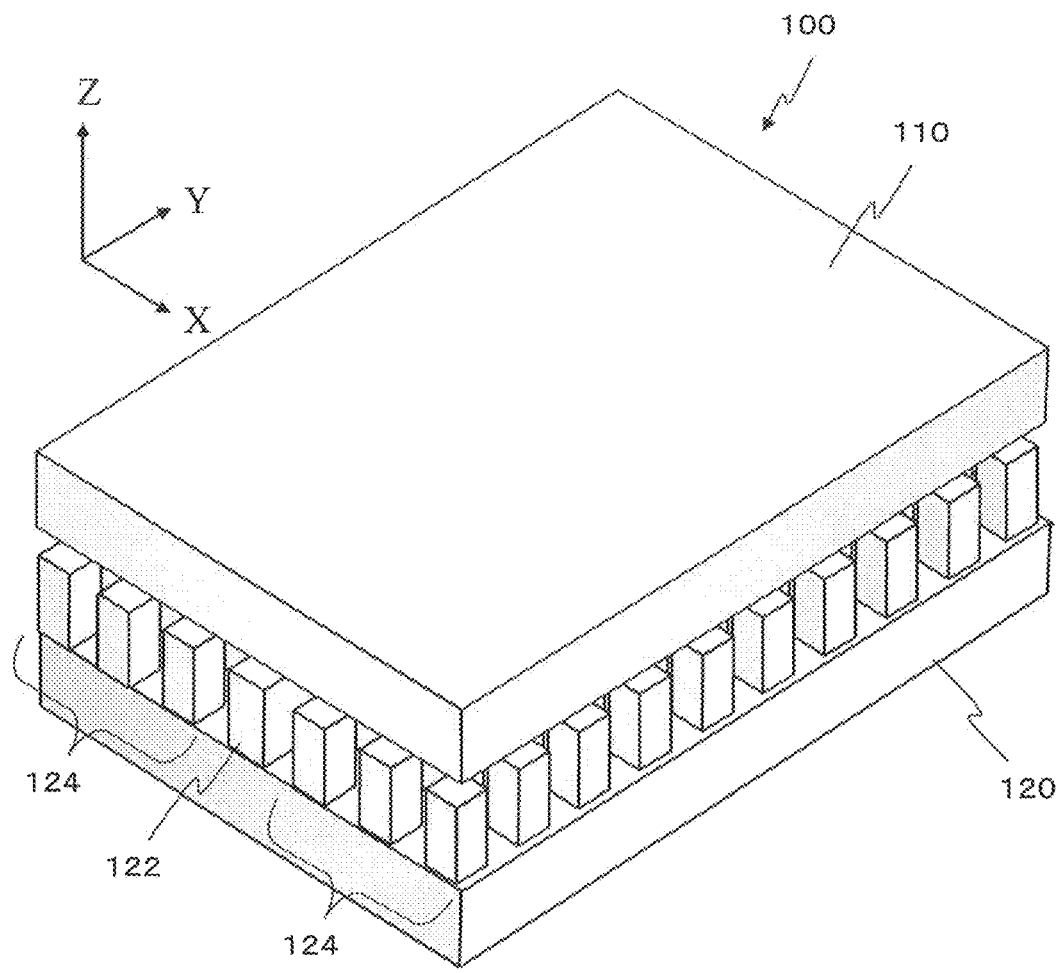
FIG. 1 is a perspective view schematically showing a non-limiting example of the fundamental construction of a waveguide device.

A "microwave" means an electromagnetic wave in a frequency range from 300 MHz to 300 GHz. Among "microwaves", those electromagnetic waves in a frequency range from 30 GHz to 300 GHz are referred to as "millimeter waves". In a vacuum, the wavelength of a "microwave" is in the range from 1 mm to 1 m, whereas the wavelength of a "millimeter wave" is in the range from 1 mm to 10 mm.

A "microwave IC (microwave integrated circuit element)" is a semiconductor integrated circuit chip or package that generates or processes a radio frequency signal of the microwave band. A "package" is a package including one or more semiconductor integrated circuit chip(s) (monolithic IC chip(s)) that generates or processes a radio frequency signal of the microwave band. When one or more microwave ICs are integrated on a single semiconductor substrate, it is particularly called a "monolithic microwave integrated circuit" (MMIC). Although a "microwave IC" may often be referred to as an "MMIC" in the present disclosure, this is only an example; it is not a requirement that one or more microwave ICs be integrated on a single semiconductor substrate. Moreover, a "microwave IC" that generates or processes a radio frequency signal of the millimeter band may be referred to as a "millimeter wave IC".

An "IC-mounted substrate" means a mounting substrate on which a microwave IC is mounted, and thus includes the "microwave IC" and the "mounting substrate" as its constituent elements. The "mounting substrate", by itself, should be interpreted as a substrate on which a microwave IC is to be mounted but has not been mounted.

A "waveguide module" includes a "mounting substrate", with no "microwave IC" mounted thereon, and a "waveguide device". On the other hand, a "microwave module" includes a "mounting substrate having a microwave IC mounted thereon (i.e., an IC-mounted substrate)" and a "waveguide device".

Prior to describing embodiments of the present disclosure, the fundamental construction and operation principles of a waveguide device to be used in each of the embodiments below will be described.

<Waveguide Device>

The aforementioned ridge waveguide is provided in a waffle iron structure which is capable of functioning as an artificial magnetic conductor. A ridge waveguide in which such an artificial magnetic conductor is utilized based on the present disclosure (which hereinafter may be referred to as a WRG: Waffle-iron Ridge waveguide) is able to realize an antenna feeding network with low losses in the microwave or the millimeter wave band. Moreover, use of such a ridge waveguide allows antenna elements (radiating elements) to be disposed with a high density. Hereinafter, an example of the fundamental construction and operation of a waveguide structure will be described.

An artificial magnetic conductor is a structure which artificially realizes the properties of a perfect magnetic conductor (PMC), which does not exist in nature. One property of a perfect magnetic conductor is that "a magnetic field on its surface has zero tangential component". This property is the opposite of the property of a perfect electric conductor (PEC), i.e., "an electric field on its surface has zero tangential component". Although no perfect magnetic conductor exists in nature, it can be embodied by an artificial periodic structure. An artificial magnetic conductor functions as a perfect magnetic conductor in a specific frequency band which is defined by its periodic structure. An artificial magnetic conductor restrains or prevents an electromagnetic wave of any frequency that is contained in the specific frequency band (propagation-restricted band) from propagating along the surface of the artificial magnetic conductor. For this reason, the surface of an artificial magnetic conductor may be referred to as a high impedance surface.

In conventionally-known waveguide devices, e.g., waveguide devices which are disclosed in (1) International Publication No. 2010/050122, (2) U.S. Pat. No. 8,803,638, (3) European Patent Application Publication No. 1331688, (4) Kirino et al., "A 76 GHz Multi-Layered Phased Array Antenna Using a Non-Metal Contact Metamaterial Waveguide", IEEE Transaction on Antennas and Propagation, Vol. 60, No. 2, February 2012, pp 840-853, and (5) Kildal et al., "Local Metamaterial-Based Waveguides in Gaps Between Parallel Metal Plates", IEEE Antennas and Wireless Propagation Letters, Vol. 8, 2009, pp 84-87, an artificial magnetic conductor is realized by a plurality of electrically conductive rods which are arrayed along row and column directions. Such electrically conductive rods are projections, which may also be referred to as posts or pins. Each of these waveguide devices, as a whole, includes a pair of electrically conductive plates opposing each other. One conductive plate has a ridge protruding toward the other conductive plate, and stretches of an artificial magnetic conductor extending on both sides of the ridge. An upper face (i.e., its electrically conductive face) of the ridge opposes, via a gap, a conductive surface of the other conductive plate. An electromagnetic wave (signal wave) of a wavelength which is contained in the propagation-restricted band of the artificial magnetic conductor propagates along the ridge, in the space (gap) between this conductive surface and the upper face of the ridge.

FIG. 1 is a perspective view schematically showing a non-limiting example of the fundamental construction of such a waveguide device. FIG. 1 shows XYZ coordinates along X, Y and Z directions which are orthogonal to one another. The waveguide device 100 shown in the figure includes a plate-like first conductive member 110 and a plate-like second conductive member 120, which are in opposing and parallel positions to each other. A plurality of conductive rods 124 are arrayed on the second conductive member 120.

Note that any structure appearing in a figure of the present application is shown in an orientation that is selected for ease of explanation, which in no way should limit its orientation when an embodiment of the present disclosure is actually practiced. Moreover, the shape and size of a whole or a part of any structure that is shown in a figure should not limit its actual shape and size.

Figure 2A:
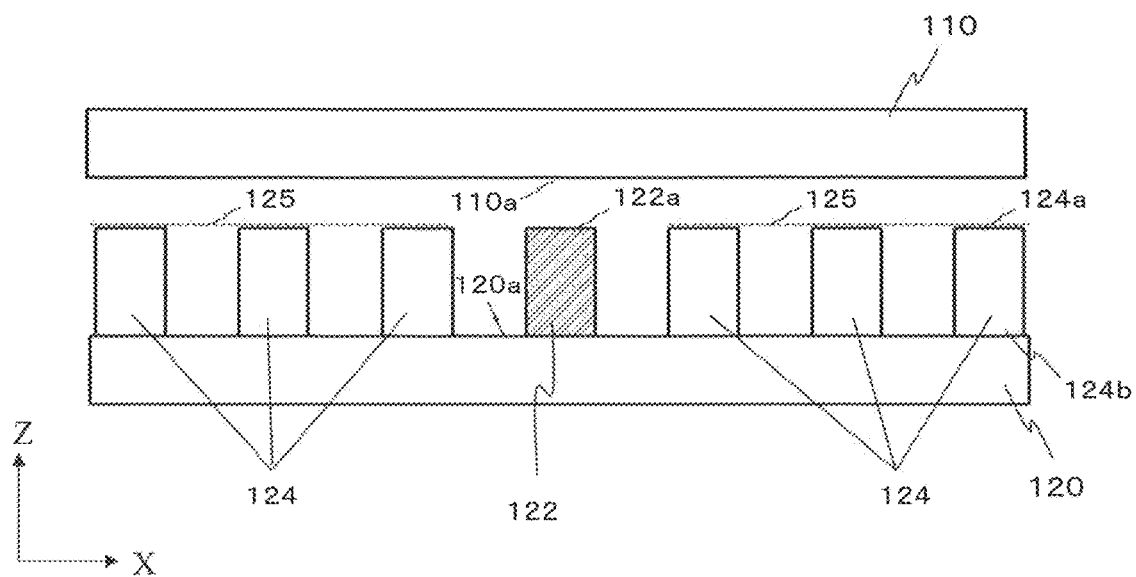
FIG. 2A is a diagram schematically showing a construction of a cross section of a waveguide device 100, taken parallel to the XZ plane.
Figure 2B:
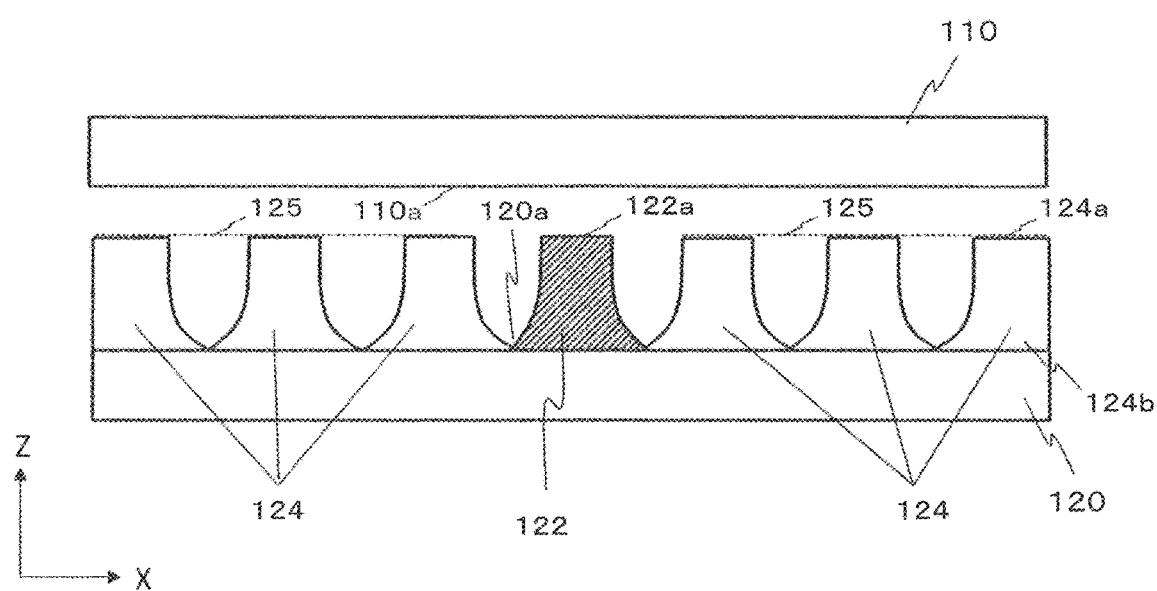
FIG. 2B is a diagram schematically showing another construction of a cross section of a waveguide device 100, taken parallel to the XZ plane.

FIG. 2A is a diagram schematically showing the construction of a cross section of the waveguide device 100, taken parallel to the XZ plane. As shown in FIG. 2A, the conductive member 110 has a conductive surface 110*a* on the side facing the conductive member 120. The conductive surface 110*a* has a two-dimensional expanse along a plane which is orthogonal to the axial direction (Z direction) of the conductive rods 124 (i.e., a plane which is parallel to the XY plane). Although the conductive surface 110*a* is shown to be a smooth plane in this example, the conductive surface 110*a* does not need to be a plane, as will be described later.

Figure 3:
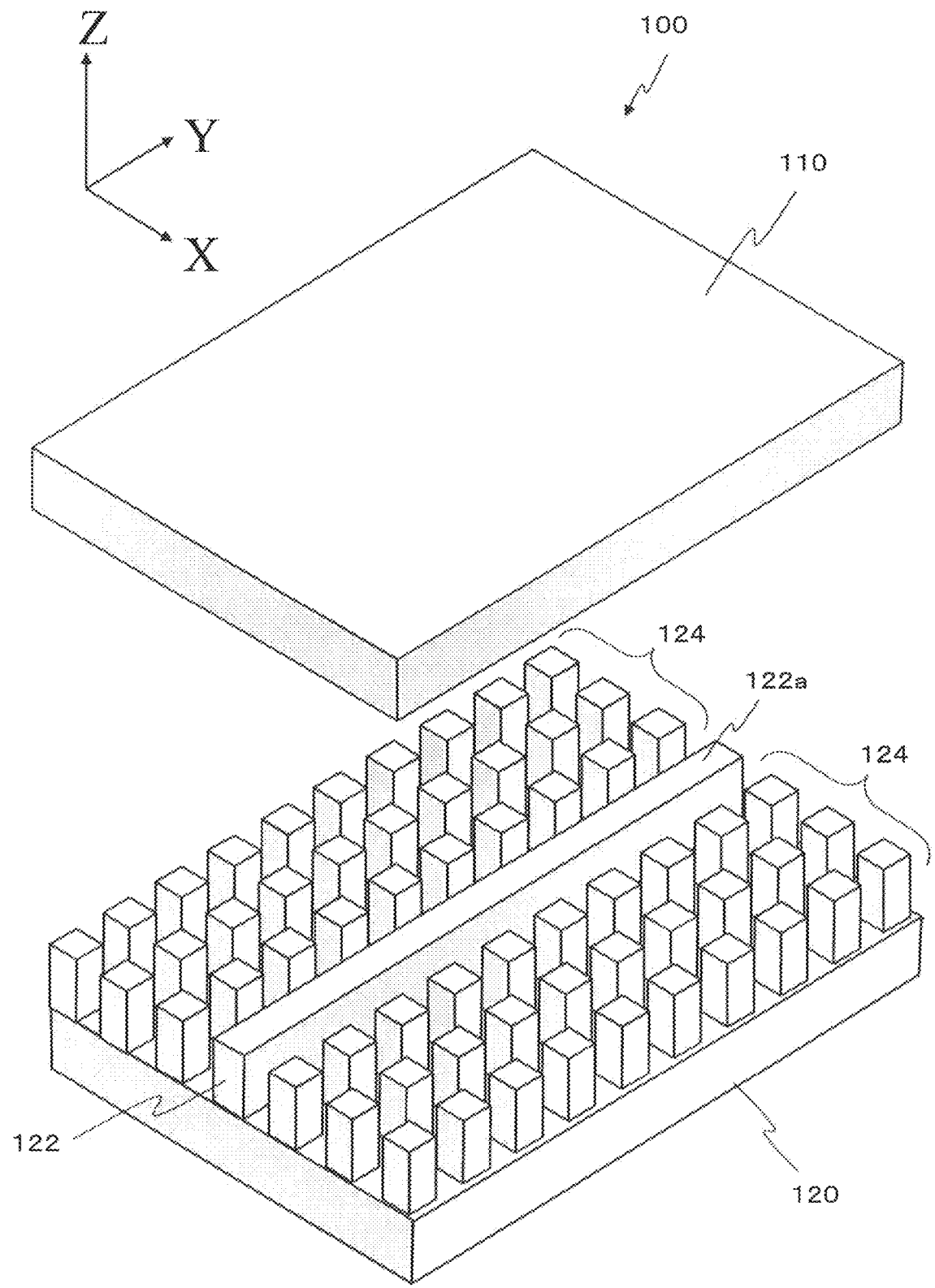
FIG. 3 is a perspective view schematically showing the waveguide device 100, illustrated so that the spacing between a first conductive member 110 and a second conductive member 120 is exaggerated for ease of understanding.

FIG. 3 is a perspective view schematically showing the waveguide device 100, illustrated so that the spacing between the conductive member 110 and the conductive member 120 is exaggerated for ease of understanding. In an actual waveguide device 100, as shown in FIG. 1 and FIG. 2A, the spacing between the conductive member 110 and the conductive member 120 is narrow, with the conductive member 110 covering over all of the conductive rods 124 on the conductive member 120.

See FIG. 2A again. The plurality of conductive rods 124 arrayed on the conductive member 120 each have a leading end 124*a* opposing the conductive surface 110*a*. In the example shown in the figure, the leading ends 124*a* of the plurality of conductive rods 124 are on the same plane. This plane defines the surface 125 of an artificial magnetic conductor. Each conductive rod 124 does not need to be entirely electrically conductive, so long as at least the surface (the upper face and the side face) of the rod-like structure is electrically conductive. Moreover, each conductive member 120 does not need to be entirely electrically conductive, so long as it can support the plurality of conductive rods 124 to constitute an artificial magnetic conductor. Of the surfaces of the conductive member 120, a face 120*a* carrying the plurality of conductive rods 124 may be electrically conductive, such that the surfaces of adjacent ones of the plurality of conductive rods 124 are electrically short-circuited. In other words, the entire combination of the conductive member 120 and the plurality of conductive rods 124 may at least include an electrically conductive surface with rises and falls opposing the conductive surface 110*a* of the conductive member 110.

On the conductive member 120, a ridge-like waveguide member 122 is provided among the plurality of conductive rods 124. More specifically, stretches of an artificial magnetic conductor are present on both sides of the waveguide member 122, such that the waveguide member 122 is sandwiched between the stretches of artificial magnetic conductor on both sides. As can be seen from FIG. 3, the waveguide member 122 in this example is supported on the conductive member 120, and extends linearly along the Y direction. In the example shown in the figure, the waveguide member 122 has the same height and width as those of the conductive rods 124. As will be described later, the height and width of the waveguide member 122 may have different values from those of the conductive rod 124. Unlike the conductive rods 124, the waveguide member 122 extends along a direction (which in this example is the Y direction) in which to guide electromagnetic waves along the conductive surface 110*a*. Similarly, the waveguide member 122 does not need to be entirely electrically conductive, but may at least include an electrically conductive waveguide face 122*a* opposing the conductive surface 110*a* of the conductive member 110. The conductive member 120, the plurality of conductive rods 124, and the waveguide member 122 may be parts of a continuous single-piece body. Furthermore, the conductive member 110 may also be a part of such a single-piece body.

On both sides of the waveguide member 122, the space between the surface 125 of each stretch of artificial magnetic conductor and the conductive surface 110*a* of the conductive member 110 does not allow an electromagnetic wave of any frequency that is within a specific frequency band to propagate. This frequency band is called a "prohibited band". The artificial magnetic conductor is designed so that the frequency of an electromagnetic wave (which hereinafter may be referred to as a "signal wave") to propagate in the waveguide device 100 (which may hereinafter be referred to as the "operating frequency") is contained in the prohibited band. The prohibited band may be adjusted based on the following: the height of the conductive rods 124, i.e., the depth of each groove formed between adjacent conductive rods 124; the diameter of each conductive rod 124; the interval between conductive rods 124; and the size of the gap between the leading end 124a and the conductive surface 110a of each conductive rod 124.

<Example Dimensions, Etc. of Each Member>

Next, with reference to FIG. 9, the dimensions, shape, positioning, and the like of each member will be described.

Figure 4:
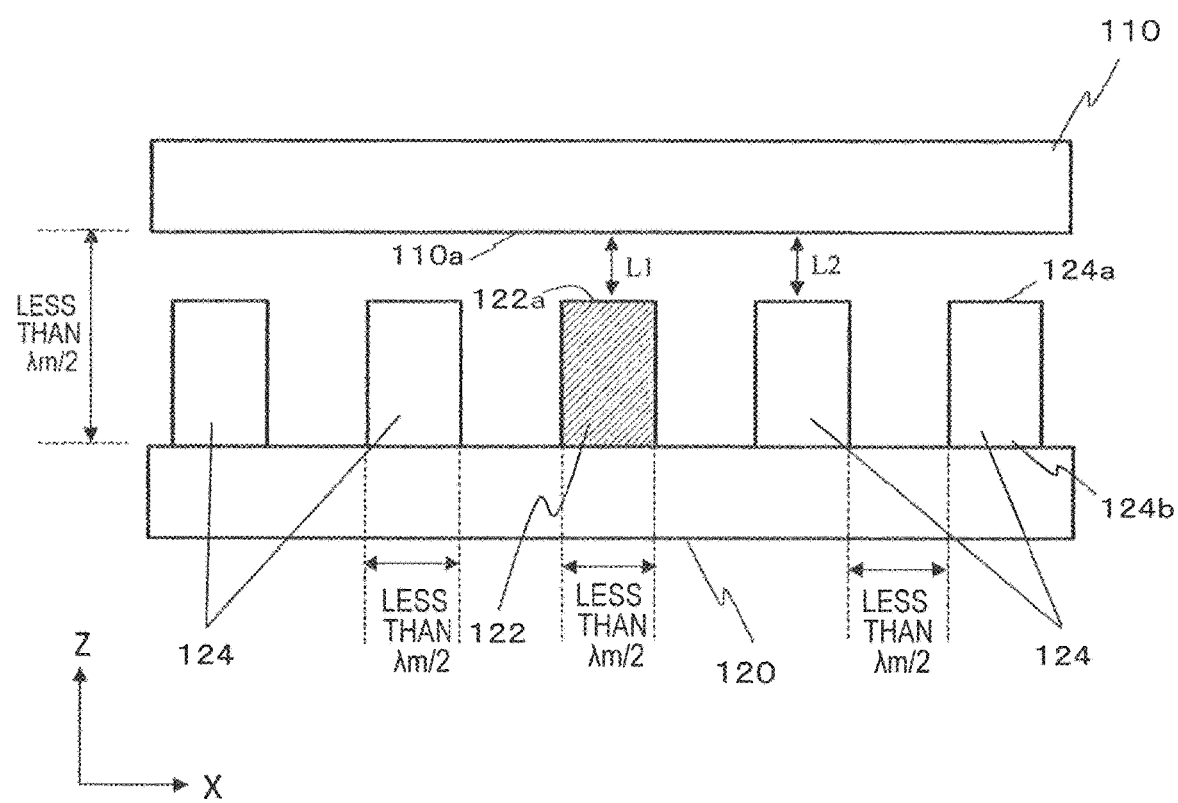
FIG. 4 is a diagram showing an exemplary range of dimension of each member in the structure shown in FIG. 2.

FIG. 4 is a diagram showing an exemplary range of dimension of each member in the structure shown in FIG. 2A. In the present specification, λo denotes a representative value of wavelength (e.g., a central wavelength corresponding to the center frequency of the operating frequency band) in free space of an electromagnetic wave (signal wave) propagating in a waveguide extending between the conductive surface 110a of the conductive member 110 and the waveguide face 122a of the waveguide member 122. Moreover, λm denotes a wavelength (shortest wavelength), in free space, of an electromagnetic wave of the highest frequency in the operating frequency band. The end of each conductive rod 124 that is in contact with the conductive member 120 is referred to as the "root". As shown in FIG. 4, each conductive rod 124 has the leading end 124a and the root 124b. Examples of dimensions, shapes, positioning, and the like of the respective members are as shown in the figure. Note that the dimensions, shape, positioning, and the like of the respective members shown in FIG. 4 are identical to those in FIGS. 8A and 8B, and therefore they will be described later with reference to FIGS. 8A and 8B.

Figure 5A:
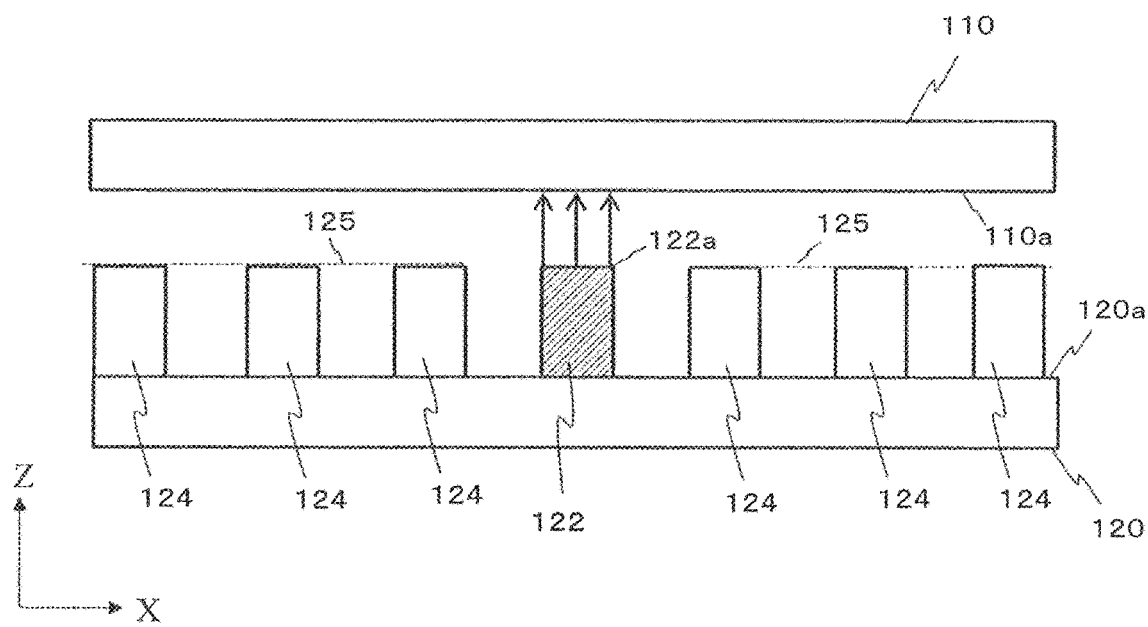
FIG. 5A is a diagram schematically showing an electromagnetic wave that propagates in a narrow space, i.e., a gap between a waveguide face 122a of a waveguide member 122 and a conductive surface 110a of the conductive member 110.

FIG. 5A schematically shows an electromagnetic wave that propagates in a narrow space, i.e., a gap between the waveguide face 122a of the waveguide member 122 and the conductive surface 110a of the conductive member 110. Three arrows in FIG. 5A schematically indicate the orientation of an electric field of the propagating electromagnetic wave. The electric field of the propagating electromagnetic wave is perpendicular to the conductive surface 110a of the conductive member 110 and to the waveguide face 122a.

On both sides of the waveguide member 122, stretches of artificial magnetic conductor that are created by the plurality of conductive rods 124 are present. An electromagnetic wave propagates in the gap between the waveguide face 122a of the waveguide member 122 and the conductive surface 110a of the conductive member 110. FIG. 5A is schematic, and does not accurately represent the magnitude of an electromagnetic field to be actually created by the electromagnetic wave. A part of the electromagnetic wave (electromagnetic field) propagating in the space over the waveguide face 122a may have a lateral expanse, to the outside (i.e., toward where the artificial magnetic conductor exists) of the space that is delineated by the width of the waveguide face 122a. In this example, the electromagnetic wave propagates in a direction (Y direction) which is perpendicular to the plane of FIG. 5A. As such, the waveguide member 122 does not need to extend linearly along the Y direction, but may include a bend(s) and/or a branching portion(s) not shown. Since the electromagnetic wave propagates along the waveguide face 122a of the waveguide member 122, the direction of propagation would change at a bend, whereas the direction of propagation would ramify into plural directions at a branching portion.

In the waveguide structure of FIG. 5A, no metal wall (electric wall), which would be indispensable to a hollow waveguide, exists on both sides of the propagating electromagnetic wave. Therefore, in the waveguide structure of this example, "a constraint due to a metal wall (electric wall)" is not included in the boundary conditions for the electromagnetic field mode to be created by the propagating electromagnetic wave, and the width (size along the X direction) of the waveguide face 122a is less than a half of the wavelength of the electromagnetic wave.

Figure 5B:
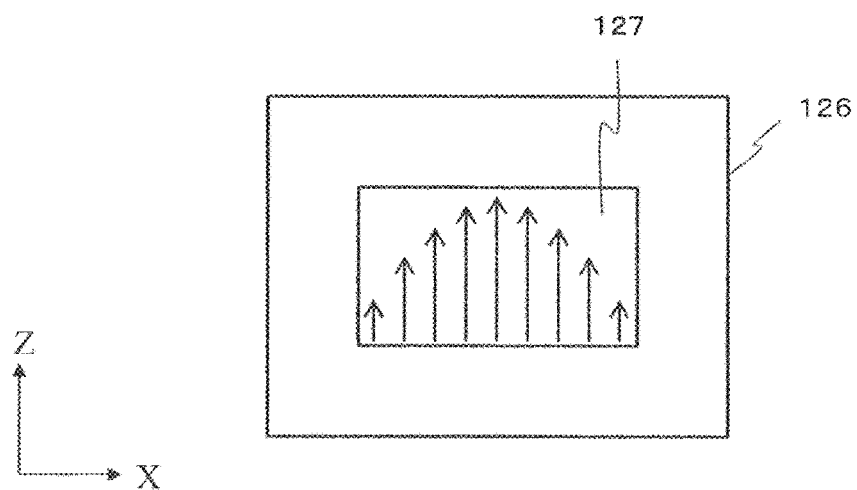
FIG. 5B is a diagram schematically showing a cross section of a hollow waveguide 126.

For reference, FIG. 5B schematically shows a cross section of a hollow waveguide 126. With arrows, FIG. 5B schematically shows the orientation of an electric field of an electromagnetic field mode ($TE_{10}$) that is created in the internal space 127 of the hollow waveguide 126. The lengths of the arrows correspond to electric field intensities. The width of the internal space 127 of the hollow waveguide 126 is set to a half of the wavelength. The width of the internal space 127 of the hollow waveguide 126 cannot be set to be smaller than a half of the wavelength of the propagating electromagnetic wave.

Figure 5C:
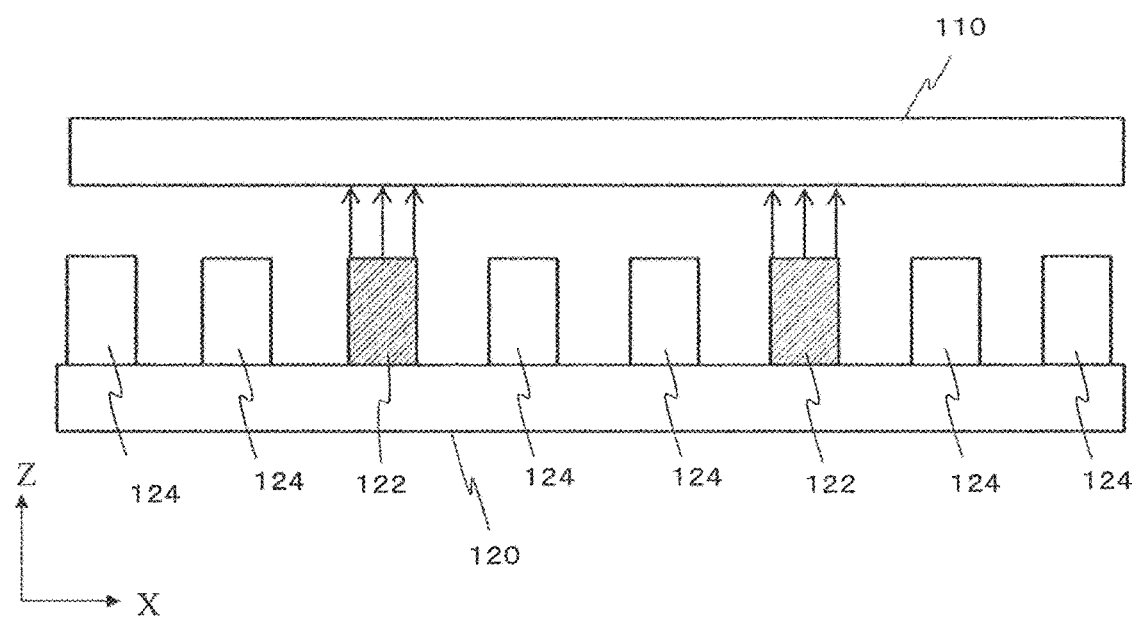
FIG. 5C is a cross-sectional view showing an implementation in which two waveguide members 122 are provided on the conductive member 120.

FIG. 5C is a cross-sectional view showing an implementation where two waveguide members 122 are provided on the conductive member 120. Thus, an artificial magnetic conductor that is created by the plurality of conductive rods 124 exists between the two adjacent waveguide members 122. More accurately, stretches of artificial magnetic conductor created by the plurality of conductive rods 124 are present on both sides of each waveguide member 122, such that each waveguide member 122 is able to independently propagate an electromagnetic wave.

Figure 5D:
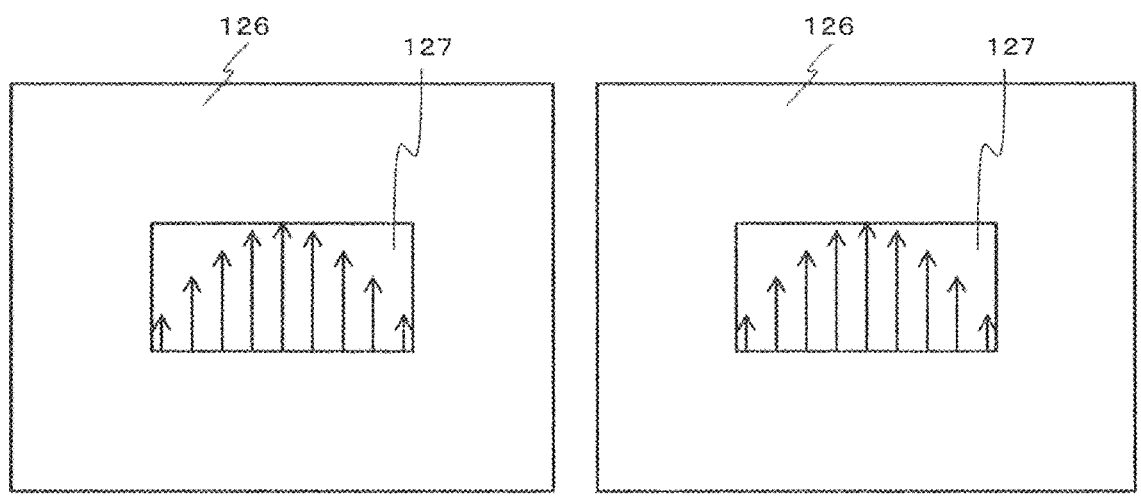
FIG. 5D is a diagram schematically showing a cross section of a waveguide device in which two hollow waveguides 126 are placed side-by-side.

For reference's sake, FIG. 5D schematically shows a cross section of a waveguide device in which two hollow waveguides 126 are placed side-by-side. The two hollow waveguides 126 are electrically insulated from each other. Each space in which an electromagnetic wave is to propagate needs to be surrounded by a metal wall that defines the respective hollow waveguide 126. Therefore, the interval between the internal spaces 127 in which electromagnetic waves are to propagate cannot be made smaller than a total of the thicknesses of two metal walls. Usually, a total of the thicknesses of two metal walls is longer than a half of the wavelength of a propagating electromagnetic wave. Therefore, it is difficult for the interval between the hollow waveguides 126 (i.e., interval between their centers) to be shorter than the wavelength of a propagating electromagnetic wave. Particularly for electromagnetic waves of wavelengths in the extremely high frequency range (i.e., electromagnetic wave wavelength: 10 mm or less) or even shorter wavelengths, a metal wall which is sufficiently thin relative to the wavelength is difficult to be formed. This presents a cost problem in commercially practical implementation.

On the other hand, a waveguide device 100 including an artificial magnetic conductor can easily realize a structure in which waveguide members 122 are placed close to one another. Thus, such a waveguide device 100 can be suitably used in an array antenna that includes plural antenna elements in a close arrangement.

Hereinafter, with reference to the attached drawings, an embodiment of a microwave IC waveguide device module according to the present disclosure will be described.

Figure 6:
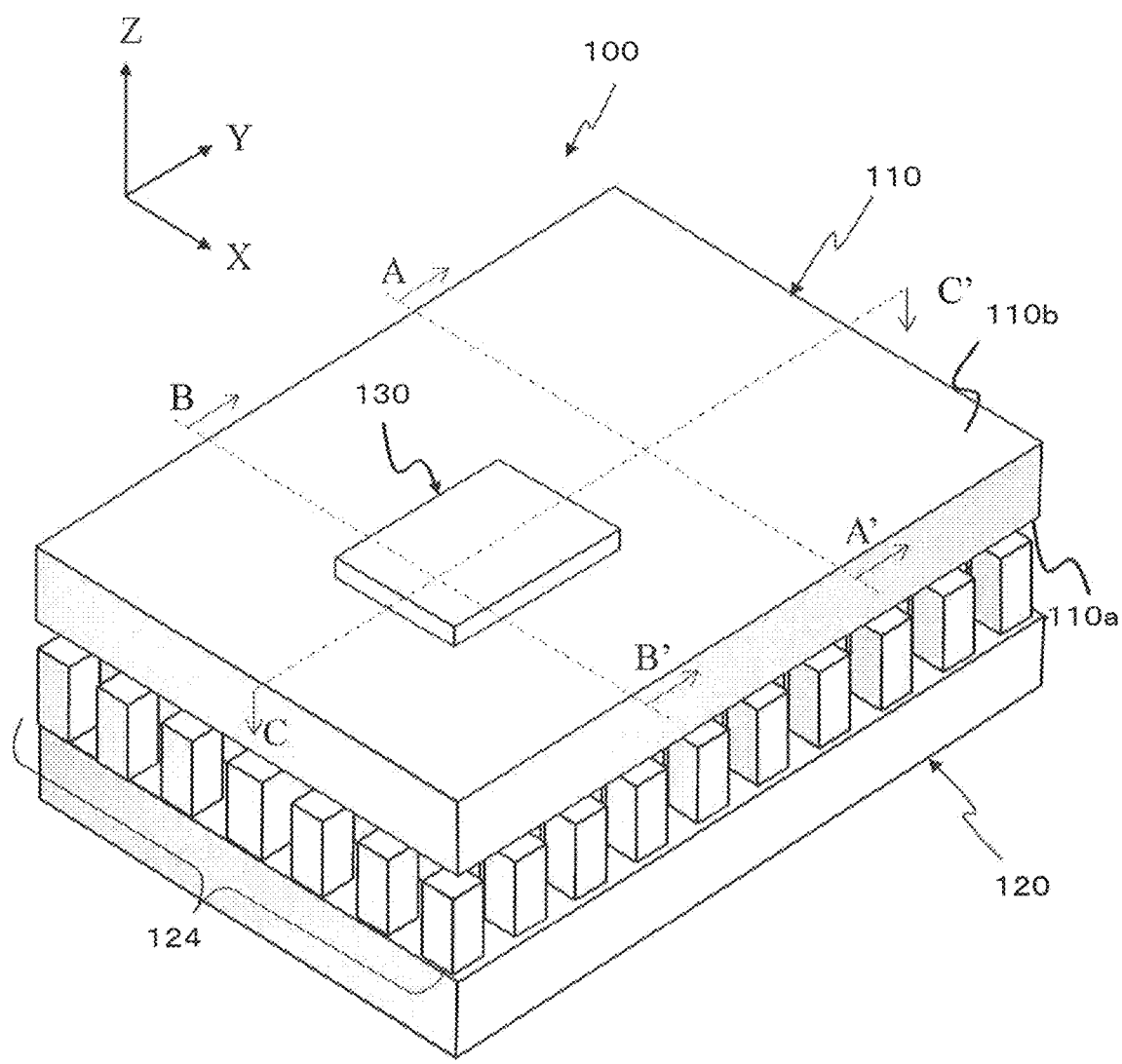
FIG. 6 is a schematic perspective view of a microwave IC waveguide device module 100 according to an illustrative embodiment of the present disclosure.

FIG. 6 is a perspective view schematically showing a non-limiting example of the fundamental construction of a microwave IC waveguide device module 100 according to an embodiment of the present disclosure. FIG. 6 shows XYZ coordinates along X, Y and Z directions which are orthogonal to one another. Note that any structure appearing in a figure of the present application is shown in an orientation that is selected for ease of explanation, which in no way should limit its orientation when an embodiment of the present disclosure is actually practiced. Moreover, the shape and size of a whole or a part of any structure that is shown in a figure should not limit its actual shape and size.

The microwave IC waveguide device module 100 includes a microwave IC substrate (board) 110, a plate-like waffle iron conductive member 120, and a microwave IC 130. Hereinafter, for simplicity of description, a microwave IC waveguide device module will be abbreviated as a "module", and a waffle iron conductive member as a "conductive member". Moreover, the conductive member 120 may also be referred to as a "conductive plate".

First, the module 100 will be described in outline.

The microwave IC substrate 110 and the conductive member 120 constitute a waveguide (i.e., a hollow waveguide and a ridge waveguide). A throughhole (described below) to function as a hollow waveguide is made in the microwave IC substrate 110. At least one pair terminals, each pair consisting of a signal terminal and a ground terminal, of the microwave IC 130 are connected to the throughhole, thus to generate an electromagnetic wave. The electromagnetic wave will go on to propagate within the throughhole, and propagate in a ridge waveguide which is provided further ahead. The ridge waveguide is provided in a waffle iron structure that is capable of functioning as an artificial magnetic conductor, which is constituted by a lower face of the microwave IC substrate 110 and the conductive member 120. A ridge waveguide such an artificial magnetic conductor is utilized (which hereinafter may be referred to as a WRG: Waffle-iron Ridge waveguide) is able to realize an antenna feeding network with low losses in the microwave or the millimeter wave band.

Hereinafter, the construction of the module 100 will be described in detail.

In the module 100, the microwave IC substrate 110 and the conductive member 120 are spaced apart, such that the spacing therebetween is defined based on a relationship with respect to the wavelength of an electromagnetic wave propagating in the module 100. For example, assuming that the wavelength in free space of an electromagnetic wave propagating in the module 100 is 4 mm, then the spacing between the microwave IC substrate 110 and the conductive member 120 is less than 2 mm. The dimensions of the module 100 will be described later in detail.

The microwave IC substrate 110 has a lower face 110*a* and an upper face 110*b*, which are parallel to the XY plane. The lower face 110*a* is a face on the −Z side of the microwave IC substrate 110 (i.e., the face that opposes the conductive member 120). The upper face 110*b* is a face on the +Z side of the microwave IC substrate 110 (i.e., a face not opposing the conductive member 120). Note that each of the lower face 110*a* and the upper face 110*b* does not need to be strictly parallel to the XY plane, but partly may be shaped as a curved surface.

The microwave IC 130 is provided at the upper face 110*b* of the microwave IC substrate 110. The microwave IC 130 is a circuit in which active elements (e.g., transistors and/or diodes) and passive elements (e.g., transmission lines, resistors, capacitors, and/or inductors) are integrated. Furthermore, any circuit in which circuitry possessing a plurality of functions are integrated also falls under the definition of the microwave IC 130. When one or more microwave ICs are integrated on a single semiconductor substrate, it is particularly called a "monolithic microwave integrated circuit" (MMIC).

The microwave IC 130 may generate an electrical signal to serve as a basis for a signal wave (electromagnetic wave) to be radiated from an antenna element of a radar system, for example. Alternatively, the microwave IC 130 may process an electrical signal which is derived from a signal wave (electromagnetic wave) that is received via an antenna element of a radar system. Detailed description of the specific functions of the microwave IC 130 and the internal construction for realizing such functions are omitted.

The conductive member 120 includes a plurality of conductive rods 124. The details thereof will be described with reference to FIG. 7.

Figure 7:
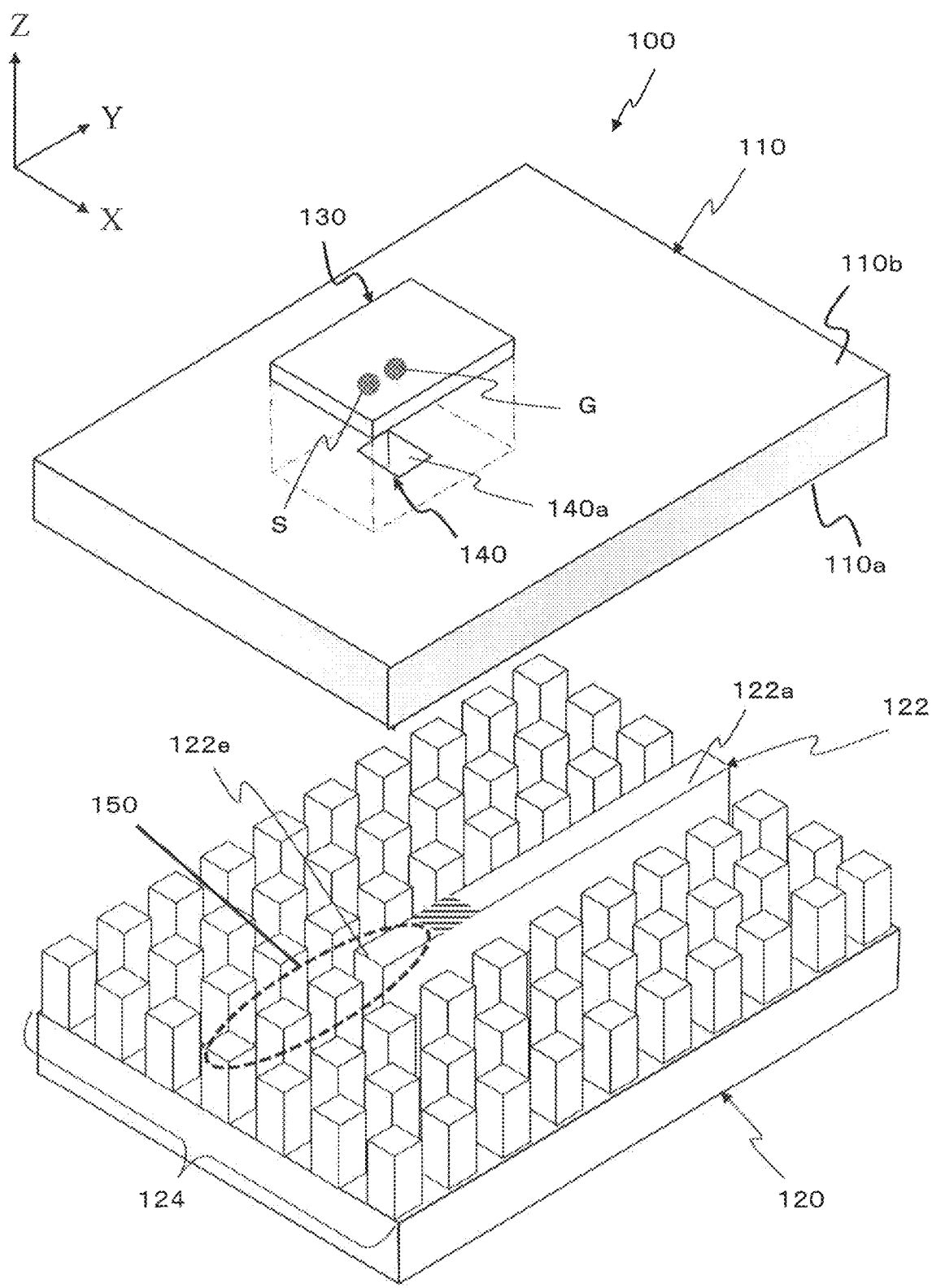
FIG. 7 is a perspective view schematically showing the module 100 illustrated so that the spacing between microwave IC substrate 110 and the conductive member 120 is exaggerated.

FIG. 7 is a perspective view schematically showing the module 100 illustrated so that the spacing between microwave IC substrate 110 and the conductive member 120 is exaggerated for ease of understanding.

The conductive member 120 includes a waveguide member 122 and a plurality of conductive rods 124.

The waveguide member 122 has a waveguide face 122*a* of an elongated stripe shape. Once the microwave IC substrate 110 and the conductive member 120 are assembled, the waveguide face 122*a* extends along the lower face 110*a* of the microwave IC substrate 110.

As an example, a conductive member not shown in FIG. 7 is provided at the lower face 110*a* side of the microwave IC substrate 110, this conductive member covering over the waveguide face 122*a* in a manner of following along the waveguide face 122*a*. A signal wave (electromagnetic wave) which is generated by the module 100, or a signal wave (electromagnetic wave) which is received by an antenna element will propagate in between the waveguide face 122*a* and a portion of the conductive member that opposes the waveguide face 122*a*.

FIG. 7 also illustrates the microwave IC substrate 110 and the microwave IC 130 as being apart from each other along the Z direction. The microwave IC substrate 110 has a throughhole 140 which penetrates through from the upper face 110*b* to the lower face 110*a* thereof. The inner wall of the throughhole 140 is covered with an electrical conductor. In the present specification, the electrical conductor that is provided on the inner wall is collectively referred to as the "inner-wall (electrically) conductive portion 140*a*". The inner-wall conductive portion 140*a* is electrically connected to the aforementioned conductive member of the microwave IC substrate 110.

On its face opposing the upper face 110*b* of the microwave IC substrate 110, the microwave IC 130 includes at least one pair of terminals, each pair consisting of a signal terminal S and a ground terminal G. FIG. 7 illustrates a signal terminal S and a ground terminal G as seen through the microwave IC 130.

The signal terminal S and the ground terminal G are electrically connected to two positions on the inner-wall conductive portion 140*a*, the two positions opposing each other with the throughhole 140 interposed therebetween. The portion where the signal terminal S and the ground terminal G are connected to the inner-wall conductive portion 140*a* functions as an electromagnetic wave signal generating portion. As a result of this, an electromagnetic wave propagates in the inner-wall conductive portion 140*a*.

Once the microwave IC substrate 110 and the conductive member 120 are assembled, the waveguide face 122*a* is disposed opposite to where the throughhole 140 opens in the lower face 110*a* of the microwave IC substrate 110. As a result, an electromagnetic wave may propagate from the throughhole 140 to the waveguide face 122*a*, or from the waveguide face 122*a* to the throughhole 140. In the present specification, the spatial position that is interposed between the waveguide face 122*a* and the opening of throughhole 140 opposing each other is referred to as a "conjunction". Shown hatched on the waveguide face 122*a* in FIG. 7 is a projection of the conjunction.

A cross-sectional shape of the throughhole 140 in a plane which is perpendicular to the Z axis is a rectangle whose longer sides extend along the X direction, as will be described later. The +Z direction edge of the throughhole 140 is electrically connected to the signal terminal S and the ground terminal G of the microwave IC 130 as described above. As a result, inside the throughhole 140, and between the connecting portion with the signal terminal S and the connecting portion with the ground terminal G, an RF (radio frequency) electric field occurs. In the present embodiment, an electric field occurs in the ±Y directions. At the same time, a magnetic field corresponding to this electric field also occurs, these being propagated to the −Z direction edge, by way of a hollow waveguide constituted by the electrical conductor which is formed on the inner wall of the throughhole 140. Via the conjunction, this RF electromagnetic field couples to a waveguide which is constituted by the conductive member formed on the lower face 110a of the microwave IC substrate 110 and the opposing waveguide face 122a, as will be described later. In this case, the waveguide face 122a extends in a direction which is along the direction of electric field generation, i.e., the +Y direction in the present embodiment. A reverse operation will take place when effecting an electromagnetic wave propagation from the waveguide face 122a, via the throughhole 140, to the microwave IC 130.

Note that an RF electric field occurring between the connecting portion of the signal terminal S and the connecting portion of the ground terminal G also propagates in the +Z direction. A construction for blocking this RF electric field will be described in detail later with reference to FIG. 16 and the like.

When one looks in the −Y direction from the +Y direction, the tip (i.e., a portion lying in the −Y direction of the geometric projection of the conjunction) 122e of the waveguide member 122 is open. The tip 122e is surrounded by a plurality of conductive rods 124.

The tip 122e of the waveguide member 122 and the plurality of conductive rods 124 lying on the extension of the tip together constitute a choke structure 150. The choke structure 150 is a structure for suppressing electromagnetic wave leakage from one end (i.e., the aforementioned tip) of the waveguide member 122. Specifically, the length of the tip of the waveguide member 122 to be included in the choke structure 150 is adjusted to a value around λg/4, where λg is the wavelength of an electromagnetic wave propagating in the waveguide face 122a. That is, the length (dimension) of the tip is adjusted to an optimum or preferable value in accordance with the impedance state in the neighborhood of the choke structure 150. For example, the length of the tip is set within ±λg/8 of λg/4. By providing the choke structure 150, via the conjunction, an electromagnetic wave can be efficiently transmitted from the throughhole 140 to the waveguide face 122a, or from the waveguide face 122a to the throughhole 140.

Figure 8A:
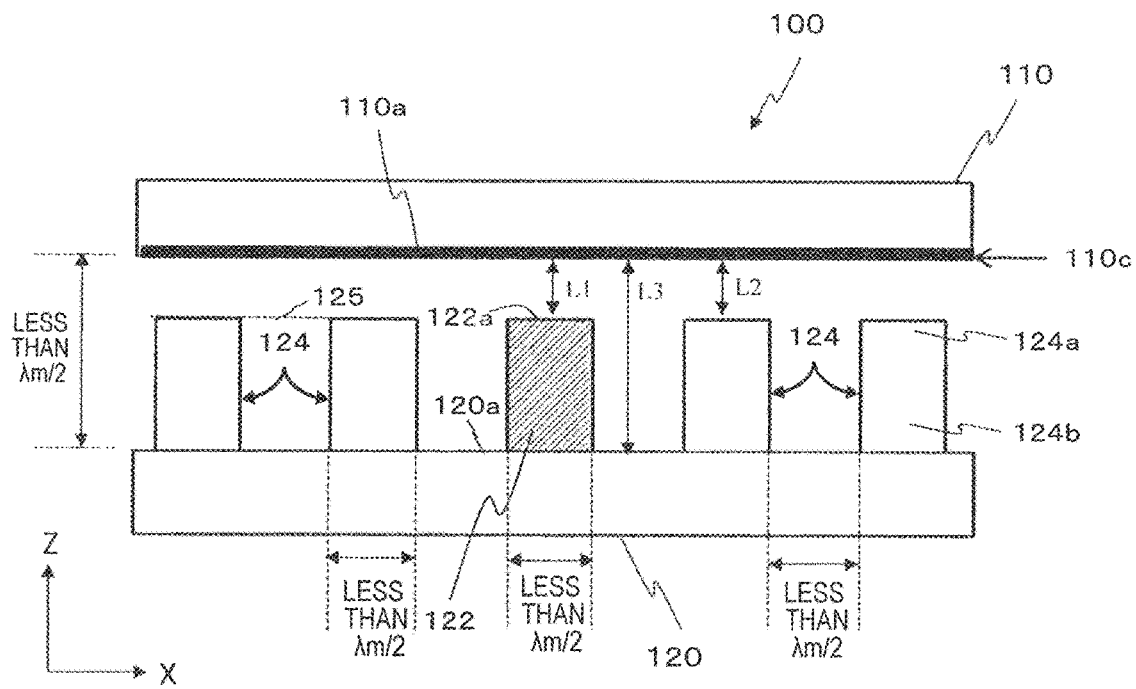
FIG. 8A is a cross-sectional view of the module 100 taken along line AA' in FIG. 6.

FIG. 8A shows a cross section of the module 100 taken along line AA' in FIG. 6. FIG. 8A shows an exemplary range of dimension of each member of the module 100. In FIG. 8A, the conductive member 110c is provided across the entire lower face 110a of the microwave IC substrate 110. Therefore, the distance L1 between the waveguide face 122a and the conductive member 110c is equal to the distance L2 between the leading end 124a of each conductive rod 124 and the conductive member 110c.

Figure 8B:
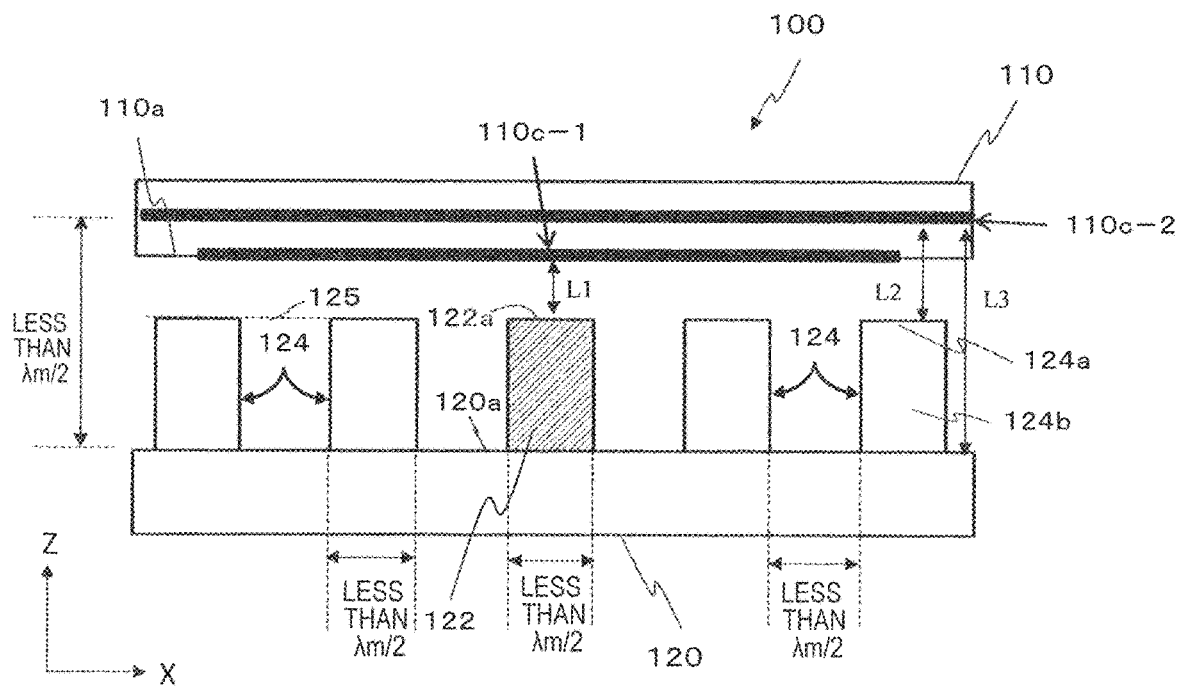
FIG. 8B is a cross-sectional view of the module 100 taken along line AA' in FIG. 6, according to another example.

FIG. 8B shows a cross section of the module 100 taken along line AA' in FIG. 6, according to another example. In FIG. 8B, a conductive member 110c-1 is provided in a region of the lower face 110a of the microwave IC substrate 110 that substantially opposes (see below) the waveguide face 122a, but not in any other region. Note that FIG. 8B shows a cross section in the XZ plane; the conductive member 110c-1 extends also along the Y direction while maintaining opposing relationship with the waveguide face 122a.

The width of the conductive member 110c-1 along the X direction, that is, its expanse along the waveguide face, is broader than the waveguide face 122a, and spans the width of at least two rows of conductive rods 124 that lie adjacent to the waveguide face 122a, for example. What is meant by "two rows" is one row on one side, and another row on the other side, of the waveguide face 122a. An electric field of an electromagnetic wave which is propagated by the waveguide face 122a along the ±Y directions has a certain expanse along the X direction. In order to account for this expanse, the inventors have set the width of the conductive member 110c-1 along the X direction to be at least two rods wide. This permits electromagnetic wave propagation while keeping the losses sufficiently low. Although the width of the conductive member 110c-1 along the X direction is expressed in terms of a number of conductive rods 124 in the above description, this is an example. Expression in terms of a number of conductive rods 124 is not a requirement. It suffices if the width is at least broader than a width of the portion opposing the waveguide face 122a, thus to account for the certain expanse of the electric field of the electromagnetic wave along the X direction.

In FIGS. 8A and 8B, the conductive member 110c or the conductive member 110c-1 is provided directly on the lower face 110a of the microwave IC substrate 110. However, direct contact may not exist between the lower face 110a and the conductive member 110c or conductive member 110c-1; rather, the conductive member 110c or the conductive member 110c-1 may be disposed "below", i.e., away in the −Z direction from, the lower face 110a. For example, a certain member may be allowed to be present the lower face 110a and the conductive member 110c or conductive member 110c-1.

On the other hand, a conductive member 110c-2 (e.g., a grounding layer) is provided in the microwave IC substrate 110, the electrically conductive layer 110c-2 serving as if the aforementioned conductive member 110c opposing the conductive rod 124. Therefore, the distance L1 between the waveguide face 122a and the conductive member 110c-1 is different from the distance L2 between the leading end 124a of each conductive rod 124 and the conductive member 110c-2. Note that, instead of the grounding layer which is internal to the microwave IC substrate 110, the conductive member 110c-2 may include a separate metal layer.

As the conductive members 110c-1 and 110c-2, for example, copper, or a predetermined metal material (e.g., copper) whose surface is plated with gold, may be adopted.

The plurality of conductive rods 124 arrayed on the conductive member 120 each have a leading end 124a. In the example shown in the figure, the leading ends 124a of the plurality of conductive rods 124 are on the same plane. This plane defines the surface 125 of an artificial magnetic conductor. Each conductive rod 124 does not need to be entirely electrically conductive, so long as at least the surface (the upper face and the side face) of the rod-like structure is electrically conductive. Moreover, the conductive member 120 does not need to be entirely electrically conductive, so long as it can support the plurality of conductive rods 124 to constitute an artificial magnetic conductor. Of the surfaces of the conductive member 120, a face 120a carrying the plurality of conductive rods 124 may be electrically conductive, such that the surfaces of adjacent ones of the plurality of conductive rods 124 are electrically short-circuited. In other words, the entire combination of the conductive member 120 and the plurality of conductive rods 124 may at least include an electrically conductive surface with rises and falls opposing the conductive member 110c or the conductive member 110c-2 via the lower face 110a.

On the conductive member 120, a ridge-like waveguide member 122 is provided among the plurality of conductive rods 124. More specifically, stretches of an artificial magnetic conductor are present on both sides of the waveguide member 122, such that the waveguide member 122 is sandwiched between the stretches of artificial magnetic conductor on both sides. As can be seen from FIG. 7, the waveguide member 122 in this example is supported on the second conductive member 120, and extends linearly along the Y direction. In the example shown in the figure, the waveguide member 122 has the same height and width as those of the conductive rods 124. As will be described later, the height and width of the waveguide member 122 may have different values from those of the conductive rod 124. Unlike the conductive rods 124, the waveguide member 122 extends along a direction (which in this example is the Y direction) in which to guide electromagnetic waves along the conductive member 110c or 110c-1. Similarly, the waveguide member 122 does not need to be entirely electrically conductive, but may at least include an electrically conductive waveguide face 122a opposing the conductive member 110c or 110c-1. The conductive member 120, the plurality of conductive rods 124, and the waveguide member 122 may be parts of a continuous single-piece body. Furthermore, the conductive member 110c or 110c-1 may also be a part of such a single-piece body.

On both sides of the waveguide member 122, the space between the surface 125 of each stretch of artificial magnetic conductor and the conductive member 110c or 110c-1 does not allow an electromagnetic wave of any frequency that is within a specific frequency band to propagate. This frequency band is called a "prohibited band". The artificial magnetic conductor is designed so that the frequency of an electromagnetic wave (which hereinafter may be referred to as a "signal wave") to propagate in the module 100 (which may hereinafter be referred to as the "operating frequency") is contained in the prohibited band. The prohibited band may be adjusted based on the following: the height of the conductive rods 124, i.e., the depth of each groove formed between adjacent conductive rods 124; the diameter of each conductive rod 124; the interval between conductive rods 124; and the size of the gap between the leading end 124a of each conductive rod 124 and the conductive member 110c-2.

In the present specification, $\lambda o$ denotes a representative value of wavelength (e.g., a central wavelength corresponding to the center frequency of the operating frequency band) in free space of an electromagnetic wave (signal wave) propagating in a waveguide extending between the conductive member 110c or 110c-1 and the waveguide face 122a of the waveguide member 122. Moreover, $\lambda m$ denotes a wavelength, in free space, of an electromagnetic wave of the highest frequency in the operating frequency band. Furthermore, $\lambda x$ denotes a wavelength, in free space, of an electromagnetic wave of the lowest frequency in the operating frequency band. The end of each conductive rod 124 that is in contact with the conductive member 120 is referred to as the "root". As shown in FIGS. 8A and 8B, each conductive rod 124 has the leading end 124a and the root 124b.

FIG. 8B illustrates a structure having the conductive members 110c-1 and 110c-2. One possible variant thereof is a structure which only has the conductive member 110c-2, but not the conductive member 110c-1. In this case, the waveguide face 122a would oppose the conductive member 110c-2, and electromagnetic wave transmission would occur between them.

Examples of dimensions, shapes, positioning, and the like of the respective members are as follows. Note that any corresponding constituent element in FIGS. 8A and 8B will receive an identical reference numeral, and conform to the following description.

(1) Width of the Conductive Rod

The width (i.e., the size along the X direction and the Y direction) of the conductive rod 124 may be set to less than $\lambda m/2$. Within this range, resonance of the lowest order can be prevented from occurring along the X direction and the Y direction. Since resonance may possibly occur not only in the X and Y directions but also in any diagonal direction in an X-Y cross section, the diagonal length of an X-Y cross section of the conductive rod 124 is also preferably less than $\lambda m/2$. The lower limit values for the rod width and diagonal length will conform to the minimum lengths that are producible under the given manufacturing method, but is not particularly limited.

(2) Distance L3 from the Root of the Conductive Rod to the Conductive Member

The distance L3 from the root 124b of each conductive rod 124 to the conductive member 110c or 110c-2 may be longer than the height of the conductive rods 124, while also being less than $\lambda m/2$. When the distance is $\lambda m/2$ or more, resonance may occur between the root 124b of each conductive rod 124 and the conductive surface 110a, thus ruining the effect of signal wave containment.

The distance L3 from the conductive member 110c or 110c-2 to the root 124b of each conductive rod 124 corresponds to the spacing between that conductive member and the conductive member 120. For example, when a signal wave of 76.5±0.5 GHz (which belongs to the millimeter band or the extremely high frequency band) propagates in the waveguide, the wavelength of the signal wave ranges from 3.8934 mm to 3.9446 mm. 3.8934 (mm) is assigned to $\lambda m$ in this case, so that the spacing $\lambda m/2$ between the conductive member 110 and the conductive member 120 is set to less than 3.8934 mm/2. So long as the conductive member 110c and the conductive member 120 realize such a narrow spacing while being disposed opposite from each other, the conductive member 110c and the conductive member 120 do not need to be strictly parallel. Moreover, when the spacing between the conductive member 110c and the conductive member 120 is less than $\lambda m/2$, a whole or a part of the conductive member 110 and/or the conductive member 120 may be shaped as a curved surface. On the other hand, the conductive member 110c and 120 each have a planar shape (i.e., the shape of their region as perpendicularly projected onto the XY plane) and a planar size (i.e., the size of their region as perpendicularly projected onto the XY plane) which may be arbitrarily designed depending on the purpose. The same also applies to the shape of the lower face 110a of the microwave IC substrate 110.

In the examples shown in FIGS. 8A and 8B, the surface of the conductive member 120, on which the roots 124b of the conductive rods 124 are provided, is illustrated as a plane; however, embodiments of the present disclosure are not limited thereto. For example, a cross-sectional shape of this surface taken along the XZ plane may be the bottom parts of faces having a shape similar to a U-shape or a V-shape. The conductive surface 120a may have such a structure when each conductive rod 124 or the waveguide member 122 is shaped with a width which increases toward the root. Even with such a structure, so long as the distance L3 between the conductive member 110c or 110c-2 and the surface of the conductive member 120 is less than a half of the wavelength λm, this construction is able to exhibit an effect of signal wave containment.

(3) Distance L2 from the Leading End of the Conductive Rod to the Conductive Member The distance L2 from the leading end 124a of each conductive rod 124 to the conductive member 110c or 110c-2 is set to less than λm/2. When the distance is λm/2 or more, a propagation mode that reciprocates between the leading end 124a of each conductive rod 124 and the conductive surface 110a may occur, thus no longer being able to contain a signal wave.

(4) Arrangement and Shape of Conductive Rods

The interspace between two adjacent conductive rods 124 among the plurality of conductive rods 124 has a width of less than λm/2, for example. The width of the interspace between any two adjacent conductive rods 124 is defined by the shortest distance from the surface (side face) of one of the two conductive rods 124 to the surface (side face) of the other. This width of the interspace between rods is to be determined so that resonance of the lowest order will not occur in the regions between rods. The conditions under which resonance will occur are determined based by a combination of: the height of the conductive rods 124; the distance between any two adjacent conductive rods; and the capacitance of the air gap between the leading end 124a of each conductive rod 124 and the conductive member 110c or 110c-2. Therefore, the width of the interspace between rods may be appropriately determined depending on other design parameters. Although there is no clear lower limit to the width of the interspace between rods, for manufacturing ease, it may be e.g. λm/16 or more when a signal wave in the extremely high frequency band is to be propagated. Note that the interspace does not need to have a constant width. So long as it remains less than λm/2, the interspace between conductive rods 124 may vary.

The arrangement of the plurality of conductive rods 124 is not limited to the illustrated example, so long as it exhibits a function of an artificial magnetic conductor. The plurality of conductive rods 124 do not need to be arranged in orthogonal rows and columns; the rows and columns may be intersecting at angles other than 90 degrees. The plurality of conductive rods 124 do not need to form a linear array along rows or columns, but may be in a dispersed arrangement which does not present any straightforward regularity. The conductive rods 124 may also vary in shape and size depending on the position on the conductive member 120.

The surface 125 of the artificial magnetic conductor that are constituted by the leading ends 124a of the plurality of conductive rods 124 does not need to be a strict plane, but may be a plane with minute rises and falls, or even a curved surface. In other words, the conductive rods 124 do not need to be of uniform height, but rather the conductive rods 124 may be diverse so long as the array of conductive rods 124 is able to function as an artificial magnetic conductor.

Although FIG. 8A and FIG. 8B indicate the surface 125 of the artificial magnetic conductor only for conductive rods 124 on the left, this is for ease of illustration. The surface 125 of artificial magnetic conductor may be defined as a plane or a curved surface that is represented by the leading ends 124a of the conductive rods 124.

Furthermore, each conductive rod 124 does not need to have a prismatic shape as shown in the figure, but may have a cylindrical shape, for example. Furthermore, each conductive rod 124 does not need to have a simple columnar shape. The artificial magnetic conductor may also be realized by any structure other than an array of conductive rods 124, and various artificial magnetic conductors are applicable to the waveguide device according to the present disclosure. Note that, when the leading end 124a of each conductive rod 124 has a prismatic shape, its diagonal length is preferably less than λm/2. When the leading end 124a of each conductive rod 124 is shaped as an ellipse, the length of its major axis is preferably less than λm/2. Even when the leading end 124a has any other shape, the dimension across it is preferably less than λm/2 even at the longest position.

The height of each conductive rod 124, i.e., the length from the root 124b to the leading end 124a, may be set to a value which is shorter than the distance (i.e., less than λm/2) between the conductive surface 110a and the conductive surface 120a, e.g., λo/4.

(5) Width of the Waveguide Face

The width of the waveguide face 122a of the waveguide member 122, i.e., the size of the waveguide face 122a along a direction which is orthogonal to the direction that the waveguide member 122 extends, may be set to less than λm/2 (e.g., λm/8). If the width of the waveguide face 122a is λm/2 or more, resonance will occur along the width direction, which will prevent any WRG from operating as a simple transmission line.

(6) Height of the Waveguide Member

The height (i.e., the size along the Z direction in the example shown in the figure) of the waveguide member 122 is set to less than λm/2. The reason is that, if the distance is λm/2 or more, the distance between the root 124b of each conductive rod 124 and the conductive member 110c or 110c-2 will be λm/2 or more.

(7) Distance L1 Between the Waveguide Face and the Conductive Surface

The distance L1 between the waveguide face 122a of the waveguide member 122 and the conductive member 110c or 110c-1 is set to less than λm/2. If the distance L1 is λm/2 or more, resonance will occur between the waveguide face 122a and that conductive member, which will prevent functionality as a waveguide. In one example, the distance is λm/4 or less. In order to ensure manufacturing ease, when a signal wave in the extremely high frequency band is to propagate, the distance is preferably λm/16 or more, for example.

The lower limit of the distance L and the lower limit of the distance L2 depends on the machining precision, and also on the precision when assembling the microwave IC substrate 110 including the conductive member(s) 110c or 110c-1 and 110c-2 and the conductive member 120 so as to be apart by a constant distance. When a pressing technique or an injection technique is used, the practical lower limit of the aforementioned distance is about 50 micrometers (μm). In the case of using an MEMS (Micro-Electro-Mechanical System) technique to make a product in e.g. the terahertz range, the lower limit of the aforementioned distance is about 2 to about 3 mm.

In the waveguide device 100 of the above-described construction, a signal wave of the operating frequency is unable to propagate in the space between the surface 125 of the artificial magnetic conductor and the conductive member 110c or 110c-2, but propagates in the space between the waveguide face 122a of the waveguide member 122 and the conductive member 110c or 110c-1. Unlike in a hollow waveguide, the width of the waveguide member 122 in such a waveguide structure does not need to be equal to or greater than a half of the wavelength of the signal wave to propagate. Moreover, the conductive member 110c, 110c-1 or 110c-2 and the conductive member 120 do not need to be electrically interconnected by a metal wall that extends along the thickness direction (i.e., in parallel to the YZ plane).

Figure 9A:
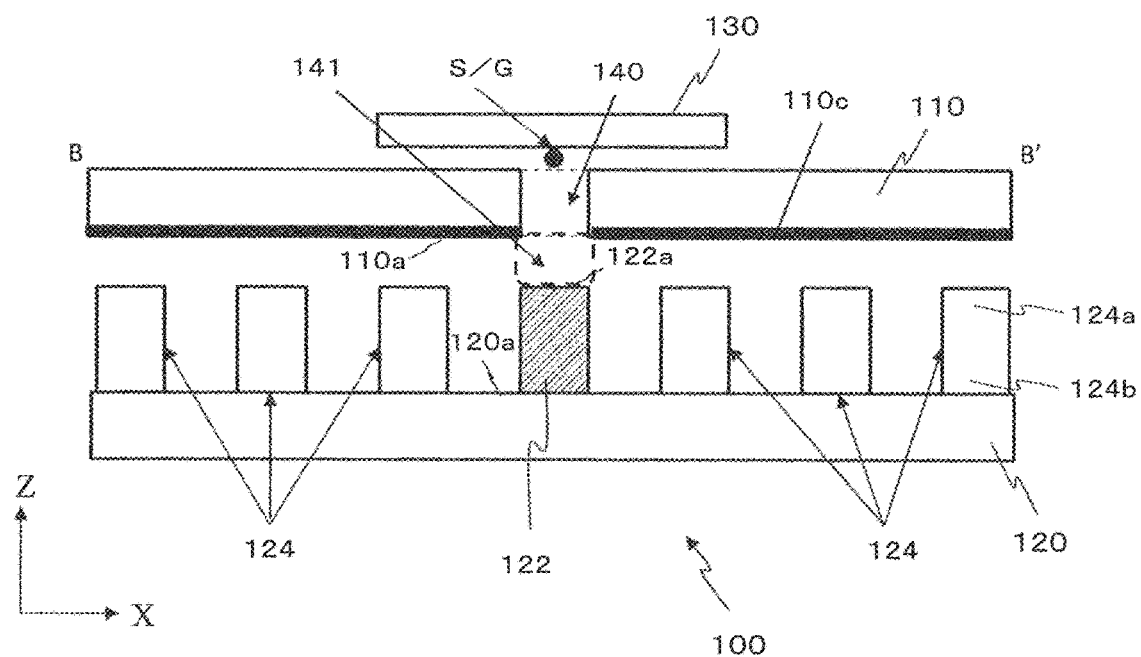
FIG. 9A is a cross-sectional view of the module 100 taken along line BB' in FIG. 6.
Figure 9B:
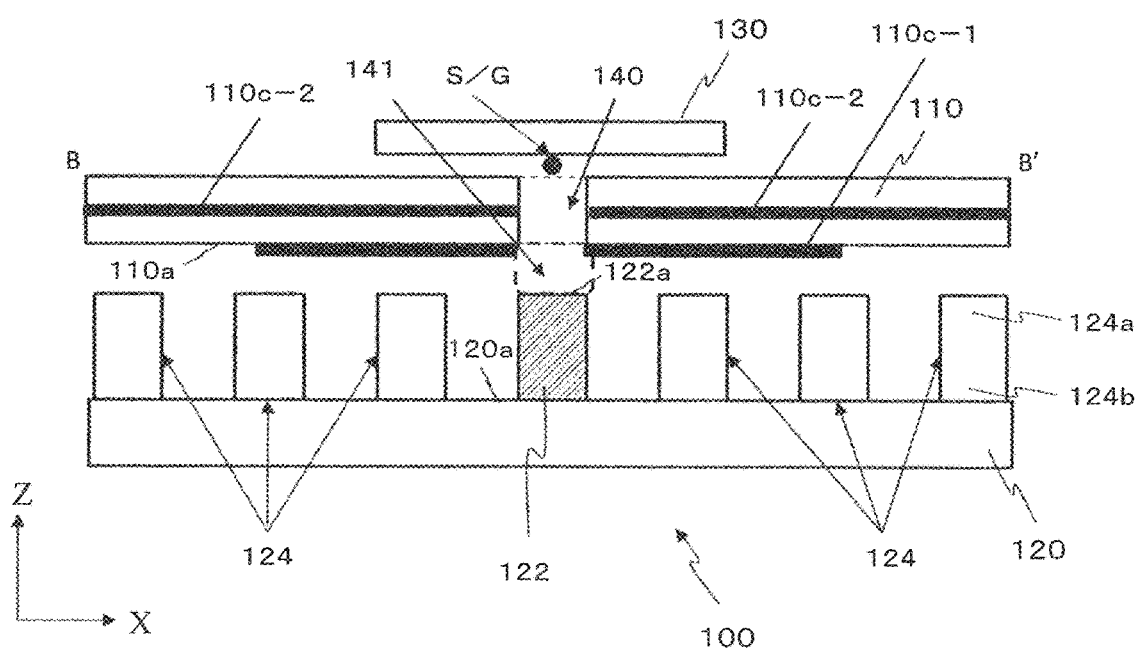
FIG. 9B is a cross-sectional view of the module 100 taken along line BB' in FIG. 6, according to another example.

FIG. 9A shows a cross section of the module 100 taken along line BB' in FIG. 6. FIG. 9A corresponds to the construction of FIG. 8A. FIG. 9B shows a cross section of the module 100 taken along line BB' in FIG. 6, according to another example. FIG. 9B corresponds to the construction of FIG. 8B. FIGS. 9A and 9B show a conjunction 141 between the throughhole 140 and the waveguide face 122a. Although the distances L2 and L3 are omitted from illustration, they are as defined earlier. Note that the height of the conjunction 141 along the Z axis direction may be less than λm/2, on the basis of the expected shortest wavelength λm of the electromagnetic wave.

Figure 10:
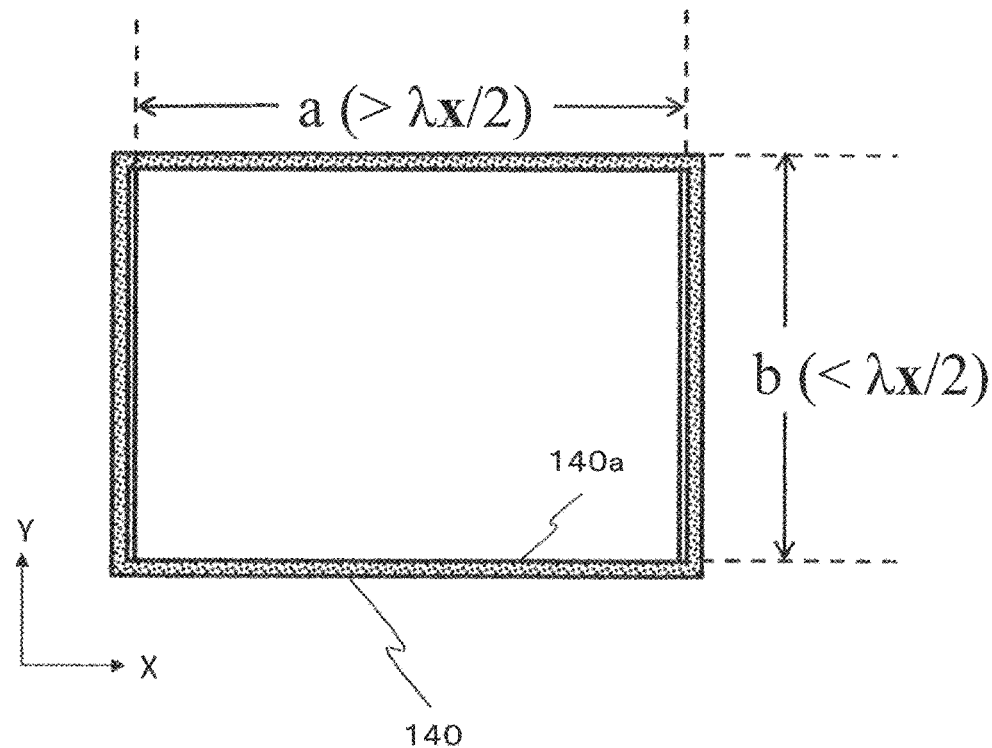
FIG. 10 is a diagram showing the shape of a cross section of a throughhole 140 and an inner-wall conductive portion 140a taken along an assumed plane (the XY plane) which is perpendicular to the penetration direction of the throughhole 140.

FIG. 10 shows the shape of a cross section of the throughhole 140 and the inner-wall conductive portion 140a taken along an assumed plane (the XY plane) which is perpendicular to the penetration direction of the throughhole 140. In the present embodiment, this cross-sectional shape is a rectangle, and the length a of each side extending along the X direction and the length b of each side extending along the Y direction have the relationship a>b.

In the present embodiment, the shorter sides and the longer sides of the rectangle are determined so that the shorter sides (i.e., the sides along the Y axis direction) are parallel to the direction that the waveguide face 122a of the waveguide member 122 extends, at least near the conjunction 141 (see, for example, FIG. 7). This is in order to stably and smoothly pass electric fields between the waveguide face 122a of the waveguide member 122 near the conjunction 141 and the conductive member 110c or 110c-1 opposing the waveguide face 122a. The signal terminal S and the ground terminal G of the microwave IC 130 are electrically connected to the midpoint (i.e., the a/2 position) between the opposing longer sides in the cross section of the throughhole 140, thus generating an RF electric field. Within the inner-wall conductive portion 140a, this electric field creates an electromagnetic field in the propagation mode ($TE_{10}$ mode) of the hollow waveguide, i.e., propagating toward the waveguide member 122. In order to allow this electromagnetic field to stably propagate, the inventors have set the length a of the inner-wall conductive portion 140a to be greater than λx/2, while setting the length b to be smaller than λx/2. Herein, λx denotes a wavelength, in free space, of an electromagnetic wave of the lowest frequency in the operating frequency band. Based on these relative dimensions, an electromagnetic field of the $TE_{10}$ mode will propagate in the inner-wall conductive portion 140a. Under the $TE_{10}$ mode, the direction of the electric field coincides with the direction that the shorter sides of the hollow waveguide extend.

Furthermore, the inventors have arranged the positioning so that the direction that the waveguide face 122a extends is parallel to the direction that the shorter sides of the inner-wall conductive portion 140a extend. As a result of this, the direction of electric field oscillation matches the direction that the waveguide face 122a extends, whereby the electromagnetic wave can smoothly propagate toward the waveguide face 122a of the waveguide member 122, while losses in the electromagnetic wave propagating in the inner-wall conductive portion 140a are kept low.

If the length b of each shorter side of the inner-wall conductive portion 140a were longer than λx/2, then an oscillation mode under which the electric field would oscillate also along the longer side direction (e.g., $TE_{11}$ mode) might appear inside the inner-wall conductive portion 140a. The energy of an electric field that oscillates along the longer side direction is hardly passed over to the waveguide face extending along the shorter side direction. Therefore, in such a case, a greater proportion of the electromagnetic wave would be not passed from the inner-wall conductive portion 140a to the waveguide face 122a, but would be reflected.

In the actual rectangular shape of the inner-wall conductive portion 140a, each corner of the rectangle is made of an interconnecting shape which is at least chamfered, rounded or fillet. An interconnecting shape in the inner-wall conductive portion 140a and the conductive member 110 may be, for example, a single piece that is made from the same material through shaving, drawing, molding, or the like. Alternatively, during the fabrication of the microwave IC substrate 110, the inner-wall conductive portion 140a may be molded from a separate electrically conductive metal member, and fitted into the throughhole 140.

For ease of description, the present specification may refer to the throughhole 140 as being a hollow waveguide; however, strictly speaking, it is the interior of the inner-wall conductive portion 140a that functions as a hollow waveguide.

Figure 11:
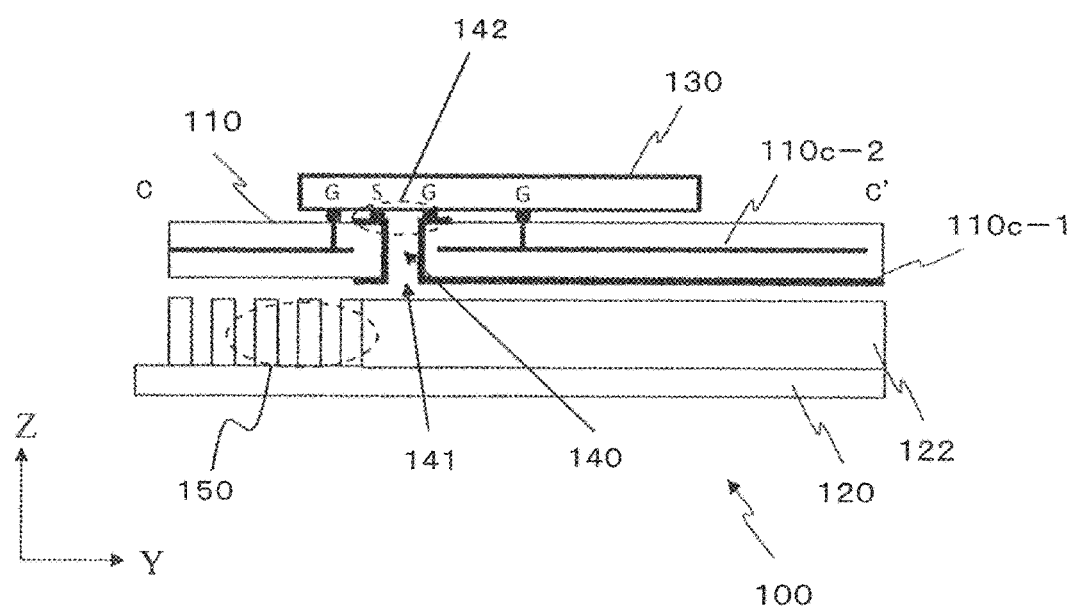
FIG. 11 is a cross-sectional view of the module 100 taken along line CC' in FIG. 6.

FIG. 11 shows a cross section of the module 100 taken along line CC' in FIG. 6. Note that a module 100 corresponding to FIG. 8B and FIG. 9B is illustrated herein. For the structure of the module 100 corresponding to FIG. 8A and FIG. 9A, "conductive member 110c-1" may simply be read as "conductive member 110c" in the following description. The structure of the throughhole 140, the conjunction 141, the choke structure 150, etc., has already been described, and therefore description thereof will be omitted.

Figure 12A:
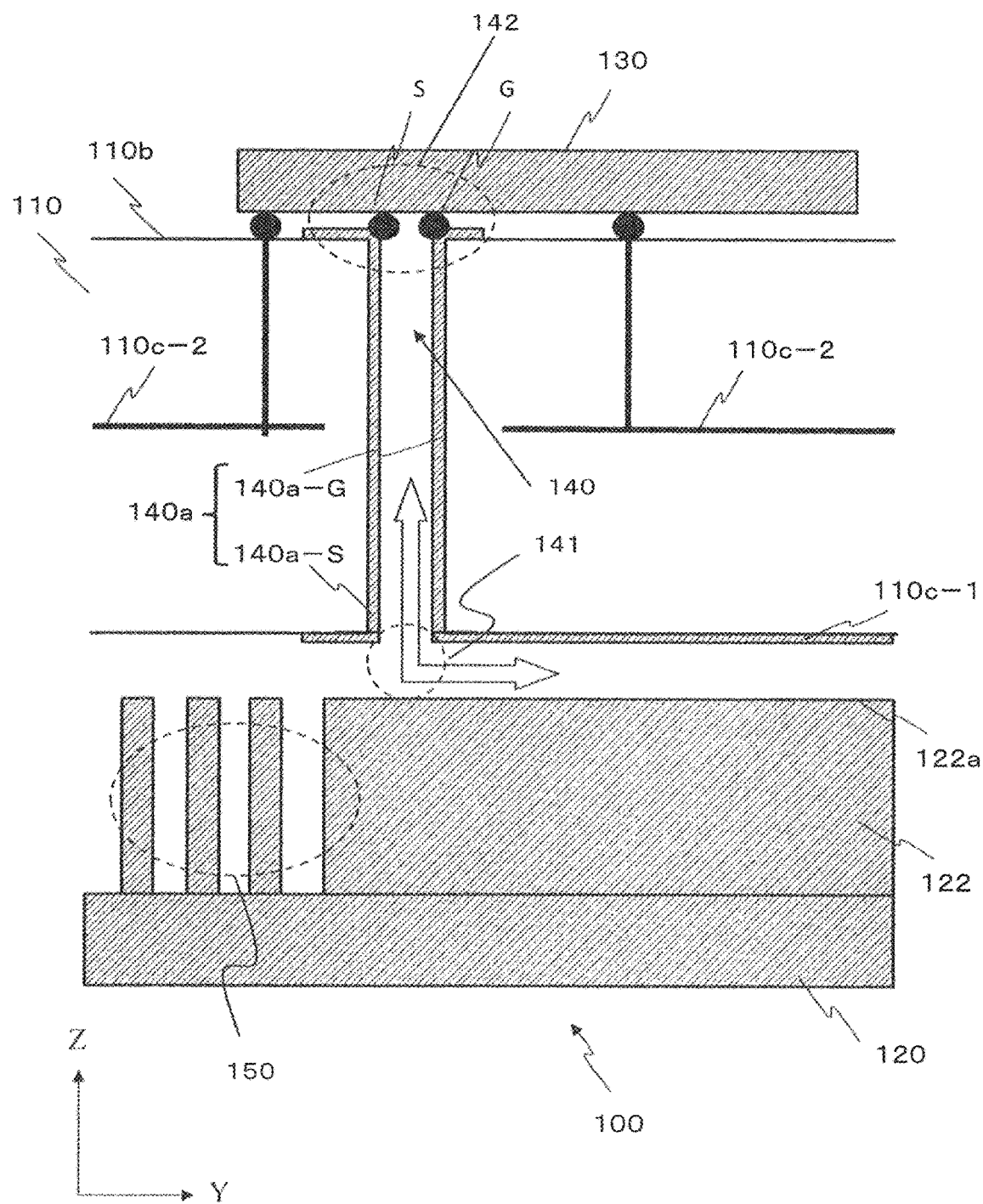
FIG. 12A is a partially enlarged view of the neighborhood of a signal generating portion 142 in FIG. 11 according to a first example.
Figure 12B:
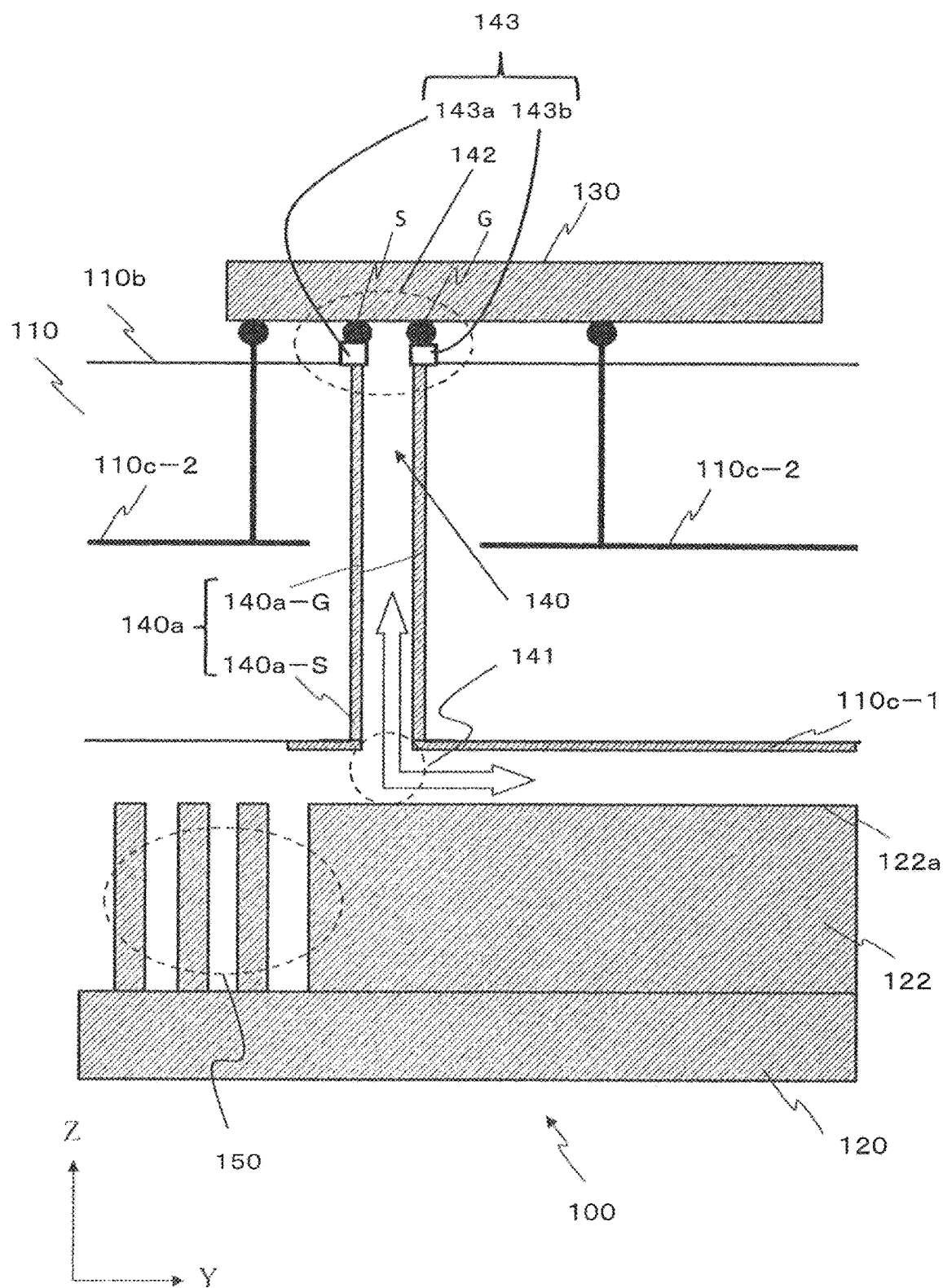
FIG. 12B is a partially enlarged view of the neighborhood of the signal generating portion 142 in FIG. 11 according to a second example.

The microwave IC 130 includes a plurality of terminals. Among these, the signal terminal S and the ground terminal G are disposed around the throughhole 140. The signal terminal S and the ground terminal G constitute a signal generating portion 142 which converts an electrical signal into an electromagnetic wave and guides it to the throughhole 140 serving as a hollow waveguide. With reference to FIG. 12A and FIG. 12B, details of the signal generating portion 142 will be described.

FIG. 12A is a partially enlarged view of the neighborhood of the signal generating portion 142 in FIG. 11 according to a first example. The signal generating portion 142 is constructed as the signal terminal S and the ground terminal G are respectively electrically connected, via soldering or the like, to two portions (i.e., the electrical conductors 140a-S and 140a-G in the inner-wall conductive portion 140a) opposing each other with the throughhole 140 interposed therebetween.

The microwave IC 130 outputs a radio frequency current and voltage signal (hereinafter referred to as an "RF (radio frequency) electrical signal") to the signal terminal S. On the other hand, the ground terminal G is connected to the internal ground of the microwave IC. Given an active RF electrical signal riding on the signal terminal S, a signal of the opposite phase from this RF electrical signal is correspondingly induced on the ground terminal G. Such a signal format is called the unbalanced type. The present embodiment illustrates an example where unbalanced-type signal terminals are adopted.

The present embodiment is also applicable to the case where the microwave IC 130 includes a pair of signal terminals S(S(+)/S(−)). Such a signal format is called the balanced type. In this case, RF electrical signals of the same amplitude but opposite polarities are actively output to the pair of signal terminals S(S(+)/S(−)). On the other hand, the ground terminal G is connected to the internal ground of the microwave IC 130. When this is applied to the present embodiment, in FIG. 12A, for example, the pair of signal terminals that are connected to the terminals of the microwave IC 130 at the +Z direction edge of the throughhole 140 are supposed to be an S(+) terminal and an S(−) terminal. The ground terminal of the microwave IC 130 may be connected to the grounding layer of the microwave IC substrate 110, for example.

In the present embodiment, it is assumed that the electrical conductors 140a-S and 140a-G are electrically connected to each other. In this case, a signal wave propagates in a rectangular waveguide mode ($TE_{10}$ mode).

A signal wave which is generated by the signal generating portion 142 goes on to propagate through the throughhole 140 in the −Z direction, heading toward the waveguide member 122. Then, via the conjunction 141, it propagates through the waveguide extending between the waveguide face 122a and the conductive member 110c-1 in the +Y direction. As described above, the direction that the waveguide face 122a extends is parallel to the direction that the shorter sides of the inner-wall conductive portion 140a of the throughhole 140 extend; therefore, at the conjunction 141, the electromagnetic wave can smoothly propagate from the throughhole 140 to the waveguide face 122a of the waveguide member 122. Since the aforementioned choke structure 150 is provided, the signal wave does not propagate in the −Y direction from the conjunction 141.

In the present embodiment, the direction that the waveguide member 122 extends from the conjunction 141 is parallel to the direction along an imaginary line connecting the signal terminal S and the ground terminal G of the microwave IC 130. However, it does not need to be perfectly parallel to this imaginary line. The following advantages result from this construction. At the inner-wall conductive portion 140a, an electric field component of an electromagnetic wave appears in a direction that connects the signal terminal S and the ground terminal G. At the waveguide member 122, which receives this electromagnetic wave, takes over the electric field between the waveguide face 122a and the opposing conductive member 110c or 110c-1, while maintaining this electric field direction. As a result, an efficient propagation is realized while keeping the losses in the electromagnetic wave low.

On the other hand, a signal wave which is received via an antenna element propagates through the waveguide extending between the waveguide face 122a and the conductive member 110c-1 in the −Y direction, and via the conjunction 141, propagates through the throughhole 140 in the +Z direction. Then, it is converted into an electrical signal at the signal generating portion 142, and processed by the microwave IC 130.

Conventionally, losses in the electromagnetic wave would have occurred due to the long distance from the signal terminal S and ground terminal G to the signal generating portion. However, according to the present embodiment, since the signal terminal S and the ground terminal G function as the signal generating portion 142, losses in the electromagnetic wave can be greatly reduced. Moreover, the present embodiment adopts a structure in which an electromagnetic wave is effectively transmitted to the ridge waveguide from the signal generating portion 142, via the throughhole 140 serving as a hollow waveguide and via the conjunction 141. Thus, as compared to conventional structures, fabrication is facilitated while also keeping the losses in the electromagnetic wave low. Furthermore, the conductive member 120 is provided to prevent electromagnetic wave leakage, whereby losses in the electromagnetic wave are also suppressed.

FIG. 12B is a partially enlarged view of the neighborhood of the signal generating portion 142 in FIG. 11 according to a second example.

The construction of FIG. 12B differs from the construction of FIG. 12A in that an aperture-edge electrically conductive portion 143 is provided between the signal terminal S and the ground terminal G of the microwave IC 130 and the electrical conductors 140a-S and 140a-G in the inner-wall conductive portion 140a.

The aperture-edge conductive portion 143 covers at least a portion of the upper face 110b of the microwave IC substrate 110. Specifically, in the present embodiment, the aperture-edge conductive portion 143 is provided at the edge of the opening of the throughhole 140 on the upper face 110b side. The aperture-edge conductive portion 143 is connected to the electrical conductors 140a-S and 140a-G in the inner-wall conductive portion 140a at two places sandwiching this opening. In FIG. 12B, two contacts 143a and 143b of the aperture-edge conductive portion 143 are connected respectively to the electrical conductors 140a-S and 140a-G in the inner-wall conductive portion 140a. To the two contacts 143a and 143b of the aperture-edge conductive portion 143, the signal terminal S and the ground terminal G of the microwave IC 130 are respectively connected.

Note that the interval between the signal terminal/the ground terminal G and the opening edge is smaller than the distance from the opening edge to the center of the opening (i.e., the center of the substrate 110 along the Z direction).

As a result of this, an RF electric field occurs between the electrical conductors 140a-S and 140a-G, or between the opposing sides on which the two contacts 143a and 143b of the aperture-edge conductive portion 143 are respectively located, whereby an electromagnetic field in the propagation mode of the hollow waveguide ($TE_{10}$ mode) occurs.

With the construction of FIG. 12B, not only the signal terminal S and the ground terminal G, but also the aperture-edge conductive portion 143 functions as the signal generating portion 142.

The above-described constructions in FIG. 12A and FIG. 12B are examples showing implementations where the signal terminal S and the ground terminal G are respectively electrically connected to portions of the inner-wall conductive portion 140a opposing each other with the throughhole interposed therebetween (i.e., electrical conductors 140a-S and 140a-G). Other various manners of connection are possible as variants.

(First Variant Concerning the Manner of Connection)

The electrical conductors 140a-S and 140a-G of shapes as shown in FIG. 12A will be discussed. The signal terminal S and the ground terminal G are not directly physically connected to portions of the inner-wall conductive portion 140a opposing each other with the throughhole interposed therebetween (i.e., electrical conductors 140a-S and 140a-G). On the other hand, the signal terminal S and the ground terminal G are directly physically connected to the neighborhood of the −Y direction end of the electrical conductor 140a-S and the neighborhood of the +Y direction end of the electrical conductor 140a-G, respectively. In this case, the respective positions of connection may be opposing positions on the inner wall of the throughhole 140. Herein, the connection may be via a solder layer, for example. As a result, the signal terminal S and the ground terminal G are electrically connected respectively to the electrical conductors 140a-S and 140a-G.

In the present specification, two electrical conductors being "physically connected" means the two electrical conductors being connected by soldering, etc., with respect to the sites in question. This also encompasses these two conductors being connected also electrically. For example, even if a site X and a site Y which are both made of electrical conductors are "not directly physically connected" to each other, the site X and the site Y are "electrically connected" if the site X and the site Y are each "directly physically connected" to a site Z which is made of an electrical conductor.

(Second Variant Concerning the Manner of Connection)

As shown in FIG. 12B, at its +Z direction end, each electrical conductor 140a-S, 140a-G may be terminated where it has reached the same level (height) as the upper face 110b of the microwave IC substrate 110. Note that, without even providing the aperture-edge conductive portion 143, the signal terminal S and the ground terminal G may be directly physically connected to the +Z direction ends of the electrical conductors 140a-S and 140a-G. Alternatively, one or both of the signal terminal S and the ground terminal G may be directly physically connected to one or both of the +Z direction ends of the electrical conductors 140a-S and 140a-G, via a conductor line(s) such as a bonding wire(s). In this case, the shapes of the signal terminal S and the ground terminal G may not be ball shapes as shown in FIG. 12A and FIG. 12B; instead, signal pins of the microwave IC 130 may be directly physically connected, for example.

The inner-wall conductive portion 140a shown in each of FIG. 12A and FIG. 12B can be regarded as an example of extending to the same level as the upper face 110b of the microwave IC substrate 110, or extending beyond the same level as the upper face 110b to cover at least a portion of the upper face 110b and surround the periphery of the throughhole 140. In the present specification, such a construction may be described as "the inner-wall conductive portion 140a extending over to the upper face 110b of the microwave IC substrate 110".

(Third Variant Concerning the Manner of Connection)

It is not essential that the inner-wall conductive portion 140a extends over to the upper face 110b of the microwave IC substrate 110. In other words, one or both of the electrical conductors 140a-S and 140a-G may be terminated inside the throughhole 140, without reaching the upper face 110b of the microwave IC substrate 110. In this case, electrical connection of one or both of the signal terminal S and the ground terminal G to the ends of the electrical conductors 140a-S and 140a-G may be directly physical or via wire bonding or the like. The shape of one or both of the signal terminal S and the ground terminal G may be a solder ball(s) in the former case of direct physical connection, or a signal pin(s) in the latter case of wire bonding, for example.

Hereinafter, variants of the above-described construction will be described. The following variants may each be adopted alone or used in combination. After the variants have been described, exemplary applications of the microwave IC waveguide device module will be described.

<Variant 1>

Figure 13:
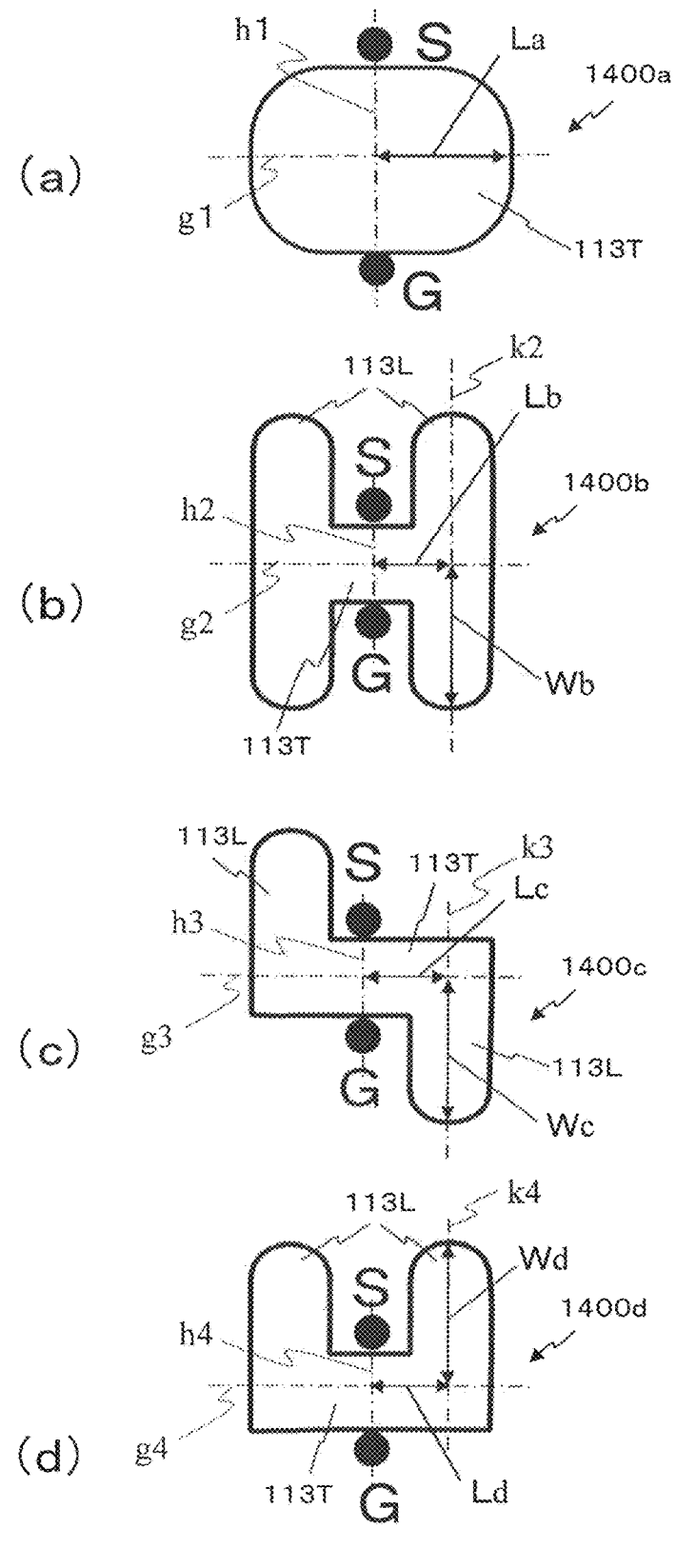

In FIG. 10, the throughhole 140 and the inner-wall conductive portion 140a are illustrated as having rectangular cross-sectional shapes. However, other shapes may also be adopted. Hereinafter, with reference to FIG. 13, (a) to (d), other example cross-sectional shapes for the throughhole 140 and the inner-wall conductive portion 140a will be described. In FIG. 13, (a) to (d), positions at which the signal terminal S and the ground terminal G of the microwave IC 130 are connected are indicated as "S" and "G". Similarly to the above description, the signal terminal S and the ground terminal G function as the signal generating portion 142. Hereinafter, the size (length) of the inner-wall conductive portion 140a along the X direction will be denoted as L, and its size (width) along the Y direction denoted as W, although these variants may conveniently be described in terms of different shapes of the throughhole 140.

FIG. 13(a) shows an example of a throughhole 1400a having an elliptic shape composed only of a lateral portion 113T. The center lines extending along the X and Y directions of the throughhole 1400a are indicated as g1 and h1, respectively. The semimajor axis La of the throughhole 1400a indicated by arrowheads in the figure is set so that $\lambda o/4 < La < \lambda o/2$ (where $\lambda o$ denotes a free-space wavelength corresponding to the operating frequency) in order to ensure that higher-mode resonance will not occur and that the impedance will not be too small.

FIG. 13(b) shows an example of a throughhole 1400b having a shape composed of a pair of vertical portions 113L and a lateral portion 113T interconnecting the pair of vertical portions 113L (referred to as an "H-shape" in the present specification). The lateral portion 113T is substantially perpendicular to the pair of vertical portions 113L, and connects substantial centers of the pair of vertical portions 113L. In the case of such an H-shape throughhole 1400b, too, its shape and size are to be determined so that higher-mode resonance will not occur and that the impedance will not be too small. Now, assume a distance Lb from an intersection between a center line g2 of the lateral portion 113T and a center line h2 of the entire H-shape to an intersection between the center line g2 and a center line k2 of the vertical portion 113L. Also assume a distance Wb from an intersection between the center line g2 and the center line k2 to an end of the vertical portion 113L. Then, the distances Lb and Wb are set so that $\lambda o/4 < Lb + Wb < \lambda o/2$. By making the distance Wb relatively long, the distance Lb can be made relatively short. As a result, the width of the H-shape along the X direction can be made e.g. less than $\lambda o/2$, whereby the interval between lateral portions 113T along their length direction can be reduced.

FIG. 13(c) shows an example of a throughhole 1400c including a lateral portion 113T and a pair of vertical portions 113L extending from both ends of the lateral portion 113T. The directions in which the pair of vertical portions 113L extend from the lateral portion 113T are substantially perpendicular to the lateral portion 113T, and are opposite to each other. Also in this example, assume a distance Lc from an intersection between a center line g3 of the lateral portion 113T and a center line h3 of the entire shape in FIG. 13(c) to an intersection between the center line g3 and a center line k3 of the vertical portion 113L. Also assume a distance Wc from an intersection between the center line g3 and the center line k3 to an end of the vertical portion 113L. Then, the distances Lc and Wc are set so that $\lambda o/4 < Lc + Wc < \lambda o/2$. By making the distance Wc relatively long, the distance Lc can be made relatively short. As a result, the width of the entire shape in FIG. 13(c) along the X direction can be made e.g. less than $\lambda o/2$, whereby the interval between lateral portions 113T along their length direction can be reduced.

FIG. 13(d) shows an example of a throughhole 1400d including a lateral portion 113T and a pair of vertical portions 113L extending from both ends of the lateral portion 113T in the same perpendicular direction to the lateral portion 113T. Such a shape will be referred to as a "U-shape" in the present specification. Note that the shape shown in FIG. 13(d) may be regarded as an upper half shape of an H-shape. In this example, too, assume a distance Ld from an intersection between a center line g4 of the lateral portion 113T and a center line h4 of the entire U-shape to an intersection between the center line g4 and a center line k4 of the vertical portion 113L. Also assume a distance Wd to an intersection between the center line g4 and the center line k4 to an end of the vertical portion 113L. Then, the distances Ld and Wd are set so that $\lambda o/4 < Ld+Wd < \lambda o/2$. By making the distance Wd relatively long, the distance Ld can be made relatively short. As a result, the width of the U-shape along the X direction can be made e.g. less than $\lambda o/2$, whereby the interval between lateral portions 113T along their length direction can be reduced.

<Variant 2>

Although the above examples assume that the signal terminal S and the ground terminal G of the signal generating portion 142 are spherical, and are directly connected to the electrical conductors 140a-S and 140a-G in the inner-wall conductive portion 140a. However, this is exemplary. For instance, by using bonding wires (conductor line), the spherical signal terminal S and the spherical ground terminal G may be connected respectively to the electrical conductors 140a-S and 140a-G. Alternatively, when the signal terminal S and the ground terminal G have pin shapes, the respective extended pins may be connected respectively to the inner-wall conductive portions 140a-S and 140a-G.

<Variant 3-1>

The above examples illustrate cases where a signal wave which is generated from one terminal pair (one signal terminal S and one ground terminal G) of the microwave IC 130 propagates in one waveguide face 122a via one throughhole 140.

Hereinafter, examples will be described where signal waves which are respectively generated from a plurality of terminal pairs are propagated in respectively different throughholes 140 and waveguide faces 122a. For ease of description, the following description assumes that the signal format of the microwave IC 130 is unbalanced; however, the same is similarly applicable to a balanced-type microwave IC.

Figure 14:
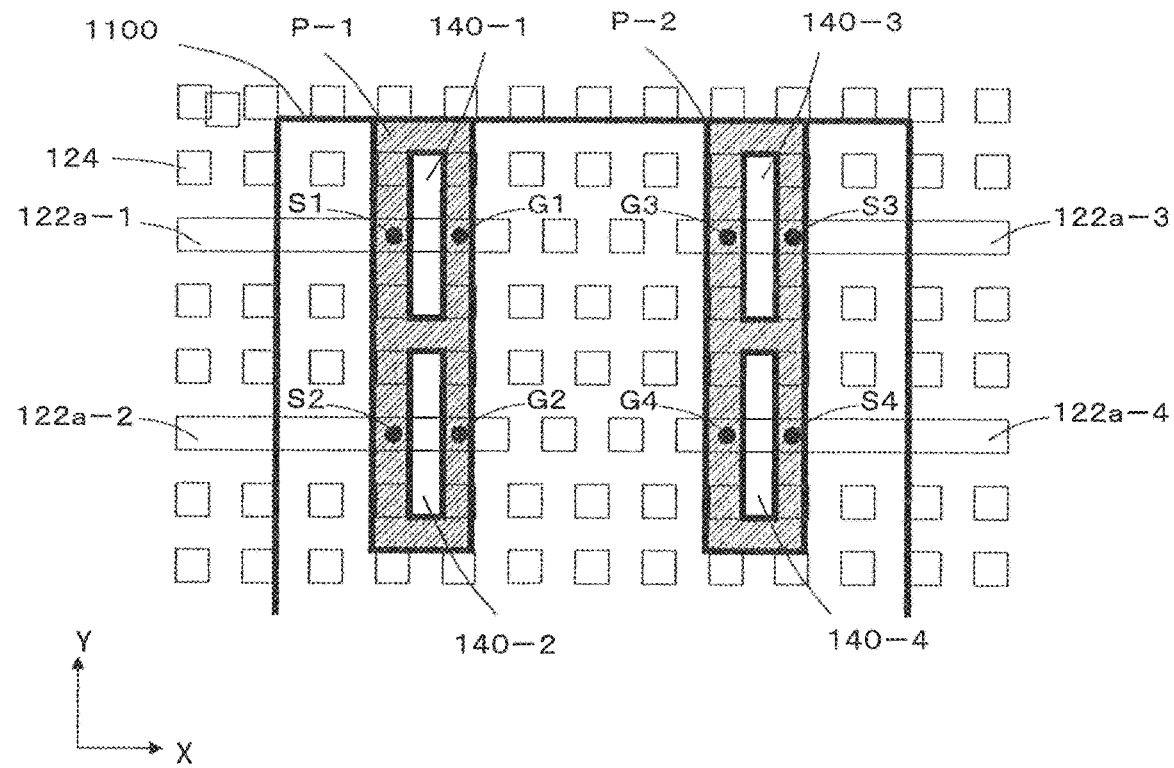
FIG. 14 is a diagram showing an exemplary construction of the upper face of a microwave IC substrate 1100 having substrate patterns P-1 and P-2 and four throughholes 140-1 through 140-4.

FIG. 14 shows an exemplary construction of the upper face of a microwave IC substrate 1100 having substrate patterns P-1 and P-2 and four throughholes 140-1 through 140-4. The throughholes 140-1 through 140-4 all have rectangle cross-sectional shapes.

For reference sake, the figure illustrates imaginary positions of four terminal pairs (S1,G1) through (S4,G4) of the microwave IC, and also indicates a plurality of conductive rods 124 which are located in the −Z direction. Furthermore, the figure also shows four waveguide faces 122a-1 through 122a-4. On the lower face (not shown) of the microwave IC substrate 1100, a conductive member which functions as ground across its entire surface is provided, for example.

The substrate pattern P-1 is electrically connected to the inner-wall conductive portions of the throughholes 140-1 and 140-2, whereas the substrate pattern P-2 is electrically connected to the inner-wall conductive portions of the throughholes 140-3 and 140-4. The substrate pattern near each terminal pair constitutes a signal generating portion together with the terminal pair. As the microwave IC 130 (not shown) independently applies voltage signals (each serving as a basis for a signal wave) to the terminal pair (S1,G1) through (S4,G4), signal waves are generated by the respective signal generating portions, and are propagated in the respective throughholes 140-1 through 140-4. Then, in the manner described earlier, they propagate in the respective waveguide faces 122a-1 through 122a-4 via the respective conjunctions.

Among the waveguide faces 122a-1 through 122a-4 shown in FIG. 14, at least two rows of conductive rods 124 are provided between two adjacent ones along the Y direction, and between two adjacent ones along the X direction. According to a study by the inventors, two rows of conductive rods 124 can block the influence which a signal wave propagating in one waveguide face may exert on the other waveguide face. Alternatively, three or more rows of conductive rods 124 may be provided between two waveguide faces. However still, the influence which a signal wave propagating in one waveguide face may exert on the other waveguide face may be reduced by providing one row of conductive rods 124 between two waveguide faces, as will be exemplified by the construction of FIG. 15 to be described next.

An example positioning of terminal pairs will be described. In the case of generating a signal wave having a free-space wavelength $\lambda_0$ of 4 mm, the interval between the terminals of one terminal pair (e.g., the interval between the signal terminal S1 and the ground terminal G1) is 1 mm or more. Moreover, the interval between the central positions of the two adjacent terminal pairs along the X direction (e.g., the interval between the central position of the terminal pair (S1,G1) and the central position of the terminal pair (S3, G3)) is 5 mm or more. Moreover, the interval between the central positions of two adjacent terminal pairs along the Y direction (e.g., the interval between the central position of the terminal pair (S1,G1) and the central position of the terminal pair (S2,G2)) is 3 mm or more. The signal terminal S and the ground terminal G in each pair may be swapped in position.

<Variant 3-2>

Figure 15:
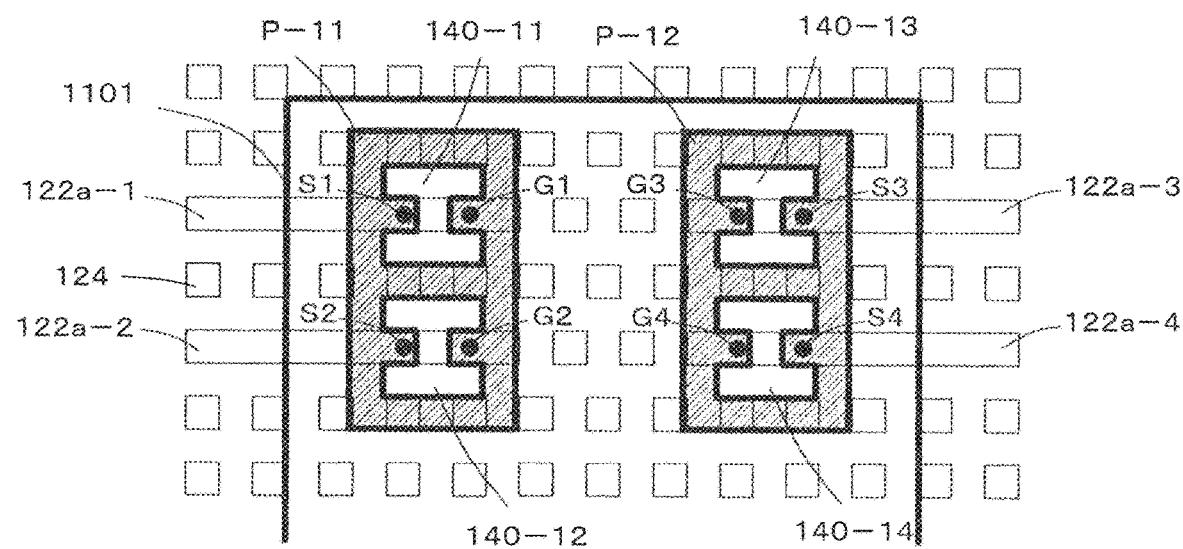
FIG. 15 is a diagram showing an exemplary construction of the upper face of a microwave IC substrate 1101 having substrate patterns P-11 and P-12 and four throughholes 140-11 through 140-14, according to still another example.

FIG. 15 shows an exemplary construction of the upper face of a microwave IC substrate 1101 having substrate patterns P-11 and P-12 and four throughholes 140-11 through 140-14, according to still another example. The throughholes 140-11 through 140-14 each have a cross-sectional shape which is H-shaped.

Similarly to FIG. 14, for reference sake, the figure illustrates imaginary positions of four terminal pairs (S1,G1) through (S4,G4) of the microwave IC, and also indicates a plurality of conductive rods 124 which are located in the −Z direction. Furthermore, the figure also shows four waveguide faces 122a-1 through 122a-4. On the lower face (not shown) of the microwave IC substrate 1101, a conductive member which functions as ground across its entire surface is provided, for example.

The substrate pattern P-11 is electrically connected to the inner-wall conductive portions of the throughholes 140-11 and 140-12, whereas the substrate pattern P-12 is electrically connected to the inner-wall conductive portions of the throughholes 140-13 and 140-14. The substrate pattern near each terminal pair constitutes a signal generating portion together with the terminal pair. As the microwave IC 130 (not shown) independently applies voltage signals (each serving as a basis for a signal wave) to the terminal pair terminal pairs (S1,G1) through (S4,G4), signal waves are generated by the respective signal generating portions, and are propagated in the respective throughholes 140-11 through 140-14. Then, in the manner described earlier, they propagate in the respective waveguide faces 122a-1 through 122a-4 via the respective conjunctions. Example positioning of terminal pairs may essentially be the same as in the example of FIG. 14. However, the interval between the central positions of two adjacent terminal pairs along the Y direction (e.g., the interval between the central position of the terminal pair (S1,G1) and the central position of the terminal pair (S2,G2)) may be 2 mm or more. The signal terminal S and the ground terminal G in each pair may be swapped in position.

<Variant 4>

The examples shown in FIG. 11, FIG. 12A, and FIG. 12B only described propagation in the −Z direction of a signal wave which is generated by the signal generating portion 142. However, a portion of the generated signal wave also propagates in the +Z direction from the signal generating portion 142, possibly leaking around or above the microwave IC 130.

The present variant is directed to a construction for preventing such leakage.

Figure 16:
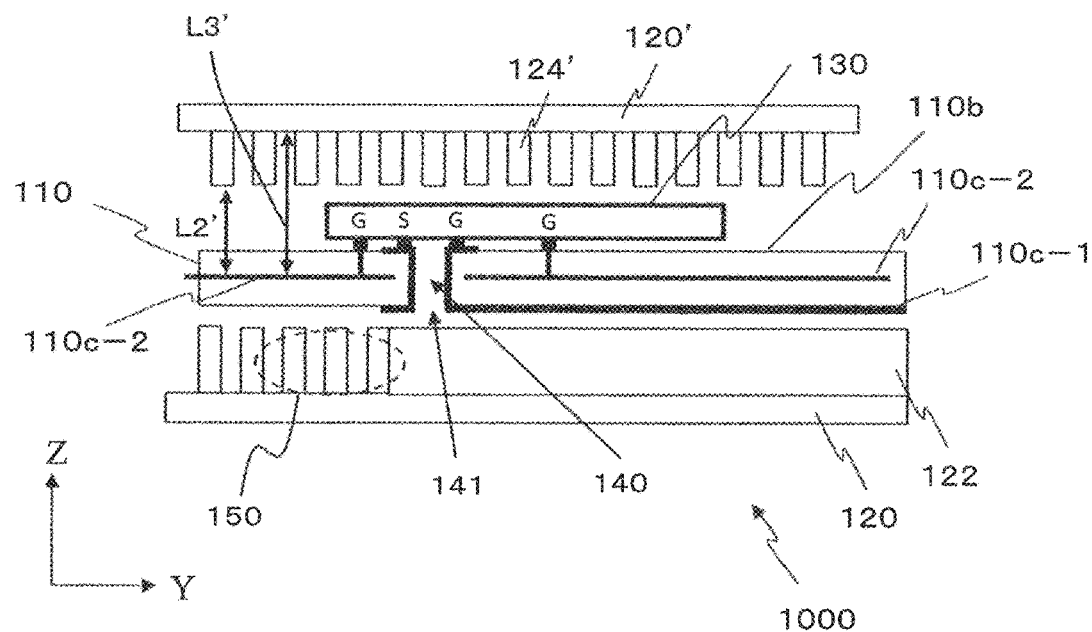
FIG. 16 is a diagram showing an example of a microwave IC waveguide device module 1000 in which a waffle iron conductive member 120' is provided also in the +Z direction of a microwave IC 130.

FIG. 16 shows an example of a microwave IC waveguide device module 1000 in which a waffle iron conductive member 120' is provided also in the +Z direction of the microwave IC 130. Among the constituent elements in FIG. 16, those having identical counterparts with the constituent elements in FIG. 11 will be denoted by identical reference numerals, and the description thereof will not be repeated. Hereinafter, the waffle iron conductive member 120' will be abbreviated as the "conductive member 120'", and the microwave IC waveguide device module 1000 as the "module 1000".

The conductive member 120' is provided above the module 1000. A plurality of conductive rods 124' extend in the −Z direction from the conductive surface of the conductive member 120'. The conductive member 120' and the plurality of conductive rods 124' are under the same conditions as those of the plurality of conductive rods 124 which were described with reference to FIG. 8A and FIG. 8B. More specifically, distances L2 and L3 should be read as distances L2' and L3', respectively, in the following aspects that were described above: (1) width of the conductive rod; (2) distance L3 from the root of the conductive rod to the conductive member; (3) distance L2 from the leading end of the conductive rod to the conductive member; (4) arrangement and shape of conductive rods; and (7) distance L1 between the waveguide face and the conductive surface. Herein, the distance L2' is a distance from the leading end of each conductive rod 124 to the conductive member 110c-2 provided within the microwave IC substrate 110. The distance L3' is a distance from the conductive surface of the conductive member 120' having the conductive rods 124 provided thereon to the conductive member 110c-2.

By placing the conductive member 120 having the conductive rods 124 provided thereon and the conductive member 120' having the conductive rods 124' provided thereon above and below (the Z direction) the microwave IC 130, electromagnetic wave leakage can be greatly reduced.

Although FIG. 16 illustrates the microwave IC 130 as being completely covered by the conductive member 120', this construction is not essential. The microwave IC 130 may be located between at least some of the plurality of conductive rods 124' and at least a portion of the conductive member 110c-2. A shielding effect against electromagnetic waves can be obtained in any portion of the microwave IC 130 that is sandwiched by these structures.

In any position or region in which to obtain a shielding effect against electromagnetic waves, an electrical conductor pattern may be provided on the upper face 110b of the microwave IC substrate 110. Instead of the conductive member 110c-2, this electrical conductor pattern is used to form an artificial magnetic conductor together with the plurality of conductive rods 124'.

The rationale for adopting such a construction will now be described. Let the thickness of the microwave IC 130 be about 1 mm. In order to generate an electromagnetic wave having a free-space wavelength $\lambda_0$=4 mm, for example, the spacing L3' between the root of each conductive rod 124' and the electrically conductive layer is less than $\lambda_0/2$ (about 2 mm). In view of the thickness (about 1 mm) of the microwave IC 130, the length (height) of each conductive rod 124' to be disposed opposite to the microwave IC 130 will be less than 1 mm. Moreover, the distance L2' between the leading end of each conductive rod 124' and the conductive member 110c-2 for realizing a shielding effect against electromagnetic waves needs to be equal to or greater than the thickness of the microwave IC 130, i.e., 1 mm or more.

The distance L2' from the leading end of each conductive rod 124' to the conductive member 110c-2 should be as short as possible. To this end, instead of the conductive member 110c-2, it is preferable to provide an electrical conductor pattern on the upper face 110b of the microwave IC substrate 110.

However, even if this construction is adopted, and more so in the case where it is not adopted, the spacing between the leading end of any conductive rod 124' and the surface of the microwave IC 130 opposing each other will become very short. In other words, there will be an increased chance that both may come into contact with each other.

Figure 17:
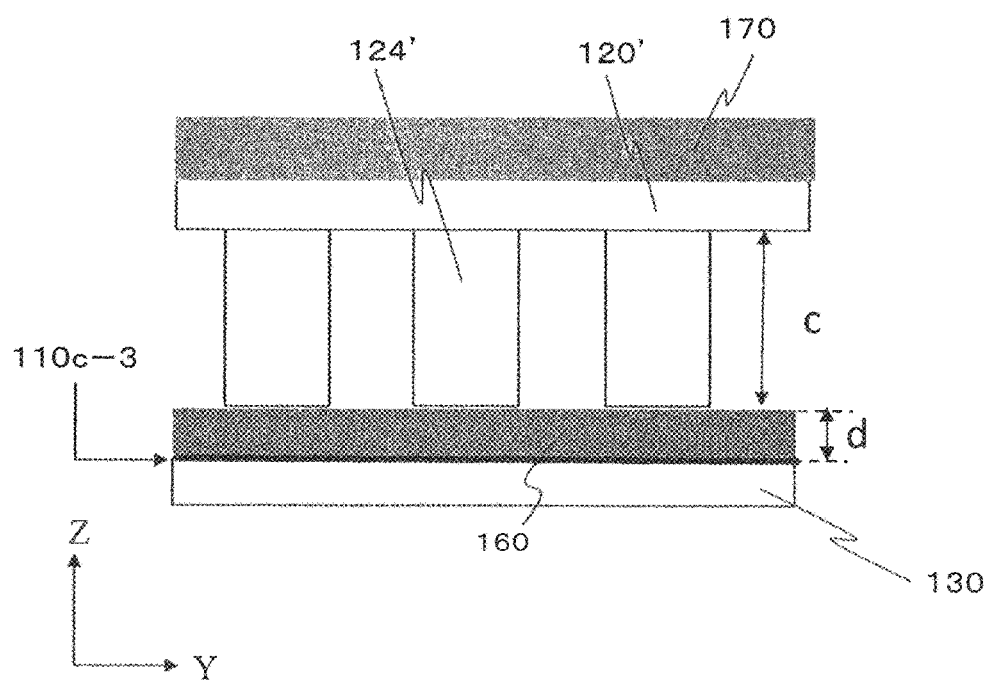
FIG. 17 is a diagram showing an electrically insulative resin layer 160 which is provided between the microwave IC 130 and conductive rods 124' opposing each other.

FIG. 17 shows an electrically insulative resin layer 160 which is provided between the microwave IC 130 and conductive rods 124' opposing each other. FIG. 17 shows an example where a conductive member 110c-3 is provided on the substrate upper face 110b.

By providing an insulative material such as the electrically insulative resin layer 160 between the leading ends of the conductive rods 124' and the surface of the microwave IC 130, contact between them can be prevented.

Now, conditions concerning the spacing between the rod roots (the conductive surface of the conductive member 120') and the electrically conductive layer will be described.

The spacing L3' between the conductive surface of the conductive member 120' and the conductive member 110c-3 needs to satisfy a condition such that no standing radio wave occurs when an electromagnetic wave propagates between the air layer and the electrically insulative resin layer 160, i.e., a phase condition of half period or less. In the case where the conductive member 110c-3 is not provided, it would also be necessary to take into consideration the dielectric layer from the surface of the microwave IC substrate 110 to the conductive member 110c-2 inside the substrate.

The following relationship is to be satisfied, given a thickness d of the electrically insulative resin layer 160, a thickness c of the air layer, a wavelength $\lambda_\varepsilon$ of an electromagnetic wave inside the electrically insulative resin layer, and a wavelength $\lambda_0$ of an electromagnetic wave in the air layer.

$$\frac{d}{\lambda_\varepsilon/2} + \frac{c}{\lambda_0/2} < 1 \qquad \text{[Math. 1]}$$

In the case where the electrically insulative resin layer 160 is selectively provided at the leading ends of the conductive rods 124', only an air layer exists between neighborhoods of the roots of the conductive rods 124' (the conductive surface of the conductive member 120') and the conductive member 110c-3. In that case, the spacing L3' between the conductive surface of the conductive member 120' and the conductive member 110c-3 may be less than $\lambda_o/2$.

When a resin having predetermined value of thermal conductivity or greater is adopted as the electrically insulative resin 160, heat which is generate in the microwave IC 130 can be transmitted to the waffle iron conductive member 120'. As a result, the heat radiation efficiency of the module can be improved.

Furthermore, as shown in FIG. 17, a heat sink 170 may be directly provided on the +Z face of the conductive member 120'. The heat sink 170 may be composed of the aforementioned resin with high thermal conductivity, or a ceramic member with high thermal conductivity, e.g., aluminum nitride or silicon nitride. A module 100 with a high cooling ability can be constructed from these. The heat sink 170 may have any arbitrary shape.

Note that the electrically insulative resin 160 and the heat sink 170 do not need to be both incorporated as shown in FIG. 17. Each of them may be separately incorporated as desired.

APPLICATION EXAMPLES

Hereinafter, constructions for applying the microwave module 1000 to radar devices will be described. Specifically, examples of radar devices in which the microwave module 1000 and radiating elements are combined will be described.

First, the construction of a slot array antenna will be described. Although the slot array antenna is illustrated as having horns, one may choose to provide or not provide any horns.

Figure 18:
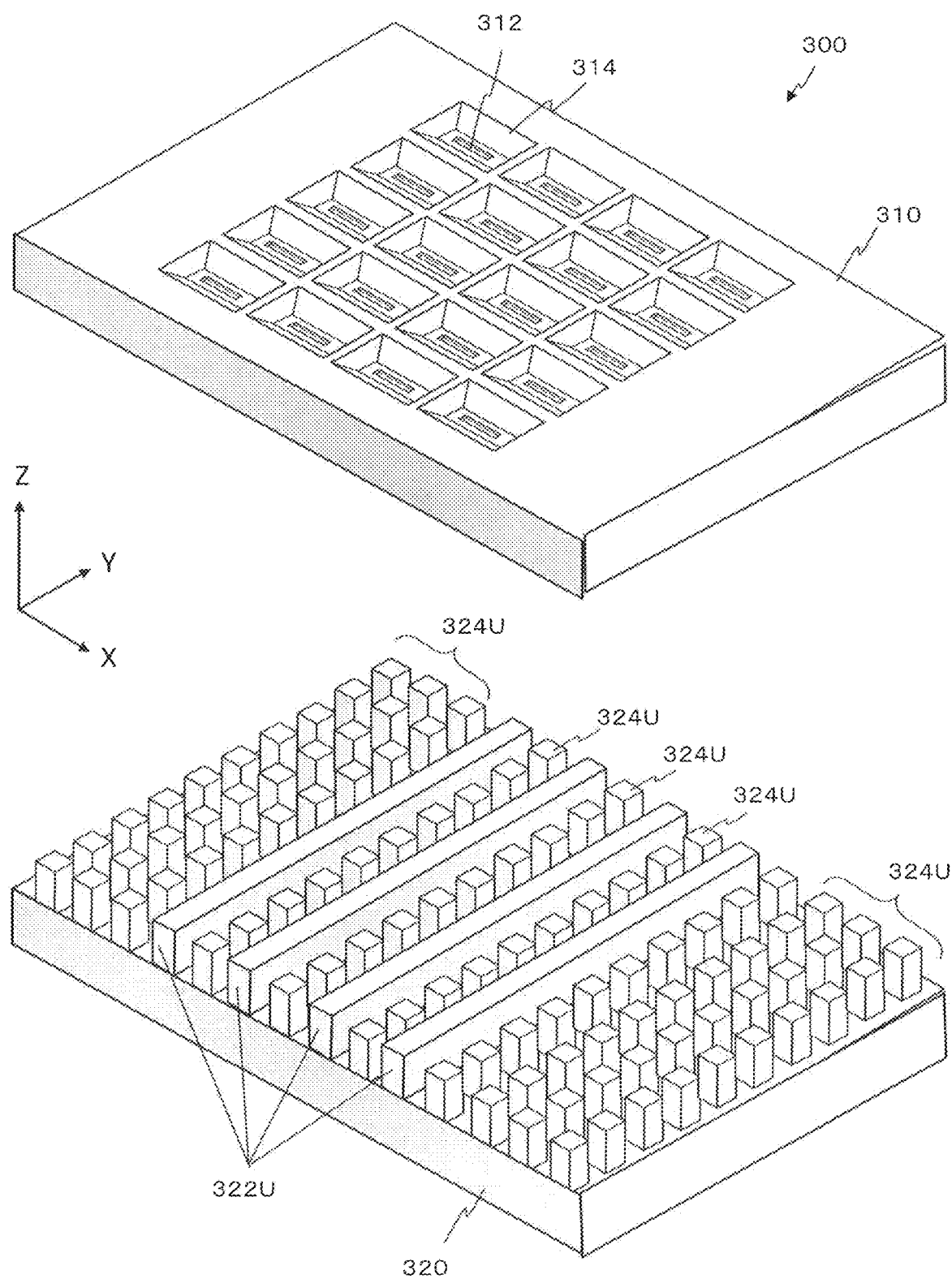
FIG. 18 is a perspective view schematically showing a partial structure of a slot array antenna 300 having a plurality of slots functioning as radiating elements.

FIG. 18 is a perspective view schematically showing a partial structure of a slot array antenna 300 having a plurality of slots functioning as radiating elements. The slot array antenna 300 includes: a first conductive member 310 having a plurality of slots 312 and a plurality of horns 314 in a two-dimensional array; and a second conductive member 320 having a plurality of waveguide members 322U and a plurality of conductive rods 324U arrayed thereon. The plurality of slots 312 in the first conductive member 310 are arrayed on the first conductive member 310 in a first direction (the Y direction) and in a second direction (the X direction) which intersects (or, in this example, is orthogonal to) the first direction. For simplicity, any port or choke structure to be provided at an end or center of each waveguide member 322U is omitted from illustration in FIG. 18. Although the present embodiment illustrates there being four waveguide members 322U, the number of waveguide members 322U may be two or any greater number.

Figure 19A:
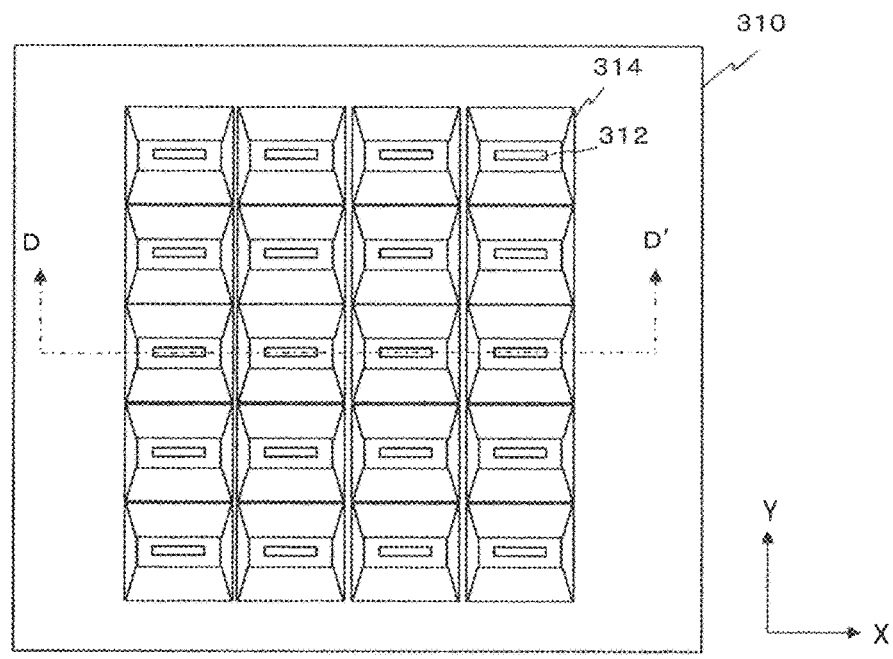
FIG. 19A is an upper plan view of the array antenna 300 shown in FIG. 18 including 20 slots in an array of 5 rows and 4 columns, as viewed in the Z direction.
Figure 19B:
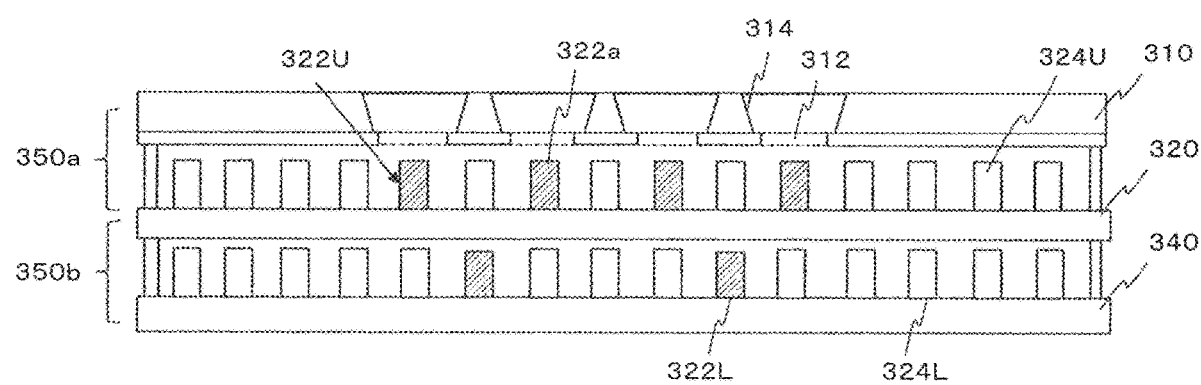
FIG. 19B is a cross-sectional view taken along line B-B in FIG. 19A.

FIG. 19A is an upper plan view of an slot array antenna 300 including 20 slots in an array of 5 rows and 4 columns, as viewed in the Z direction. FIG. 19B is a cross-sectional view taken along line D-D' in FIG. 19A. The first conductive member 310 in this slot array antenna 300 includes a plurality of horns 314, which are placed so as to respectively correspond to the plurality of slots 312. Each of the plurality of horns 314 has four electrically conductive walls surrounding the slot 312. Such horns 314 allow directivity characteristics to be improved.

In the slot array antenna 300 shown in the figures, a first waveguide device 350a and a second waveguide device 350b are layered. The first waveguide device 350a includes waveguide members 322U that directly couple to slots 312. The second waveguide device 350b includes further waveguide members 322L that couple to the waveguide members 322U of the first waveguide device 350a. The waveguide members 322L and the conductive rods 324L of the second waveguide device 350b are arranged on a third conductive member 340. The second waveguide device 350b is basically similar in construction to the first waveguide device 350a.

As shown in FIG. 19A, the conductive member 310 has a plurality of slots 312 which are arrayed along the first direction (the Y direction) and a second direction (the X direction) orthogonal to the first direction. The waveguide face 322a of each waveguide member 322U extends along the Y direction, and opposes four slots that are disposed along the Y direction among the plurality of slots 312. Although the conductive member 310 has 20 slots 312 in an array of 5 rows and 4 columns in this example, the number of slots 312 is not limited to this example. Without being limited to the example where each waveguide member 322U opposes all slots that are disposed along the Y direction among the plurality of slots 312, each waveguide member 322U may oppose at least two adjacent slots along the Y direction. The interval between the centers of any two adjacent waveguide faces 322a is set to be shorter than the wavelength $\lambda o$, for example. Such a structure avoids occurrence of grating lobe. Influences of grating lobes will be less likely to appear as the interval between the centers of two adjacent waveguide faces 322a becomes shorter. However, it is not necessary preferable for the interval between the centers of two adjacent waveguide faces 322a to be less than $\lambda o/2$ because, then, the widths of the conductive members and conductive rods will need to be narrowed.

Figure 19C:
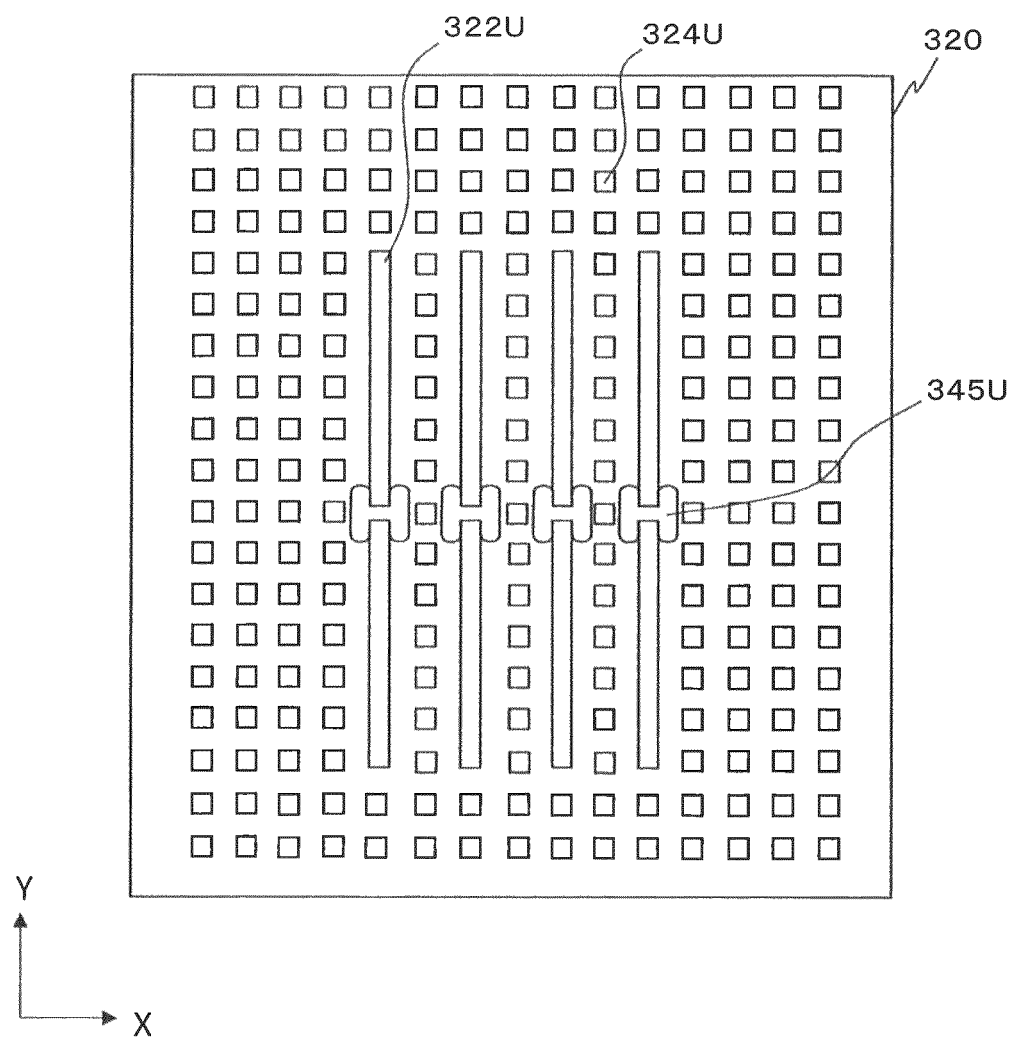
Figure 19D:
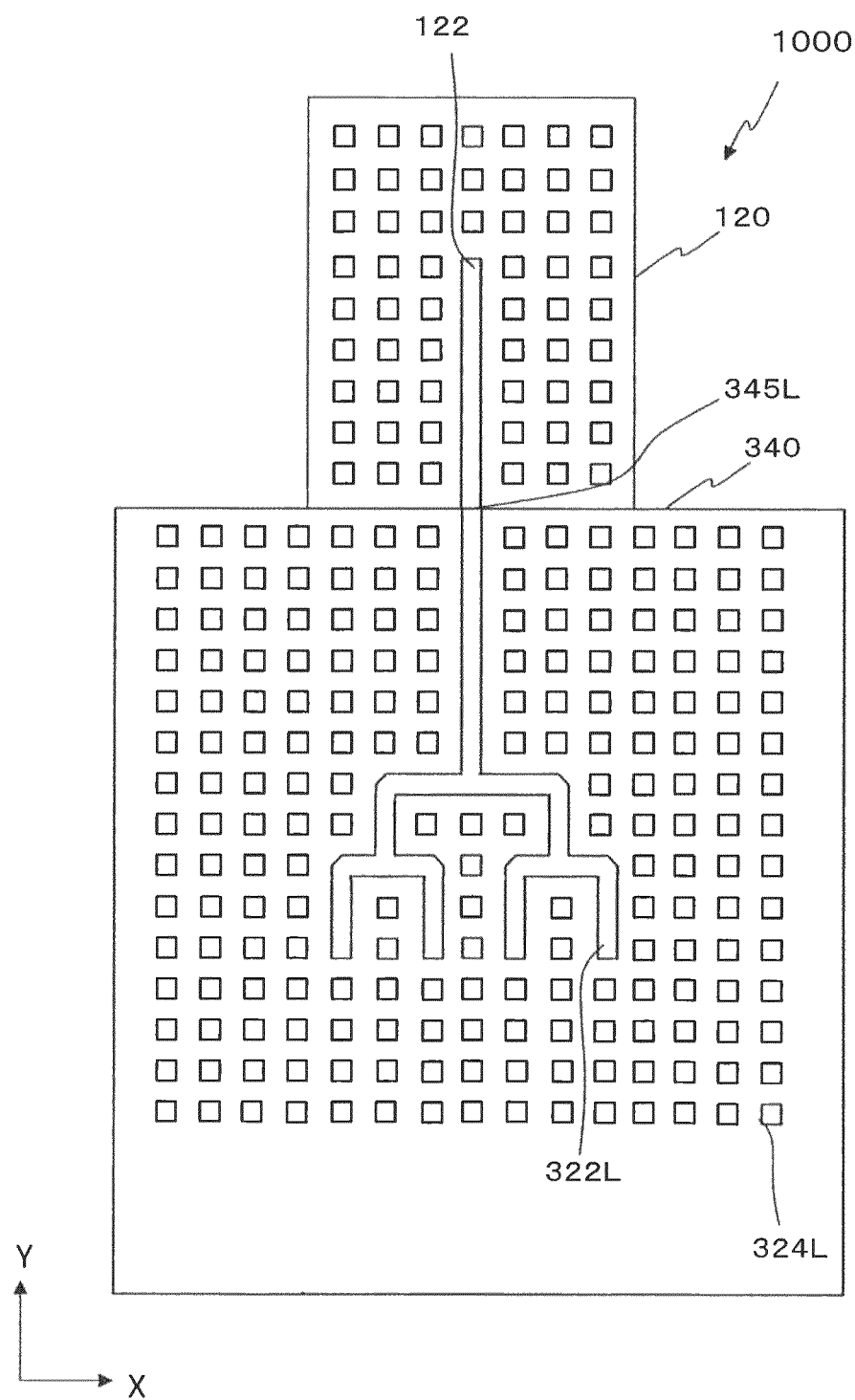
FIG. 19D is a diagram showing a planar layout of a waveguide member 322L in a second waveguide device 350b.

FIG. 19C is a diagram showing a planar layout of waveguide members 322U in the first waveguide device 350a. FIG. 19D is a diagram showing a planar layout of a waveguide member 322L in the second waveguide device 350b. As is clear from these figures, the waveguide members 322U of the first waveguide device 350a extend linearly, and include no branching portions or bends; on the other hand, the waveguide members 322L of the second waveguide device 350b include both branching portions and bends. The combination of the "second conductive member 320" and the "third conductive member 340" in the second waveguide device 350b corresponds to the combination in the first waveguide device 350a of the "first conductive member 310" and the "second conductive member 320".

The waveguide members 322U of the first waveguide device 350a couple to the waveguide member 322L of the second waveguide device 350b, through ports (openings) 345U that are provided in the second conductive member 320. Stated otherwise, an electromagnetic wave which has propagated through the waveguide member 322L of the second waveguide device 350b passes through a port 345U to reach a waveguide member 322U of the first waveguide device 350a, and propagates through the waveguide member 322U of the first waveguide device 350a. In this case, each slot 312 functions as an antenna element to allow an electromagnetic wave which has propagated through the waveguide to be radiated into space. Conversely, when an electromagnetic wave which has propagated in space impinges on a slot 312, the electromagnetic wave couples to the waveguide member 322U of the first waveguide device 350a that lies directly under that slot 312, and propagates through the waveguide member 322U of the first waveguide device 350a. An electromagnetic wave which has propagated through a waveguide member 322U of the first waveguide device 350a may also pass through a port 345U to reach the waveguide member 322L of the second waveguide device 350b, and propagates through the waveguide member 322L of the second waveguide device 350b. Via a port 345L of the third conductive member 340, the waveguide member 322L of the second waveguide device 350b may couple to an external module.

FIG. 19D shows an exemplary construction where a waveguide member 122 of a microwave module 1000 is connected with the waveguide member 322L on the third conductive member 340. As described above, a throughhole 140 (not shown in this figure) is provided in the Z direction of the conductive member 120, and a signal wave which is generated by the millimeter wave IC is propagated through the waveguide face 122a of the waveguide member 122 and the waveguide face of the waveguide member 322L.

In the present specification, a device which includes any of the aforementioned modules, at least one radiating element, and a waveguide device which allows electromagnetic waves to be propagated between the module and the at least one radiating element is referred to as a radar device".

The first conductive member 310 shown in FIG. 19A may be called a "radiation layer". Moreover, the entirety of the second conductive member 320, the waveguide members 322U, and the conductive rods 324U shown in FIG. 19C may be called an "excitation layer", whereas the entirety of the third conductive member 340, the waveguide member 322L, and the conductive rods 324L shown in FIG. 19D may be called a "distribution layer". Moreover, the "excitation layer" and the "distribution layer" may be collectively called a "feeding layer". Each of the "radiation layer", the "excitation layer", and the "distribution layer" can be mass-produced by processing a single metal plate. The radiation layer, the excitation layer, the distribution layer, and any electronic circuitry to be provided on the rear face side of the distribution layer may be produced as a single-module product.

In the array antenna of this example, as can be seen from FIG. 19B, a radiation layer, an excitation layer, and a distribution layer are layered, which are in plate form; therefore, a flat and low-profile flat panel antenna is realized as a whole. For example, the height (thickness) of a multi-layer structure having a cross-sectional construction as shown in FIG. 19B can be 10 mm or less.

In the example shown in FIG. 19D, the distances of a plurality of waveguides extending from the waveguide member 122 through the waveguide member 322L to the respective ports 345U (see FIG. 19C) of the second conductive member 320 are all equal. Therefore, a signal wave which has propagated in the waveguide face 122a of the waveguide member 122 to be input to the waveguide member 322L reaches the four ports 345U, which are disposed in the center along the Y direction of the respective second waveguide members 322U, all in the same phase. As a result, the four waveguide members 322U on the second conductive member 320 can be excited in the same phase.

Depending on the purpose, it is not necessary for all slots 312 functioning as antenna elements to radiate electromagnetic waves in the same phase. The network patterns of the waveguide members in the excitation layer and the distribution layer may be arbitrary, without being limited to what is shown in the figure.

As shown in FIG. 19C, in the present embodiment, between two adjacent waveguide faces 322a among the plurality of waveguide members 322, there exists only a single column of conductive rods 324U which are arrayed along the Y direction. Such structure can also be regarded as an artificial magnetic conductor, as will be described below. Based on this structure, the interval between two adjacent waveguide members 322 can be reduced. This allows the interval between two slots 312 that are adjacent along the X direction to be also reduced. As a result, occurrence of grating lobes can be suppressed. The artificial magnetic conductor that is described in the embodiments of the present disclosure consists of rows of conductive rods, for example. In order to prevent electromagnetic waves from leaking away from the waveguide face, it has been believed essential that there exist at least two rows of conductive rods on one side of the waveguide member(s), such rows of conductive rods extending along the waveguide member(s) (ridge(s)). The reason is that it takes at least two rows of conductive rods for them to have a "period". However, according to a study by the inventors, even when only one row of conductive rods, or only one conductive rod, exists between two waveguide members that extend in parallel to each other, the intensity of a signal that leaks from one waveguide member to the other waveguide member can be suppressed to −10 dB or less, which is a practically sufficient value in many applications. The reason why such a sufficient level of separation is achieved with only an imperfect periodic structure is so far unclear. However, in view of this fact, in the present disclosure, the conventional notion of "artificial magnetic conductor" is extended so that the term also encompasses a structure including only one row of conductive rods, or only one conductive rod.

Application Example 1: Onboard Radar System

Next, as an Application Example of utilizing the above-described slot array antenna, an instance of an onboard radar system including a slot array antenna will be described. A transmission wave used in an onboard radar system may have a frequency of e.g. 76 gigahertz (GHz) band, which will have a wavelength λo of about 4 mm in free space.

In safety technology of automobiles, e.g., collision avoidance systems or automated driving, it is particularly essential to identify one or more vehicles (targets) that are traveling ahead of the driver's vehicle. As a method of identifying vehicles, techniques of estimating the directions of arriving waves by using a radar system have been under development.

Figure 20:
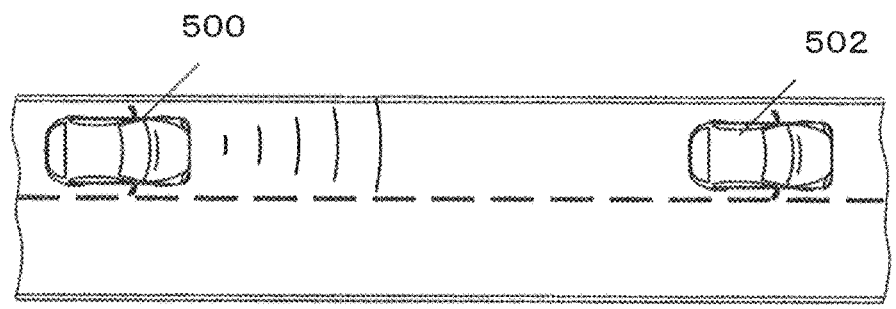
FIG. 20 is a diagram showing a driver's vehicle 500, and a preceding vehicle 502 that is traveling in the same lane as the driver's vehicle 500.

FIG. 20 shows a driver's vehicle 500, and a preceding vehicle 502 that is traveling in the same lane as the driver's vehicle 500. The driver's vehicle 500 includes an onboard radar system which incorporates a slot array antenna according to any of the above-described embodiments. When the onboard radar system of the driver's vehicle 500 radiates a radio frequency transmission signal, the transmission signal reaches the preceding vehicle 502 and is reflected therefrom, so that a part of the signal returns to the driver's vehicle 500. The onboard radar system receives this signal to calculate a position of the preceding vehicle 502, a distance ("range") to the preceding vehicle 502, velocity, etc.

Figure 21:
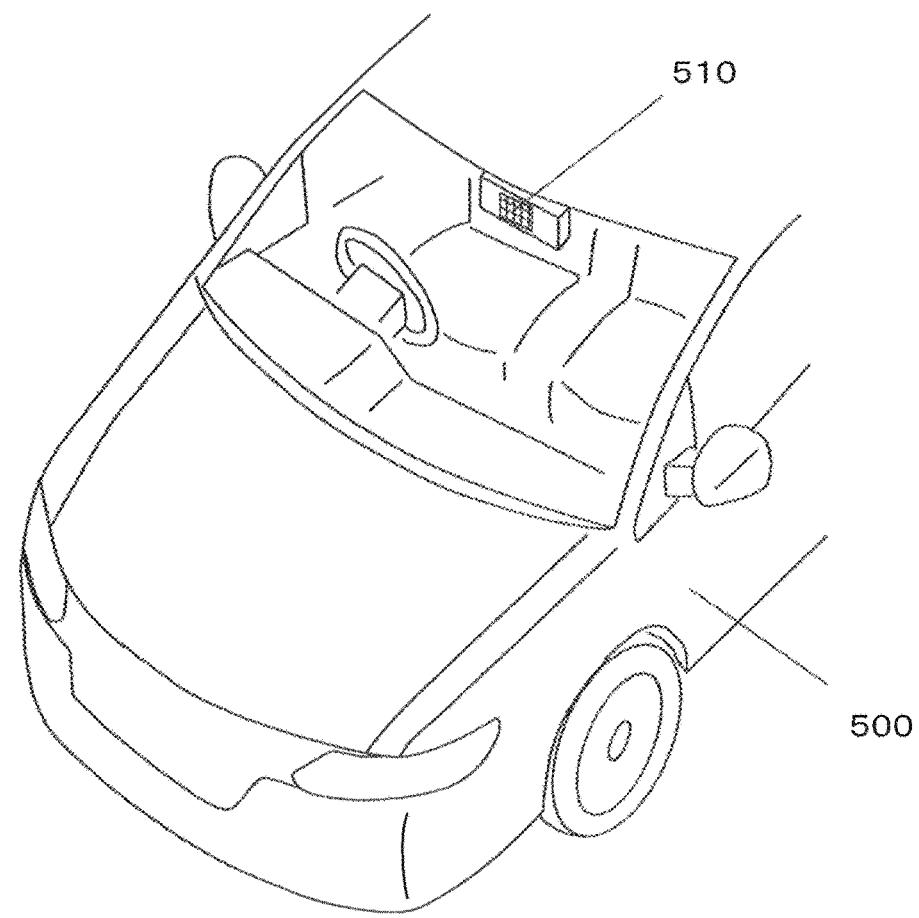
FIG. 21 is a diagram showing an onboard radar system 510 of the driver's vehicle 500.

FIG. 21 shows the onboard radar system 510 of the driver's vehicle 500. The onboard radar system 510 is provided within the vehicle. More specifically, the onboard radar system 510 is disposed on a face of the rearview mirror that is opposite to its specular surface. From within the vehicle, the onboard radar system 510 radiates a radio frequency transmission signal in the direction of travel of the vehicle 500, and receives a signal(s) which arrives from the direction of travel.

The onboard radar system 510 of this Application Example includes a slot array antenna according to the above embodiment of the present disclosure. The slot array antenna may include a plurality of waveguide members which are parallel to one another. It is arranged so that the direction that each of the plurality of waveguide members extends coincides with the vertical direction, and that the direction in which the plurality of waveguide members are arrayed coincides with the horizontal direction. As a result, the lateral dimension and the vertical dimension of the plurality of slots as viewed from the front can be reduced.

Exemplary dimensions of an antenna device including the above array antenna may be 60 mm (wide)×30 mm (long)×10 mm (deep). It will be appreciated that this is a very small size for a millimeter wave radar system of the 76 GHz band.

Note that many a conventional onboard radar system is provided outside the vehicle, e.g., at the tip of the front nose. The reason is that the onboard radar system is relatively large in size, and thus is difficult to be provided within the vehicle as in the present disclosure. The onboard radar system 510 of this Application Example may be installed within the vehicle as described above, but may instead be mounted at the tip of the front nose. Since the footprint of the onboard radar system on the front nose is reduced, other parts can be more easily placed.

The Application Example allows the interval between a plurality of waveguide members (ridges) that are used in the transmission antenna to be narrow, which also narrows the interval between a plurality of slots to be provided opposite from a number of adjacent waveguide members. This reduces the influences of grating lobes. For example, when the interval between the centers of two laterally adjacent slots is shorter than the free-space wavelength λo of the transmission wave (i.e., less than about 4 mm), no grating lobes will occur frontward. As a result, influences of grating lobes are reduced. Note that grating lobes will occur when the interval at which the antenna elements are arrayed is greater than a half of the wavelength of an electromagnetic wave. If the interval at which the antenna elements are arrayed is less than the wavelength, no grating lobes will occur frontward. Therefore, in the case where no beam steering is performed to impart phase differences among the radio waves radiated from the respective antenna elements composing an array antenna, grating lobes will exert substantially no influences so long as the interval at which the antenna elements are arrayed is smaller than the wavelength. By adjusting the array factor of the transmission antenna, the directivity of the transmission antenna can be adjusted. A phase shifter may be provided so as to be able to individually adjust the phases of electromagnetic waves that are transmitted on plural waveguide members. In this case, in order to avoid the influences of grating lobes, it is more preferable that the interval between antenna elements is less than a half of the free-space wavelength λo of the transmission wave. By providing a phase shifter, the directivity of the transmission antenna can be changed in any desired direction. Since the construction of a phase shifter is well-known, description thereof will be omitted.

A reception antenna according to the Application Example is able to reduce reception of reflected waves associated with grating lobes, thereby being able to improve the precision of the below-described processing. Hereinafter, an example of a reception process will be described.

Figure 22A:
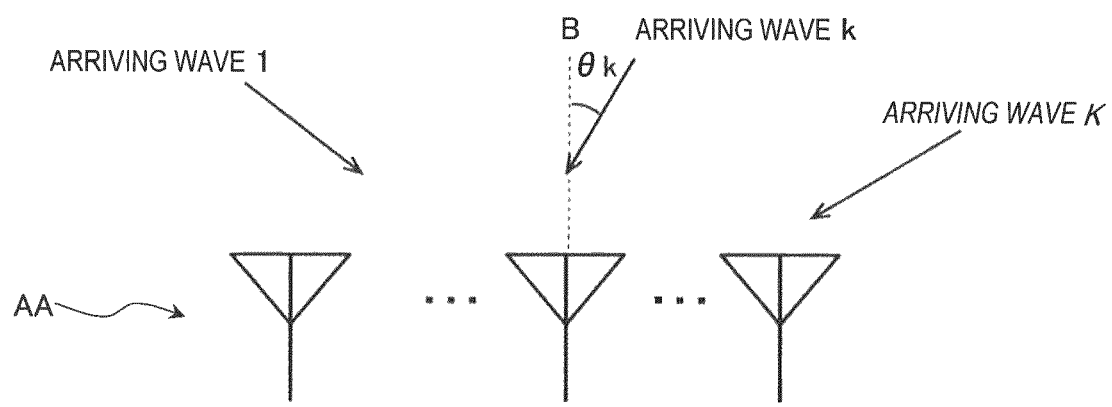
FIG. 22A is a diagram showing a relationship between an array antenna AA of the onboard radar system 510 and plural arriving waves k (k: an integer from 1 to K; K is the number of targets that are present in different azimuths).

FIG. 22A shows a relationship between an array antenna AA of the onboard radar system 510 and plural arriving waves k (k: an integer from 1 to K; the same will always apply below. K is the number of targets that are present in different azimuths). The array antenna AA includes M antenna elements in a linear array. Principlewise, an antenna can be used for both transmission and reception, and therefore the array antenna AA can be used for both a transmission antenna and a reception antenna. Hereinafter, an example method of processing an arriving wave which is received by the reception antenna will be described.

The array antenna AA receives plural arriving waves that simultaneously impinge at various angles. Some of the plural arriving waves may be arriving waves which have been radiated from the transmission antenna of the same onboard radar system 510 and reflected by a target(s). Furthermore, some of the plural arriving waves may be direct or indirect arriving waves that have been radiated from other vehicles.

The incident angle of each arriving wave (i.e., an angle representing its direction of arrival) is an angle with respect to the broadside B of the array antenna AA. The incident angle of an arriving wave represents an angle with respect to a direction which is perpendicular to the direction of the line along which antenna elements are arrayed.

Now, consider a $k^{th}$ arriving wave. Where K arriving waves are impinging on the array antenna from K targets existing at different azimuths, a "$k^{th}$ arriving wave" means an arriving wave which is identified by an incident angle $\theta_k$.

Figure 22B:
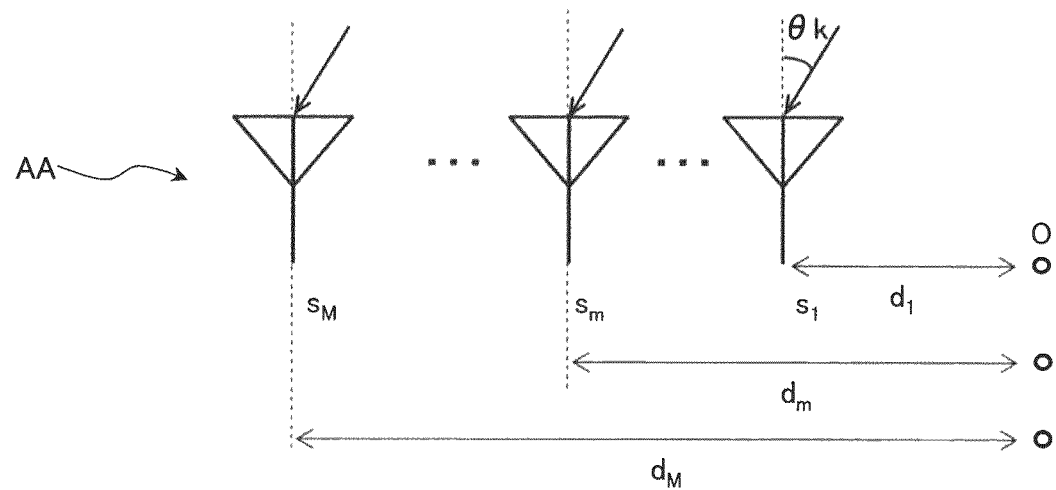
FIG. 22B is a diagram showing the array antenna AA receiving the $k^{th}$ arriving wave.

FIG. 22B shows the array antenna AA receiving the $k^{th}$ arriving wave. The signals received by the array antenna AA can be expressed as a "vector" having M elements, by Math. 1.

$$S=[s_1,s_2,\ldots,s_M]^T \quad \text{(Math. 1)}$$

In the above, $s_m$ (where m is an integer from 1 to M; the same will also be true hereinbelow) is the value of a signal which is received by an $m^{th}$ antenna element. The superscript $T$ means transposition. S is a column vector. The column vector S is defined by a product of multiplication between a direction vector (referred to as a steering vector or a mode vector) as determined by the construction of the array antenna and a complex vector representing a signal from each target (also referred to as a wave source or a signal source). When the number of wave sources is K, the waves of signals arriving at each individual antenna element from the respective K wave sources are linearly superposed. In this state, $s_m$ can be expressed by Math. 2.

$$s_m = \sum_{k=1}^{K} a_k \exp\left\{j\left(\frac{2\pi}{\lambda}d_m\sin\theta_k + \varphi_k\right)\right\} \quad \text{[Math. 2]}$$

In Math. 2, $a_k$, $\theta_k$ and $\varphi_k$ respectively denote the amplitude, incident angle, and initial phase of the $k^{th}$ arriving wave. Moreover, $\lambda$ denotes the wavelength of an arriving wave, and j is an imaginary unit.

As will be understood from Math. 2, $s_m$ is expressed as a complex number consisting of a real part (Re) and an imaginary part (Im).

When this is further generalized by taking noise (internal noise or thermal noise) into consideration, the array reception signal X can be expressed as Math. 3.

$$X=S+N \quad \text{(Math. 3)}$$

N is a vector expression of noise.

The signal processing circuit generates a spatial covariance matrix Rxx (Math. 4) of arriving waves by using the array reception signal X expressed by Math. 3, and further determines eigenvalues of the spatial covariance matrix Rxx.

$$R_{xx} = XX^H \quad \text{[Math. 4]}$$

$$= \begin{bmatrix} Rxx_{11} & \cdots & Rxx_{1M} \\ \vdots & \ddots & \vdots \\ Rxx_{M1} & \cdots & Rxx_{MM} \end{bmatrix}$$

In the above, the superscript $^H$ means complex conjugate transposition (Hermitian conjugate).

Among the eigenvalues, the number of eigenvalues which have values equal to or greater than a predetermined value that is defined based on thermal noise (signal space eigenvalues) corresponds to the number of arriving waves. Then, angles that produce the highest likelihood as to the directions of arrival of reflected waves (i.e. maximum likelihood) are calculated, whereby the number of targets and the angles at which the respective targets are present can be identified. This process is known as a maximum likelihood estimation technique.

Figure 23:
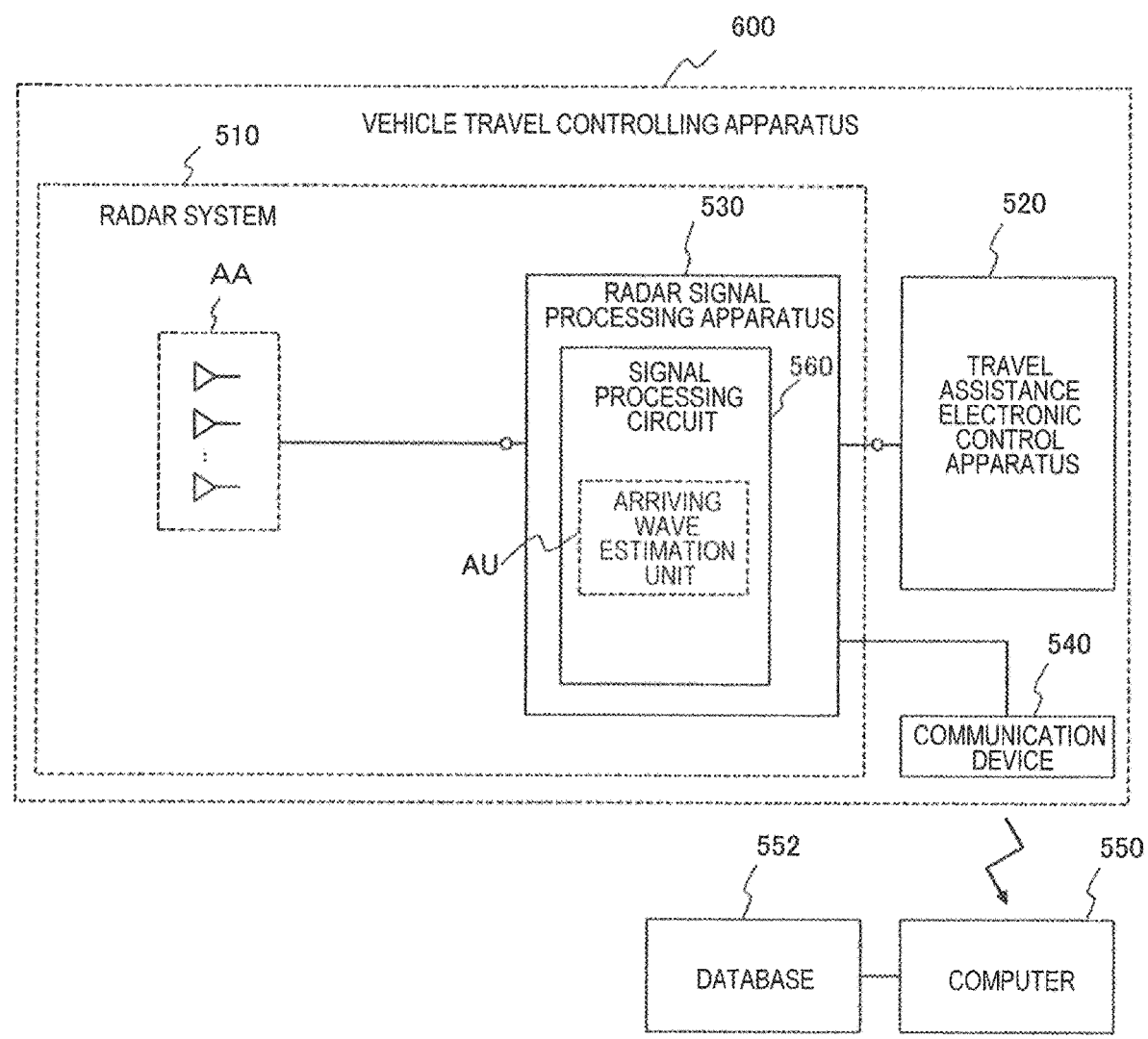
FIG. 23 is a block diagram showing an exemplary fundamental construction of a vehicle travel controlling apparatus 600 according to the present disclosure.

Next, see FIG. 23. FIG. 23 is a block diagram showing an exemplary fundamental construction of a vehicle travel controlling apparatus 600 according to the present disclosure. The vehicle travel controlling apparatus 600 shown in FIG. 23 includes a radar system 510 which is mounted in a vehicle, and a travel assistance electronic control apparatus 520 which is connected to the radar system 510. The radar system 510 includes an array antenna AA and a radar signal processing apparatus 530.

The array antenna AA includes a plurality of antenna elements, each of which outputs a reception signal in response to one or plural arriving waves. As mentioned earlier, the array antenna AA is capable of radiating a millimeter wave of a high frequency.

In the radar system 510, the array antenna AA needs to be attached to the vehicle, while at least some of the functions of the radar signal processing apparatus 530 may be implemented by a computer 550 and a database 552 which are provided externally to the vehicle travel controlling apparatus 600 (e.g., outside of the driver's vehicle). In that case, the portions of the radar signal processing apparatus 530 that are located within the vehicle may be perpetually or occasionally connected to the computer 550 and database 552 external to the vehicle so that bidirectional communications of signal or data are possible. The communications are to be performed via a communication device 540 of the vehicle and a commonly-available communications network.

The database 552 may store a program which defines various signal processing algorithms. The content of the data and program needed for the operation of the radar system 510 may be externally updated via the communication device 540. Thus, at least some of the functions of the radar system 510 can be realized externally to the driver's vehicle (which is inclusive of the interior of another vehicle), by a cloud computing technique. Therefore, an "onboard" radar system in the meaning of the present disclosure does not require that all of its constituent elements be mounted within the (driver's) vehicle. However, for simplicity, the present application will describe an implementation in which all constituent elements according to the present disclosure are mounted in a single vehicle (i.e., the driver's vehicle), unless otherwise specified.

The radar signal processing apparatus 530 includes a signal processing circuit 560. The signal processing circuit 560 directly or indirectly receives reception signals from the array antenna AA, and inputs the reception signals, or a secondary signal(s) which has been generated from the reception signals, to an arriving wave estimation unit AU. A part or a whole of the circuit (not shown) which generates a secondary signal(s) from the reception signals does not need to be provided inside of the signal processing circuit 560. A part or a whole of such a circuit (preprocessing circuit) may be provided between the array antenna AA and the radar signal processing apparatus 530.

In the radar system 510, the construction from the array antenna AA (which is composed of a plurality of radiating elements) to the signal processing circuit 560 corresponds to the aforementioned "radar device". More specifically, the "radar device" includes: a plurality of radiating elements; and a microwave module including a waveguide module and a microwave IC. The plurality of radiating elements are connected to a waveguide device composing the waveguide module. The signal processing circuit 560 is configured to perform computation by using the reception signals or secondary signal(s), and output a signal indicating the number of arriving waves. As used herein, a "signal indicating the number of arriving waves" can be said to be a signal indicating the number of preceding vehicles (which may be one preceding vehicle or plural preceding vehicles) ahead of the driver's vehicle.

The signal processing circuit 560 may be configured to execute various signal processing which is executable by known radar signal processing apparatuses. For example, the signal processing circuit 560 may be configured to execute "super-resolution algorithms" such as the MUSIC method, the ESPRIT method, or the SAGE method, or other algorithms for direction-of-arrival estimation of relatively low resolution.

The arriving wave estimation unit AU shown in FIG. 23 estimates an angle representing the azimuth of each arriving wave by an arbitrary algorithm for direction-of-arrival estimation, and outputs a signal indicating the estimation result. The signal processing circuit 560 estimates the distance to each target as a wave source of an arriving wave, the relative velocity of the target, and the azimuth of the target by using a known algorithm which is executed by the arriving wave estimation unit AU, and output a signal indicating the estimation result.

In the present disclosure, the term "signal processing circuit" is not limited to a single circuit, but encompasses any implementation in which a combination of plural circuits is conceptually regarded as a single functional part. The signal processing circuit 560 may be realized by one or more System-on-Chips (SoCs). For example, a part or a whole of the signal processing circuit 560 may be an FPGA (Field-Programmable Gate Array), which is a programmable logic device (PLD). In that case, the signal processing circuit 560 includes a plurality of computation elements (e.g., general-purpose logics and multipliers) and a plurality of memory elements (e.g., look-up tables or memory blocks). Alternatively, the signal processing circuit 560 may be a set of a general-purpose processor(s) and a main memory device(s). The signal processing circuit 560 may be a circuit which includes a processor core(s) and a memory device(s). These may function as the signal processing circuit 560.

The travel assistance electronic control apparatus 520 is configured to provide travel assistance for the vehicle based on various signals which are output from the radar signal processing apparatus 530. The travel assistance electronic control apparatus 520 instructs various electronic control units to fulfill predetermined functions, e.g., a function of issuing an alarm to prompt the driver to make a braking operation when the distance to a preceding vehicle (vehicular gap) has become shorter than a predefined value; a function of controlling the brakes; and a function of controlling the accelerator. For example, in the case of an operation mode which performs adaptive cruise control of the driver's vehicle, the travel assistance electronic control apparatus 520 sends predetermined signals to various electronic control units (not shown) and actuators, to maintain the distance of the driver's vehicle to a preceding vehicle at a predefined value, or maintain the traveling velocity of the driver's vehicle at a predefined value.

In the case of the MUSIC method, the signal processing circuit 560 determines eigenvalues of the spatial covariance matrix, and, as a signal indicating the number of arriving waves, outputs a signal indicating the number of those eigenvalues ("signal space eigenvalues") which are greater than a predetermined value (thermal noise power) that is defined based on thermal noise.

Figure 24:
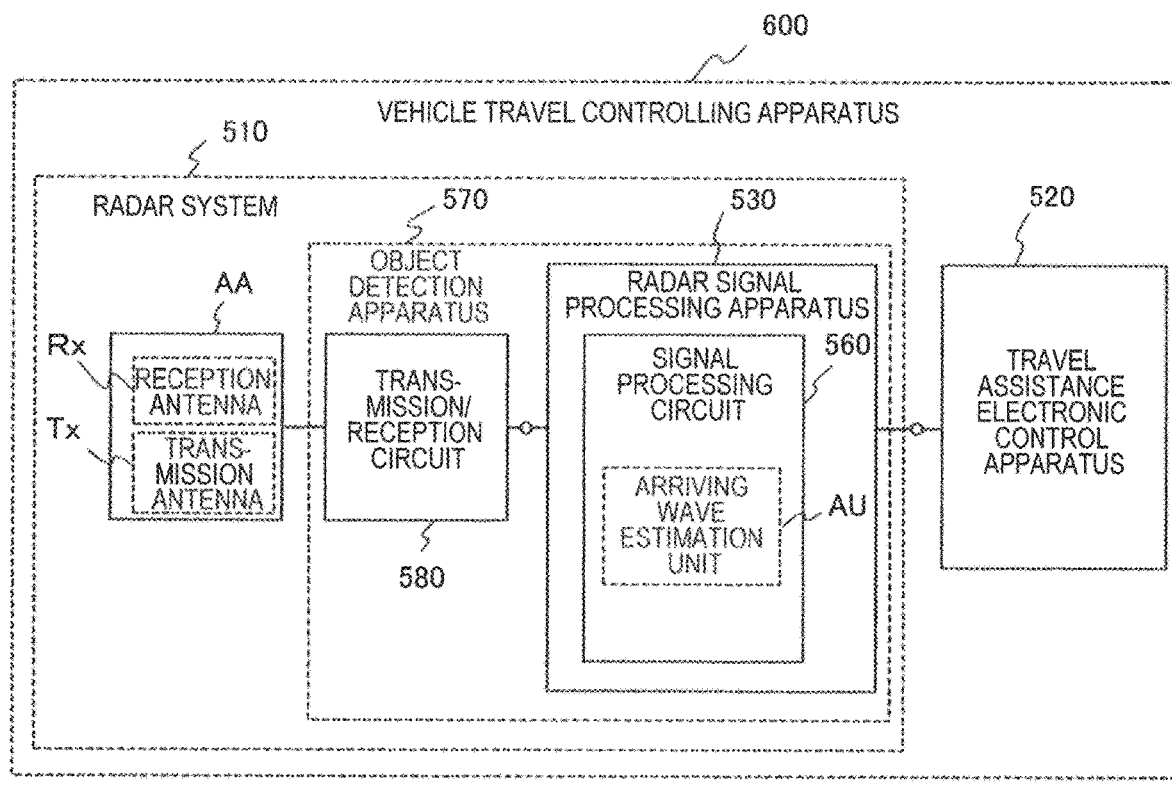
FIG. 24 is a block diagram showing another exemplary construction for the vehicle travel controlling apparatus 600.

Next, see FIG. 24. FIG. 24 is a block diagram showing another exemplary construction for the vehicle travel controlling apparatus 600. The radar system 510 in the vehicle travel controlling apparatus 600 of FIG. 24 includes an array antenna AA, which includes an array antenna that is dedicated to reception only (also referred to as a reception antenna) Rx and an array antenna that is dedicated to transmission only (also referred to as a transmission antenna) Tx; and an object detection apparatus 570.

At least one of the transmission antenna Tx and the reception antenna Rx has the aforementioned waveguide structure. The transmission antenna Tx radiates a transmission wave, which may be a millimeter wave, for example. The reception antenna Rx that is dedicated to reception only outputs a reception signal in response to one or plural arriving waves (e.g., a millimeter wave(s)).

A transmission/reception circuit 580 sends a transmission signal for a transmission wave to the transmission antenna Tx, and performs "preprocessing" for reception signals of reception waves received at the reception antenna Rx. A part or a whole of the preprocessing may be performed by the signal processing circuit 560 in the radar signal processing apparatus 530. A typical example of preprocessing to be performed by the transmission/reception circuit 580 may be generating a beat signal from a reception signal, and converting a reception signal of analog format into a reception signal of digital format.

Note that the radar system according to the present disclosure may, without being limited to the implementation where it is mounted in the driver's vehicle, be used while being fixed on the road or a building.

Next, an example of a more specific construction of the vehicle travel controlling apparatus 600 will be described.

Figure 25:
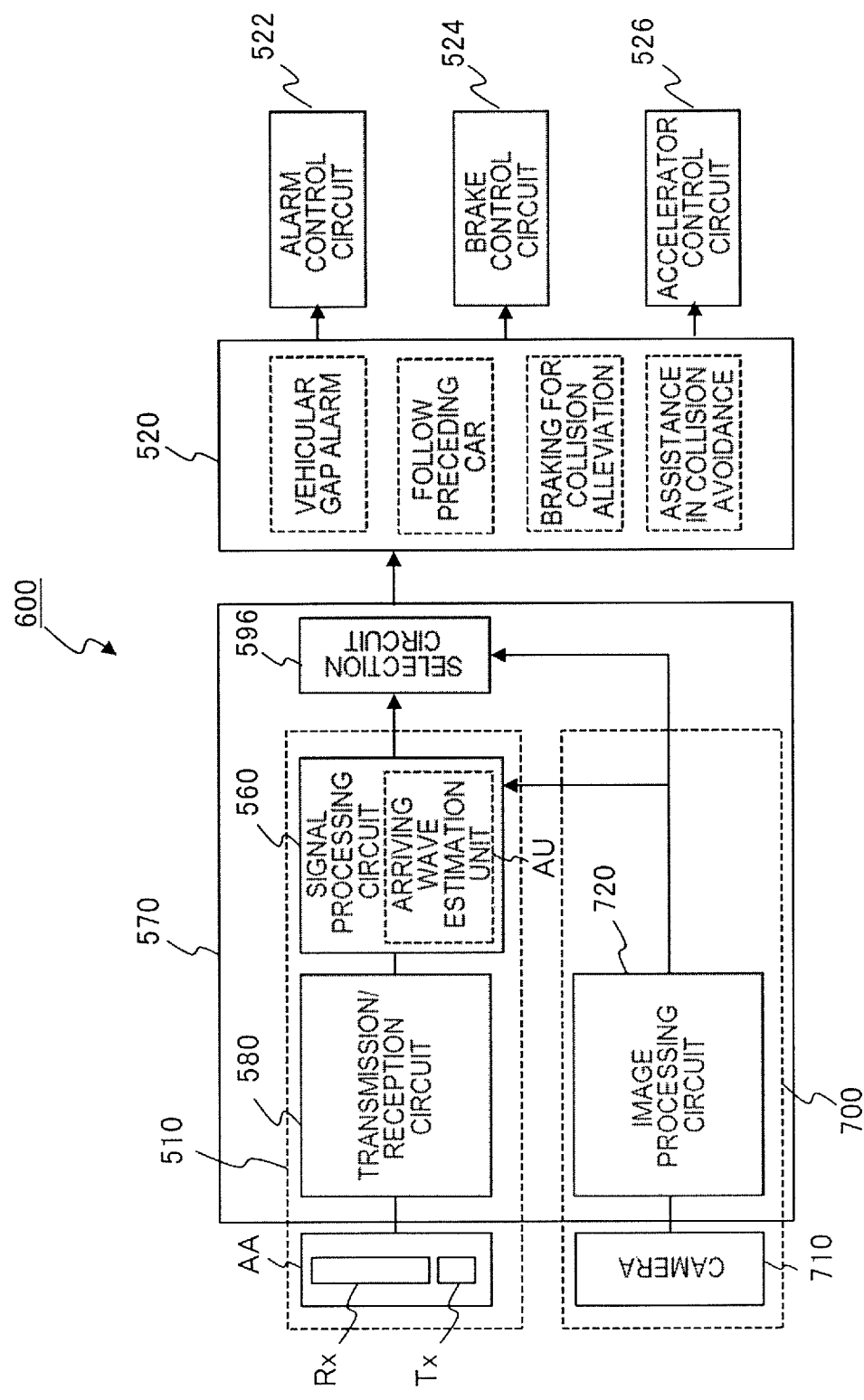
FIG. 25 is a block diagram showing an example of a more specific construction of the vehicle travel controlling apparatus 600.

FIG. 25 is a block diagram showing an example of a more specific construction of the vehicle travel controlling apparatus 600. The vehicle travel controlling apparatus 600 shown in FIG. 25 includes a radar system 510 and an onboard camera system 700. The radar system 510 includes an array antenna AA, a transmission/reception circuit 580 which is connected to the array antenna AA, and a signal processing circuit 560.

The onboard camera system 700 includes an onboard camera 710 which is mounted in a vehicle, and an image processing circuit 720 which processes an image or video that is acquired by the onboard camera 710.

The vehicle travel controlling apparatus 600 of this Application Example includes an object detection apparatus 570 which is connected to the array antenna AA and the onboard camera 710, and a travel assistance electronic control apparatus 520 which is connected to the object detection apparatus 570. The object detection apparatus 570 includes a transmission/reception circuit 580 and an image processing circuit 720, in addition to the above-described radar signal processing apparatus 530 (including the signal processing circuit 560). The object detection apparatus 570 detects a target on the road or near the road, by using not only the information which is obtained by the radar system 510 but also the information which is obtained by the image processing circuit 720. For example, while the driver's vehicle is traveling in one of two or more lanes of the same direction, the image processing circuit 720 can distinguish which lane the driver's vehicle is traveling in, and supply that result of distinction to the signal processing circuit 560. When the number and azimuth(s) of preceding vehicles are to be recognized by using a predetermined algorithm for direction-of-arrival estimation (e.g., the MUSIC method), the signal processing circuit 560 is able to provide more reliable information concerning a spatial distribution of preceding vehicles by referring to the information from the image processing circuit 720.

Note that the onboard camera system 700 is an example of a means for identifying which lane the driver's vehicle is traveling in. The lane position of the driver's vehicle may be identified by any other means. For example, by utilizing an ultra-wide band (UWB) technique, it is possible to identify which one of a plurality of lanes the driver's vehicle is traveling in. It is widely known that the ultra-wide band technique is applicable to position measurement and/or radar. Using the ultra-wide band technique enhances the range resolution of the radar, so that, even when a large number of vehicles exist ahead, each individual target can be detected with distinction, based on differences in distance. This makes it possible to identify distance from a guardrail on the road shoulder, or from the median strip, with good precision. The width of each lane is predefined based on each country's law or the like. By using such information, it becomes possible to identify where the lane in which the driver's vehicle is currently traveling is. Note that the ultra-wide band technique is an example. A radio wave based on any other wireless technique may be used. Moreover, LIDAR (Light Detection and Ranging) may be used together with a radar. LIDAR is sometimes called "laser radar".

The array antenna AA may be a generic millimeter wave array antenna for onboard use. The transmission antenna Tx in this Application Example radiates a millimeter wave as a transmission wave ahead of the vehicle. A portion of the transmission wave is reflected off a target which is typically a preceding vehicle, whereby a reflected wave occurs from the target being a wave source. A portion of the reflected wave reaches the array antenna (reception antenna) AA as an arriving wave. Each of the plurality of antenna elements of the array antenna AA outputs a reception signal in response to one or plural arriving waves. In the case where the number of targets functioning as wave sources of reflected waves is K (where K is an integer of one or more), the number of arriving waves is K, but this number K of arriving waves is not known beforehand.

The example of FIG. 23 assumes that the radar system 510 is provided as an integral piece, including the array antenna AA, on the rearview mirror. However, the number and positions of array antennas AA are not limited to any specific number or specific positions. An array antenna AA may be disposed on the rear surface of the vehicle so as to be able to detect targets that are behind the vehicle. Moreover, a plurality of array antennas AA may be disposed on the front surface and the rear surface of the vehicle. The array antenna(s) AA may be disposed inside the vehicle.

Even in the case where a horn antenna whose respective antenna elements include horns as mentioned above is to be adopted as the array antenna(s) AA, the array antenna(s) with such antenna elements may be situated inside the vehicle.

The signal processing circuit 560 receives and processes the reception signals which have been received by the reception antenna Rx and subjected to preprocessing by the transmission/reception circuit 580. This process encompasses inputting the reception signals to the arriving wave estimation unit AU, or alternatively, generating a secondary signal(s) from the reception signals and inputting the secondary signal(s) to the arriving wave estimation unit AU.

In the example of FIG. 25, a selection circuit 596 which receives the signal being output from the signal processing circuit 560 and the signal being output from the image processing circuit 720 is provided in the object detection apparatus 570. The selection circuit 596 allows one or both of the signal being output from the signal processing circuit 560 and the signal being output from the image processing circuit 720 to be fed to the travel assistance electronic control apparatus 520.

Figure 26:
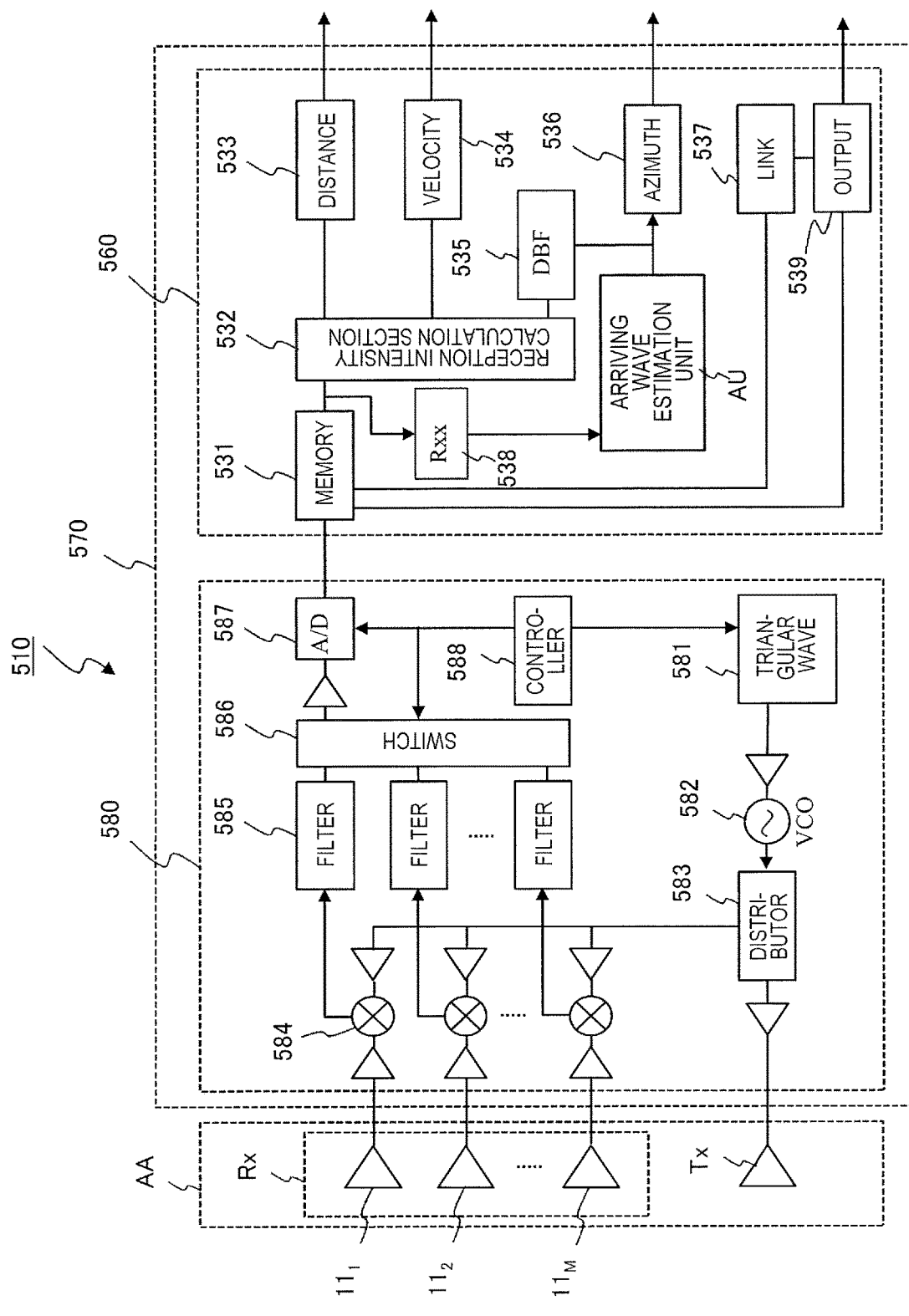
FIG. 26 is a block diagram showing a more detailed exemplary construction of an illustrative radar system 510 according to the present disclosure.

FIG. 26 is a block diagram showing a more detailed exemplary construction of the radar system 510 according to this Application Example.

As shown in FIG. 26, the array antenna AA includes a transmission antenna Tx which transmits a millimeter wave and reception antennas Rx which receive arriving waves reflected from targets. Although only one transmission antenna Tx is illustrated in the figure, two or more kinds of transmission antennas with different characteristics may be provided. The array antenna AA includes M antenna elements $11_1$, $11_2$, ..., $11_M$ (where M is an integer of 3 or more). In response to the arriving waves, the plurality of antenna elements $11_1$, $11_2$, ..., $11_M$ respectively output reception signals $s_1$, $s_2$, ..., $s_M$ (FIG. 22B).

In the array antenna AA, the antenna elements $11_1$ to $11_M$ are arranged in a linear array or a two-dimensional array at fixed intervals, for example. Each arriving wave will impinge on the array antenna AA from a direction at an angle θ with respect to the normal of the plane in which the antenna elements $11_1$ to $11_M$ are arrayed. Thus, the direction of arrival of an arriving wave is defined by this angle θ.

When an arriving wave from one target impinges on the array antenna AA, this approximates to a plane wave impinging on the antenna elements $11_1$ to $11_M$ from azimuths of the same angle θ. When K arriving waves impinge on the array antenna AA from K targets with different azimuths, the individual arriving waves can be identified in terms of respectively different angles $θ_1$ to $θ_K$.

Figure 27:
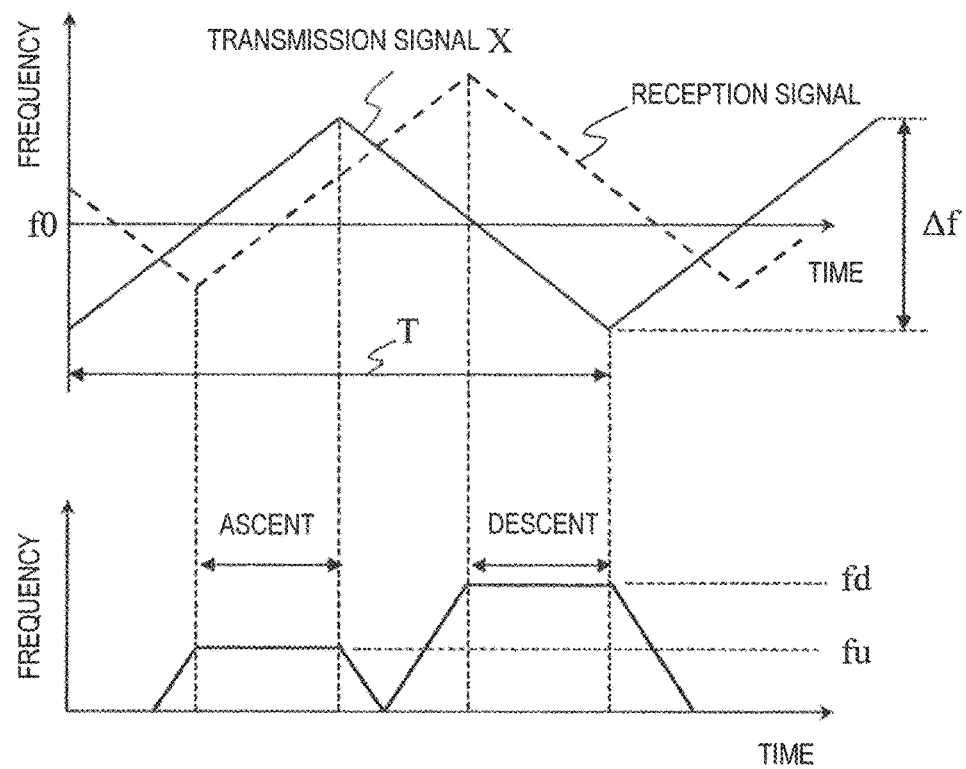
FIG. 27 is a diagram showing change in frequency of a transmission signal which is modulated based on the signal that is generated by a triangular wave generation circuit 581.

As shown in FIG. 27, the object detection apparatus 570 includes the transmission/reception circuit 580 and the signal processing circuit 560.

The transmission/reception circuit 580 includes a triangular wave generation circuit 581, a VCO (voltage controlled oscillator) 582, a distributor 583, mixers 584, filters 585, a switch 586, an A/D converter 587, and a controller 588. Although the radar system in this Application Example is configured to perform transmission and reception of millimeter waves by the FMCW method, the radar system of the present disclosure is not limited to this method. The transmission/reception circuit 580 is configured to generate a beat signal based on a reception signal from the array antenna AA and a transmission signal from the transmission antenna Tx.

The signal processing circuit 560 includes a distance detection section 533, a velocity detection section 534, and an azimuth detection section 536. The signal processing circuit 560 is configured to process a signal from the A/D converter 587 in the transmission/reception circuit 580, and output signals respectively indicating the detected distance to the target, the relative velocity of the target, and the azimuth of the target.

First, the construction and operation of the transmission/reception circuit 580 will be described in detail.

The triangular wave generation circuit 581 generates a triangular wave signal, and supplies it to the VCO 582. The VCO 582 outputs a transmission signal having a frequency as modulated based on the triangular wave signal. FIG. 27 is a diagram showing change in frequency of a transmission signal which is modulated based on the signal that is generated by the triangular wave generation circuit 581. This waveform has a modulation width Δf and a center frequency of f0. The transmission signal having a thus modulated frequency is supplied to the distributor 583. The distributor 583 allows the transmission signal obtained from the VCO 582 to be distributed among the mixers 584 and the transmission antenna Tx. Thus, the transmission antenna radiates a millimeter wave having a frequency which is modulated in triangular wave, as shown in FIG. 27.

In addition to the transmission signal, FIG. 27 also shows an example of a reception signal from an arriving wave which is reflected from a single preceding vehicle. The reception signal is delayed from the transmission signal. This delay is in proportion to the distance between the driver's vehicle and the preceding vehicle. Moreover, the frequency of the reception signal increases or decreases in accordance with the relative velocity of the preceding vehicle, due to the Doppler effect.

When the reception signal and the transmission signal are mixed, a beat signal is generated based on their frequency difference. The frequency of this beat signal (beat frequency) differs between a period in which the transmission signal increases in frequency (ascent) and a period in which the transmission signal decreases in frequency (descent). Once a beat frequency for each period is determined, based on such beat frequencies, the distance to the target and the relative velocity of the target are calculated.

Figure 28:
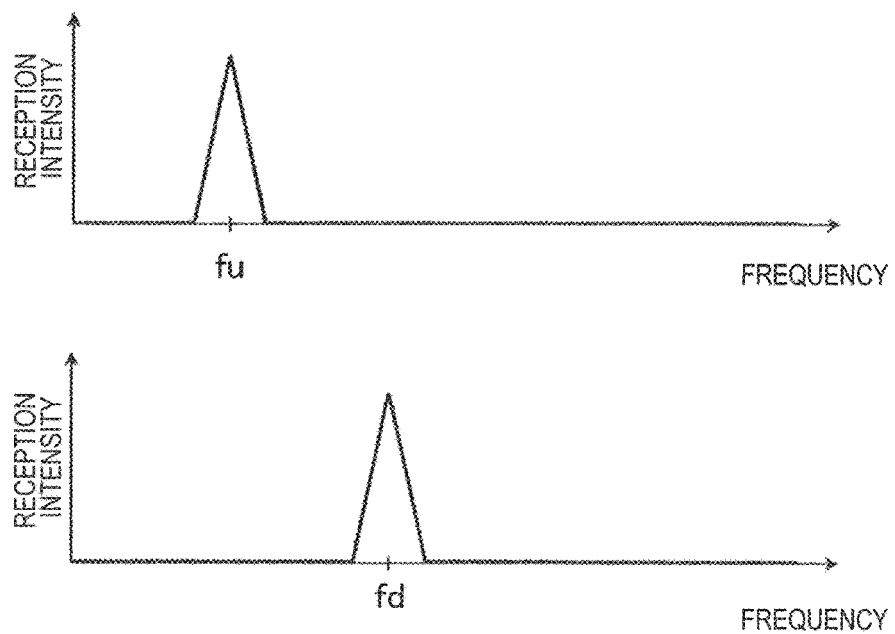
FIG. 28 is a diagram showing a beat frequency fu in an "ascent" period and a beat frequency fd in a "descent" period.

FIG. 28 shows a beat frequency fu in an "ascent" period and a beat frequency fd in a "descent" period. In the graph of FIG. 28, the horizontal axis represents frequency, and the vertical axis represents signal intensity. This graph is obtained by subjecting the beat signal to time-frequency conversion. Once the beat frequencies fu and fd are obtained, based on a known equation, the distance to the target and the relative velocity of the target are calculated. In this Application Example, with the construction and operation described below, beat frequencies corresponding to each antenna element of the array antenna AA are obtained, thus enabling estimation of the position information of a target.

In the example shown in FIG. 26, reception signals from channels $Ch_1$ to $Ch_M$ corresponding to the respective antenna elements $11_1$ to $11_M$ are each amplified by an amplifier, and input to the corresponding mixers 584. Each mixer 584 mixes the transmission signal into the amplified reception signal. Through this mixing, a beat signal is generated corresponding to the frequency difference between the reception signal and the transmission signal. The generated beat signal is fed to the corresponding filter 585. The filters 585 apply bandwidth control to the beat signals on the channels $Ch_1$ to $Ch_M$, and supply bandwidth-controlled beat signals to the switch 586.

The switch 586 performs switching in response to a sampling signal which is input from the controller 588. The controller 588 may be composed of a microcomputer, for example. Based on a computer program which is stored in a memory such as a ROM, the controller 588 controls the entire transmission/reception circuit 580. The controller 588 does not need to be provided inside the transmission/reception circuit 580, but may be provided inside the signal processing circuit 560. In other words, the transmission/reception circuit 580 may operate in accordance with a control signal from the signal processing circuit 560. Alternatively, some or all of the functions of the controller 588 may be realized by a central processing unit which controls the entire transmission/reception circuit 580 and signal processing circuit 560.

The beat signals on the channels $Ch_1$ to $Ch_M$ having passed through the respective filters 585 are consecutively supplied to the A/D converter 587 via the switch 586. In synchronization with the sampling signal, the A/D converter 587 converts the beat signals on the channels $Ch_1$ to $Ch_M$, which are input from the switch 586, into digital signals.

Hereinafter, the construction and operation of the signal processing circuit 560 will be described in detail. In this Application Example, the distance to the target and the relative velocity of the target are estimated by the FMCW method. Without being limited to the FMCW method as described below, the radar system can also be implemented by using other methods, e.g., 2 frequency CW and spread spectrum methods.

In the example shown in FIG. 26, the signal processing circuit 560 includes a memory 531, a reception intensity calculation section 532, a distance detection section 533, a velocity detection section 534, a DBF (digital beam forming) processing section 535, an azimuth detection section 536, a target link processing section 537, a matrix generation section 538, a target output processing section 539, and an arriving wave estimation unit AU. As mentioned earlier, a part or a whole of the signal processing circuit 560 may be implemented by FPGA, or by a set of a general-purpose processor(s) and a main memory device(s). The memory 531, the reception intensity calculation section 532, the DBF processing section 535, the distance detection section 533, the velocity detection section 534, the azimuth detection section 536, the target link processing section 537, and the arriving wave estimation unit AU may be individual parts that are implemented in distinct pieces of hardware, or functional blocks of a single signal processing circuit.

Figure 29:
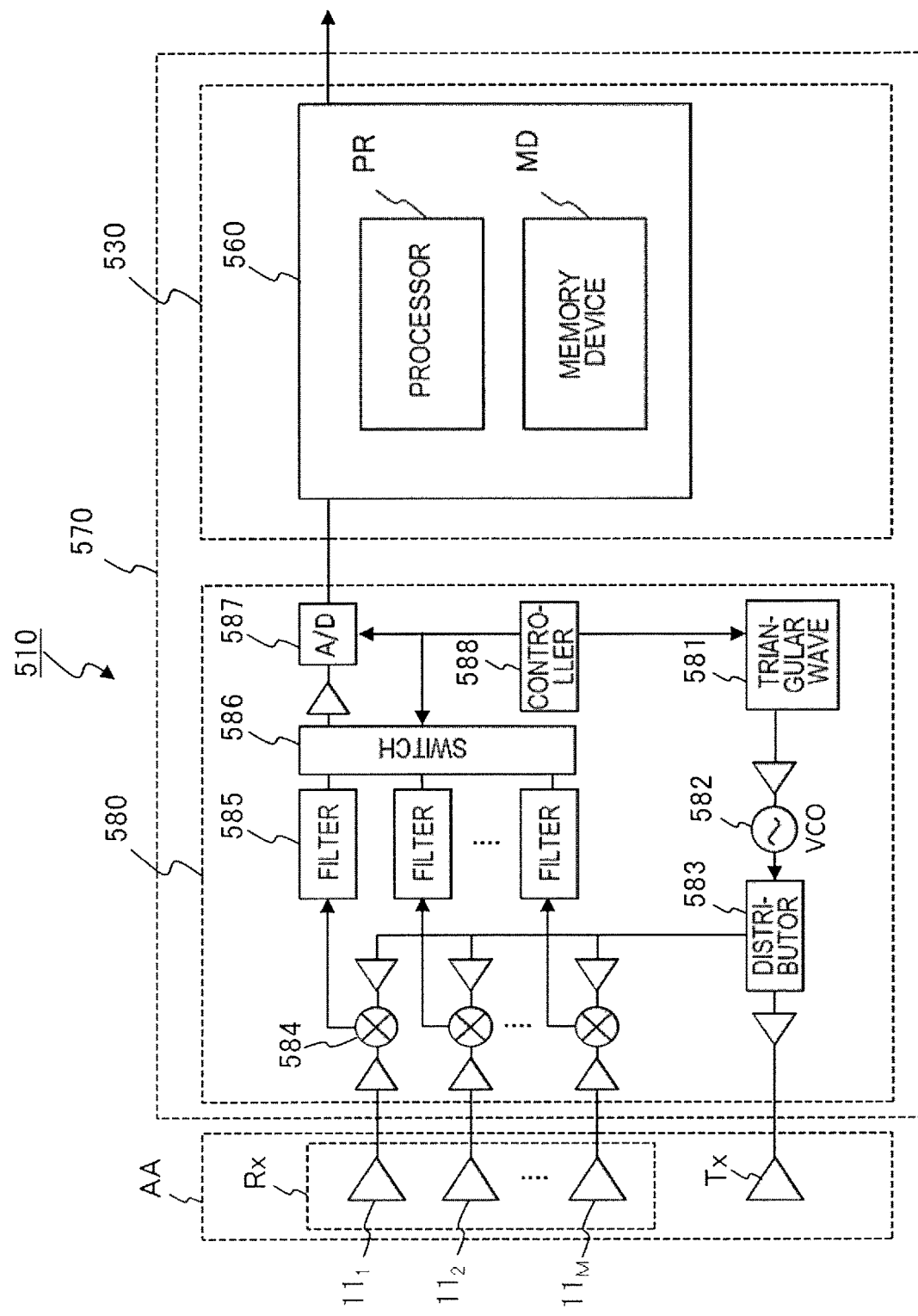
FIG. 29 is a diagram showing an exemplary implementation in which a signal processing circuit 560 is implemented in hardware including a processor PR and a memory device MD.

FIG. 29 shows an exemplary implementation in which the signal processing circuit 560 is implemented in hardware including a processor PR and a memory device MD. In the signal processing circuit 560 with this construction, too, a computer program that is stored in the memory device MD may fulfill the functions of the reception intensity calculation section 532, the DBF processing section 535, the distance detection section 533, the velocity detection section 534, the azimuth detection section 536, the target link processing section 537, the matrix generation section 538, and the arriving wave estimation unit AU shown in FIG. 26.

The signal processing circuit 560 in this Application Example is configured to estimate the position information of a preceding vehicle by using each beat signal converted into a digital signal as a secondary signal of the reception signal, and output a signal indicating the estimation result. Hereinafter, the construction and operation of the signal processing circuit 560 in this Application Example will be described in detail.

For each of the channels $Ch_1$ to $Ch_M$, the memory 531 in the signal processing circuit 560 stores a digital signal which is output from the A/D converter 587. The memory 531 may be composed of a generic storage medium such as a semiconductor memory or a hard disk and/or an optical disk.

The reception intensity calculation section 532 applies Fourier transform to the respective beat signals for the channels $Ch_1$ to $Ch_M$ (shown in the lower graph of FIG. 27) that are stored in the memory 531. In the present specification, the amplitude of a piece of complex number data after the Fourier transform is referred to as "signal intensity". The reception intensity calculation section 532 converts the complex number data of a reception signal from one of the plurality of antenna elements, or a sum of the complex number data of all reception signals from the plurality of antenna elements, into a frequency spectrum. In the resultant spectrum, beat frequencies corresponding to respective peak values, which are indicative of presence and distance of targets (preceding vehicles), can be detected. Taking a sum of the complex number data of the reception signals from all antenna elements will allow the noise components to average out, whereby the S/N ratio is improved.

In the case where there is one target, i.e., one preceding vehicle, as shown in FIG. 28, the Fourier transform will produce a spectrum having one peak value in a period of increasing frequency (the "ascent" period) and one peak value in a period of decreasing frequency ("the descent" period). The beat frequency of the peak value in the "ascent" period is denoted by "fu", whereas the beat frequency of the peak value in the "descent" period is denoted by "fd".

From the signal intensities of beat frequencies, the reception intensity calculation section 532 detects any signal intensity that exceeds a predefined value (threshold value), thus determining the presence of a target. Upon detecting a signal intensity peak, the reception intensity calculation section 532 outputs the beat frequencies (fu, fd) of the peak values to the distance detection section 533 and the velocity detection section 534 as the frequencies of the object of interest. The reception intensity calculation section 532 outputs information indicating the frequency modulation width $\Delta f$ to the distance detection section 533, and outputs information indicating the center frequency f0 to the velocity detection section 534.

In the case where signal intensity peaks corresponding to plural targets are detected, the reception intensity calculation section 532 find associations between the ascents peak values and the descent peak values based on predefined conditions. Peaks which are determined as belonging to signals from the same target are given the same number, and thus are fed to the distance detection section 533 and the velocity detection section 534.

When there are plural targets, after the Fourier transform, as many peaks as there are targets will appear in the ascent portions and the descent portions of the beat signal. In proportion to the distance between the radar and a target, the reception signal will become more delayed and the reception signal in FIG. 27 will shift more toward the right. Therefore, a beat signal will have a greater frequency as the distant between the target and the radar increases.

Based on the beat frequencies fu and fd which are input from the reception intensity calculation section 532, the distance detection section 533 calculates a distance R through the equation below, and supplies it to the target link processing section 537.

$$R=\{C\cdot T/(2\cdot\Delta f)\}\cdot\{(fu+fd)/2\}$$

Moreover, based on the beat frequencies fu and fd being input from the reception intensity calculation section 532, the velocity detection section 534 calculates a relative velocity V through the equation below, and supplies it to the target link processing section 537.

$$V=\{C/(2 \cdot f0)\} \cdot \{(fu-fd)/2\}$$

In the equation which calculates the distance R and the relative velocity V, C is velocity of light, and T is the modulation period.

Note that the lower limit resolution of distance R is expressed as $C/(2\Delta f)$. Therefore, as $\Delta f$ increases, the resolution of distance R increases. In the case where the frequency f0 is in the 76 GHz band, when $\Delta f$ is set on the order of 660 megahertz (MHz), the resolution of distance R will be on the order of 0.23 meters (m), for example. Therefore, if two preceding vehicles are traveling abreast of each other, it may be difficult with the FMCW method to identify whether there is one vehicle or two vehicles. In such a case, it might be possible to run an algorithm for direction-of-arrival estimation that has an extremely high angular resolution to separate between the azimuths of the two preceding vehicles and enable detection.

By utilizing phase differences between signals from the antenna elements $11_1, 11_2, \ldots, 11_M$, the DBF processing section 535 allows the incoming complex data corresponding to the respective antenna elements, which has been Fourier transformed with respect to the time axis, to be Fourier transformed with respect to the direction in which the antenna elements are arrayed. Then, the DBF processing section 535 calculates spatial complex number data indicating the spectrum intensity for each angular channel as determined by the angular resolution, and outputs it to the azimuth detection section 536 for the respective beat frequencies.

The azimuth detection section 536 is provided for the purpose of estimating the azimuth of a preceding vehicle. Among the values of spatial complex number data that has been calculated for the respective beat frequencies, the azimuth detection section 536 chooses an angle θ that takes the largest value, and outputs it to the target link processing section 537 as the azimuth at which an object of interest exists.

Note that the method of estimating the angle θ indicating the direction of arrival of an arriving wave is not limited to this example. Various algorithms for direction-of-arrival estimation that have been mentioned earlier can be employed.

The target link processing section 537 calculates absolute values of the differences between the respective values of distance, relative velocity, and azimuth of the object of interest as calculated in the current cycle and the respective values of distance, relative velocity, and azimuth of the object of interest as calculated 1 cycle before, which are read from the memory 531. Then, if the absolute value of each difference is smaller than a value which is defined for the respective value, the target link processing section 537 determines that the target that was detected 1 cycle before and the target detected in the current cycle are an identical target. In that case, the target link processing section 537 increments the count of target link processes, which is read from the memory 531, by one.

If the absolute value of a difference is greater than predetermined, the target link processing section 537 determines that a new object of interest has been detected. The target link processing section 537 stores the respective values of distance, relative velocity, and azimuth of the object of interest as calculated in the current cycle and also the count of target link processes for that object of interest to the memory 531.

In the signal processing circuit 560, the distance to the object of interest and its relative velocity can be detected by using a spectrum which is obtained through a frequency analysis of beat signals, which are signals generated based on received reflected waves.

The matrix generation section 538 generates a spatial covariance matrix by using the respective beat signals for the channels $Ch_1$ to $Ch_M$ (lower graph in FIG. 27) stored in the memory 531. In the spatial covariance matrix of Math. 4, each component is the value of a beat signal which is expressed in terms of real and imaginary parts. The matrix generation section 538 further determines eigenvalues of the spatial covariance matrix Rxx, and inputs the resultant eigenvalue information to the arriving wave estimation unit AU.

When a plurality of signal intensity peaks corresponding to plural objects of interest have been detected, the reception intensity calculation section 532 numbers the peak values respectively in the ascent portion and in the descent portion, beginning from those with smaller frequencies first, and output them to the target output processing section 539. In the ascent and descent portions, peaks of any identical number correspond to the same object of interest. The identification numbers are to be regarded as the numbers assigned to the objects of interest. For simplicity of illustration, a leader line from the reception intensity calculation section 532 to the target output processing section 539 is conveniently omitted from FIG. 26.

When the object of interest is a structure ahead, the target output processing section 539 outputs the identification number of that object of interest as indicating a target. When receiving results of determination concerning plural objects of interest, such that all of them are structures ahead, the target output processing section 539 outputs the identification number of an object of interest that is in the lane of the driver's vehicle as the object position information indicating where a target is. Moreover, When receiving results of determination concerning plural objects of interest, such that all of them are structures ahead and that two or more objects of interest are in the lane of the driver's vehicle, the target output processing section 539 outputs the identification number of an object of interest that is associated with the largest count of target being read from the link processes memory 531 as the object position information indicating where a target is.

Referring back to FIG. 25, an example where the onboard radar system 510 is incorporated in the exemplary construction shown in FIG. 25 will be described. The image processing circuit 720 acquires information of an object from the video, and detects target position information from the object information. For example, the image processing circuit 720 is configured to estimate distance information of an object by detecting the depth value of an object within an acquired video, or detect size information and the like of an object from characteristic amounts in the video, thus detecting position information of the object.

The selection circuit 596 selectively feeds position information which is received from the signal processing circuit 560 or the image processing circuit 720 to the travel assistance electronic control apparatus 520. For example, the selection circuit 596 compares a first distance, i.e., the distance from the driver's vehicle to a detected object as contained in the object position information from the signal processing circuit 560, against a second distance, i.e., the distance from the driver's vehicle to the detected object as contained in the object position information from the image processing circuit 720, and determines which is closer to the driver's vehicle. For example, based on the result of determination, the selection circuit 596 may select the object position information which indicates a closer distance to the driver's vehicle, and output it to the travel assistance electronic control apparatus 520. If the result of determination indicates the first distance and the second distance to be of the same value, the selection circuit 596 may output either one, or both of them, to the travel assistance electronic control apparatus 520.

If information indicating that there is no prospective target is input from the reception intensity calculation section 532, the target output processing section 539 (FIG. 26) outputs zero, indicating that there is no target, as the object position information. Then, on the basis of the object position information from the target output processing section 539, through comparison against a predefined threshold value, the selection circuit 596 chooses either the object position information from the signal processing circuit 560 or the object position information from the image processing circuit 720 to be used.

Based on predefined conditions, the travel assistance electronic control apparatus 520 having received the position information of a preceding object from the object detection apparatus 570 performs control to make the operation safer or easier for the driver who is driving the driver's vehicle, in accordance with the distance and size indicated by the object position information, the velocity of the driver's vehicle, road surface conditions such as rainfall, snowfall or clear weather, or other conditions. For example, if the object position information indicates that no object has been detected, the travel assistance electronic control apparatus 520 may send a control signal to an accelerator control circuit 526 to increase speed up to a predefined velocity, thereby controlling the accelerator control circuit 526 to make an operation that is equivalent to stepping on the accelerator pedal.

In the case where the object position information indicates that an object has been detected, if it is found to be at a predetermined distance from the driver's vehicle, the travel assistance electronic control apparatus 520 controls the brakes via a brake control circuit 524 through a brake-by-wire construction or the like. In other words, it makes an operation of decreasing the velocity to maintain a constant vehicular gap. Upon receiving the object position information, the travel assistance electronic control apparatus 520 sends a control signal to an alarm control circuit 522 so as to control lamp illumination or control audio through a loudspeaker which is provided within the vehicle, so that the driver is informed of the nearing of a preceding object. Upon receiving object position information including a spatial distribution of preceding vehicles, the travel assistance electronic control apparatus 520 may, if the traveling velocity is within a predefined range, automatically make the steering wheel easier to operate to the right or left, or control the hydraulic pressure on the steering wheel side so as to force a change in the direction of the wheels, thereby providing assistance in collision avoidance with respect to the preceding object.

The object detection apparatus 570 may be arranged so that, if a piece of object position information which was being continuously detected by the selection circuit 596 for a while in the previous detection cycle but which is not detected in the current detection cycle becomes associated with a piece of object position information from a camera-detected video indicating a preceding object, then continued tracking is chosen, and object position information from the signal processing circuit 560 is output with priority.

An exemplary specific construction and an exemplary operation for the selection circuit 596 to make a selection between the outputs from the signal processing circuit 560 and the image processing circuit 720 are disclosed in the specification of U.S. Pat. No. 8,446,312, the specification of U.S. Pat. No. 8,730,096, and the specification of U.S. Pat. No. 8,730,099. The entire disclosure thereof is incorporated herein by reference.

[First Variant]

In the radar system for onboard use of the above Application Example, the (sweep) condition for a single instance of FMCW (Frequency Modulated Continuous Wave) frequency modulation, i.e., a time span required for such a modulation (sweep time), is e.g. 1 millisecond, although the sweep time could be shortened to about 100 microseconds.

However, in order to realize such a rapid sweep condition, not only the constituent elements involved in the radiation of a transmission wave, but also the constituent elements involved in the reception under that sweep condition must also be able to rapidly operate. For example, an A/D converter 587 (FIG. 26) which rapidly operates under that sweep condition will be needed. The sampling frequency of the A/D converter 587 may be 10 MHz, for example. The sampling frequency may be faster than 10 MHz.

In the present variant, a relative velocity with respect to a target is calculated without utilizing any Doppler shift-based frequency component. In this variant, the sweep time is Tm=100 microseconds, which is very short. The lowest frequency of a detectable beat signal, which is 1/Tm, equals 10 kHz in this case. This would correspond to a Doppler shift of a reflected wave from a target which has a relative velocity of approximately 20 m/second. In other words, so long as one relies on a Doppler shift, it would be impossible to detect relative velocities that are equal to or smaller than this. Thus, a method of calculation which is different from a Doppler shift-based method of calculation is preferably adopted.

As an example, this variant illustrates a process that utilizes a signal (upbeat signal) representing a difference between a transmission wave and a reception wave which is obtained in an upbeat (ascent) portion where the transmission wave increases in frequency. A single sweep time of FMCW is 100 microseconds, and its waveform is a sawtooth shape which is composed only of an upbeat portion. In other words, in this variant, the signal wave which is generated by the triangular wave/CW wave generation circuit 581 has a sawtooth shape. The sweep width in frequency is 500 MHz. Since no peaks are to be utilized that are associated with Doppler shifts, the process is not one that generates an upbeat signal and a downbeat signal to utilize the peaks of both, but will rely on only one of such signals. Although a case of utilizing an upbeat signal will be illustrated herein, a similar process can also be performed by using a downbeat signal.

The A/D converter 587 (FIG. 26) samples each upbeat signal at a sampling frequency of 10 MHz, and outputs several hundred pieces of digital data (hereinafter referred to as "sampling data"). The sampling data is generated based on upbeat signals after a point in time where a reception wave is obtained and until a point in time at which a transmission wave completes transmission, for example. Note that the process may be ended as soon as a certain number of pieces of sampling data are obtained.

In this variant, 128 upbeat signals are transmitted/received in series, for each of which some several hundred pieces of sampling data are obtained. The number of upbeat signals is not limited to 128. It may be 256, or 8. An arbitrary number may be selected depending on the purpose.

The resultant sampling data is stored to the memory 531. The reception intensity calculation section 532 applies a two-dimensional fast Fourier transform (FFT) to the sampling data. Specifically, first, for each of the sampling data pieces that have been obtained through a single sweep, a first FFT process (frequency analysis process) is performed to generate a power spectrum. Next, the velocity detection section 534 performs a second FFT process for the processing results that have been collected from all sweeps.

When the reflected waves are from the same target, peak components in the power spectrum to be detected in each sweep period will be of the same frequency. On the other hand, for different targets, the peak components will differ in frequency. Through the first FFT process, plural targets that are located at different distances can be separated.

In the case where a relative velocity with respect to a target is non-zero, the phase of the upbeat signal changes slightly from sweep to sweep. In other words, through the second FFT process, a power spectrum whose elements are the data of frequency components that are associated with such phase changes will be obtained for the respective results of the first FFT process.

The reception intensity calculation section 532 extracts peak values in the second power spectrum above, and sends them to the velocity detection section 534.

The velocity detection section 534 determines a relative velocity from the phase changes. For example, suppose that a series of obtained upbeat signals undergo phase changes by every phase θ [RXd]. Assuming that the transmission wave has an average wavelength λ, this means there is a $\lambda/(4\pi/\theta)$ change in distance every time an upbeat signal is obtained. Since this change has occurred over an interval of upbeat signal transmission Tm (=100 microseconds), the relative velocity is determined to be $\{\lambda/(4\pi/\theta)\}/Tm$.

Through the above processes, a relative velocity with respect to a target as well as a distance from the target can be obtained.

[Second Variant]

The radar system 510 is able to detect a target by using a continuous wave(s) CW of one or plural frequencies. This method is especially useful in an environment where a multitude of reflected waves impinge on the radar system 510 from still objects in the surroundings, e.g., when the vehicle is in a tunnel.

The radar system 510 has an antenna array for reception purposes, including five channels of independent reception elements. In such a radar system, the azimuth-of-arrival estimation for incident reflected waves is only possible if there are four or fewer reflected waves that are simultaneously incident. In an FMCW-type radar, the number of reflected waves to be simultaneously subjected to an azimuth-of-arrival estimation can be reduced by exclusively selecting reflected waves from a specific distance. However, in an environment where a large number of still objects exist in the surroundings, e.g., in a tunnel, it is as if there were a continuum of objects to reflect radio waves; therefore, even if one narrows down on the reflected waves based on distance, the number of reflected waves may still not be equal to or smaller than four. However, any such still object in the surroundings will have an identical relative velocity with respect to the driver's vehicle, and the relative velocity will be greater than that associated with any other vehicle that is traveling ahead. On this basis, such still objects can be distinguished from any other vehicle based on the magnitudes of Doppler shifts.

Therefore, the radar system 510 performs a process of: radiating continuous waves CW of plural frequencies; and, while ignoring Doppler shift peaks that correspond to still objects in the reception signals, detecting a distance by using a Doppler shift peak(s) of any smaller shift amount(s). Unlike in the FMCW method, in the CW method, a frequency difference between a transmission wave and a reception wave is ascribable only to a Doppler shift. In other words, any peak frequency that appears in a beat signal is ascribable only to a Doppler shift.

In the description of this variant, too, a continuous wave to be used in the CW method will be referred to as a "continuous wave CW". As described above, a continuous wave CW has a constant frequency; that is, it is unmodulated.

Suppose that the radar system 510 has radiated a continuous wave CW of a frequency fp, and detected a reflected wave of a frequency fq that has been reflected off a target. The difference between the transmission frequency fp and the reception frequency fq is called a Doppler frequency, which approximates to fp−fq=2·Vr·fp/c. Herein, Vr is a relative velocity between the radar system and the target, and c is the velocity of light. The transmission frequency fp, the Doppler frequency (fp−fq), and the velocity of light c are known. Therefore, from this equation, the relative velocity Vr=(fp−fq)·c/2fp can be determined. The distance to the target is calculated by utilizing phase information as will be described later.

In order to detect a distance to a target by using continuous waves CW, a 2 frequency CW method is adopted. In the 2 frequency CW method, continuous waves CW of two frequencies which are slightly apart are radiated each for a certain period, and their respective reflected waves are acquired. For example, in the case of using frequencies in the 76 GHz band, the difference between the two frequencies would be several hundred kHz. As will be described later, it is more preferable to determine the difference between the two frequencies while taking into account the minimum distance at which the radar used is able to detect a target.

Suppose that the radar system 510 has sequentially radiated continuous waves CW of frequencies fp1 and fp2 (fp1<fp2), and that the two continuous waves CW have been reflected off a single target, resulting in reflected waves of frequencies fq1 and fq2 being received by the radar system 510.

Based on the continuous wave CW of the frequency fp1 and the reflected wave (frequency fq1) thereof, a first Doppler frequency is obtained. Based on the continuous wave CW of the frequency fp2 and the reflected wave (frequency fq2) thereof, a second Doppler frequency is obtained. The two Doppler frequencies have substantially the same value. However, due to the difference between the frequencies fp1 and fp2, the complex signals of the respective reception waves differ in phase. By utilizing this phase information, a distance (range) to the target can be calculated.

Specifically, the radar system 510 is able to determine the distance R as R=c·Δφ/4π(fp2−fp1). Herein, Δφ denotes the phase difference between two beat signals, i.e., beat signal 1 which is obtained as a difference between the continuous wave CW of the frequency fp1 and the reflected wave (frequency fq1) thereof and beat signal 2 which is obtained as a difference between the continuous wave CW of the frequency fp2 and the reflected wave (frequency fq2)

thereof. The method of identifying the frequency fb1 of beat signal 1 and the frequency fb2 of beat signal 2 is identical to that in the aforementioned instance of a beat signal from a continuous wave CW of a single frequency.

Note that a relative velocity Vr under the 2 frequency CW method is determined as follows.

$$Vr=fb1 \cdot c/2 \cdot fp1 \text{ or } Vr=fb2 \cdot c/2 \cdot fp2$$

Moreover, the range in which a distance to a target can be uniquely identified is limited to the range defined by Rmax<c/2(fp2−fp1). The reason is that beat signals resulting from a reflected wave from any farther target would produce a Δφ which is greater than 2π, such that they are indistinguishable from beat signals associated with targets at closer positions. Therefore, it is more preferable to adjust the difference between the frequencies of the two continuous waves CW so that Rmax becomes greater than the minimum detectable distance of the radar. In the case of a radar whose minimum detectable distance is 100 m, fp2−fp1 may be made e.g. 1.0 MHz. In this case, Rmax=150 m, so that a signal from any target from a position beyond Rmax is not detected. In the case of mounting a radar which is capable of detection up to 250 m, fp2−fp1 may be made e.g. 500 kHz. In this case, Rmax=300 m, so that a signal from any target from a position beyond Rmax is not detected, either. In the case where the radar has both of an operation mode in which the minimum detectable distance is 100 m and the horizontal viewing angle is 120 degrees and an operation mode in which the minimum detectable distance is 250 m and the horizontal viewing angle is 5 degrees, it is preferable to switch the fp2−fp1 value be 1.0 MHz and 500 kHz for operation in the respective operation modes.

A detection approach is known which, by transmitting continuous waves CW at N different frequencies (where N is an integer of 3 or more), and utilizing phase information of the respective reflected waves, detects a distance to each target. Under this detection approach, distance can be properly recognized up to N−1 targets. As the processing to enable this, a fast Fourier transform (FFT) is used, for example. Given N=64 or 128, an FFT is performed for sampling data of a beat signal as a difference between a transmission signal and a reception signal for each frequency, thus obtaining a frequency spectrum (relative velocity). Thereafter, at the frequency of the CW wave, a further FFT is performed for peaks of the same frequency, thus to derive distance information.

Hereinafter, this will be described more specifically.

Figure 30:
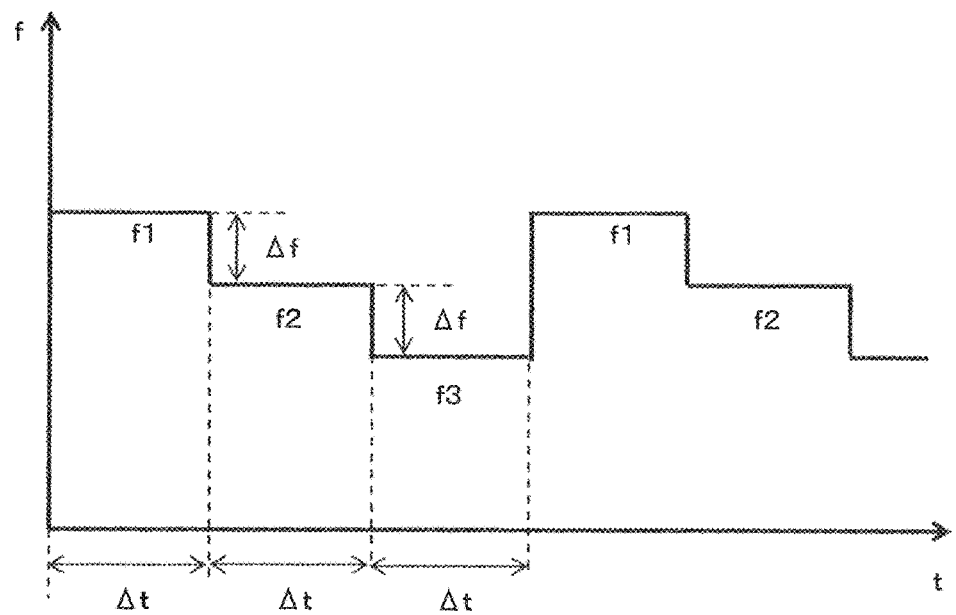
FIG. 30 is a diagram showing a relationship between three frequencies f1, f2 and f3.

For ease of explanation, first, an instance will be described where signals of three frequencies f1, f2 and f3 are transmitted while being switched over time. It is assumed that f1>f2>f3, and f1−f2=f2−f3=Δf. A transmission time Δt is assumed for the signal wave for each frequency. FIG. 30 shows a relationship between three frequencies f1, f2 and f3.

Via the transmission antenna Tx, the triangular wave/CW wave generation circuit 581 (FIG. 26) transmits continuous waves CW of frequencies f1, f2 and f3, each lasting for the time Δt. The reception antennas Rx receive reflected waves resulting by the respective continuous waves CW being reflected off one or plural targets.

Each mixer 584 mixes a transmission wave and a reception wave to generate a beat signal. The A/D converter 587 converts the beat signal, which is an analog signal, into several hundred pieces of digital data (sampling data), for example.

Using the sampling data, the reception intensity calculation section 532 performs FFT computation. Through the FFT computation, frequency spectrum information of reception signals is obtained for the respective transmission frequencies f1, f2 and f3.

Thereafter, the reception intensity calculation section 532 separates peak values from the frequency spectrum information of the reception signals. The frequency of any peak value which is predetermined or greater is in proportion to a relative velocity with respect to a target. Separating a peak value(s) from the frequency spectrum information of reception signals is synonymous with separating one or plural targets with different relative velocities.

Next, with respect to each of the transmission frequencies f1 to f3, the reception intensity calculation section 532 measures spectrum information of peak values of the same relative velocity or relative velocities within a predefined range.

Now, consider a scenario where two targets A and B exist which have about the same relative velocity but are at respectively different distances. A transmission signal of the frequency f1 will be reflected from both of targets A and B to result in reception signals being obtained. The reflected waves from targets A and B will result in substantially the same beat signal frequency. Therefore, the power spectra at the Doppler frequencies of the reception signals, corresponding to their relative velocities, are obtained as a synthetic spectrum F1 into which the power spectra of two targets A and B have been merged.

Similarly, for each of the frequencies f2 and f3, the power spectra at the Doppler frequencies of the reception signals, corresponding to their relative velocities, are obtained as a synthetic spectrum F1 into which the power spectra of two targets A and B have been merged.

Figure 31:
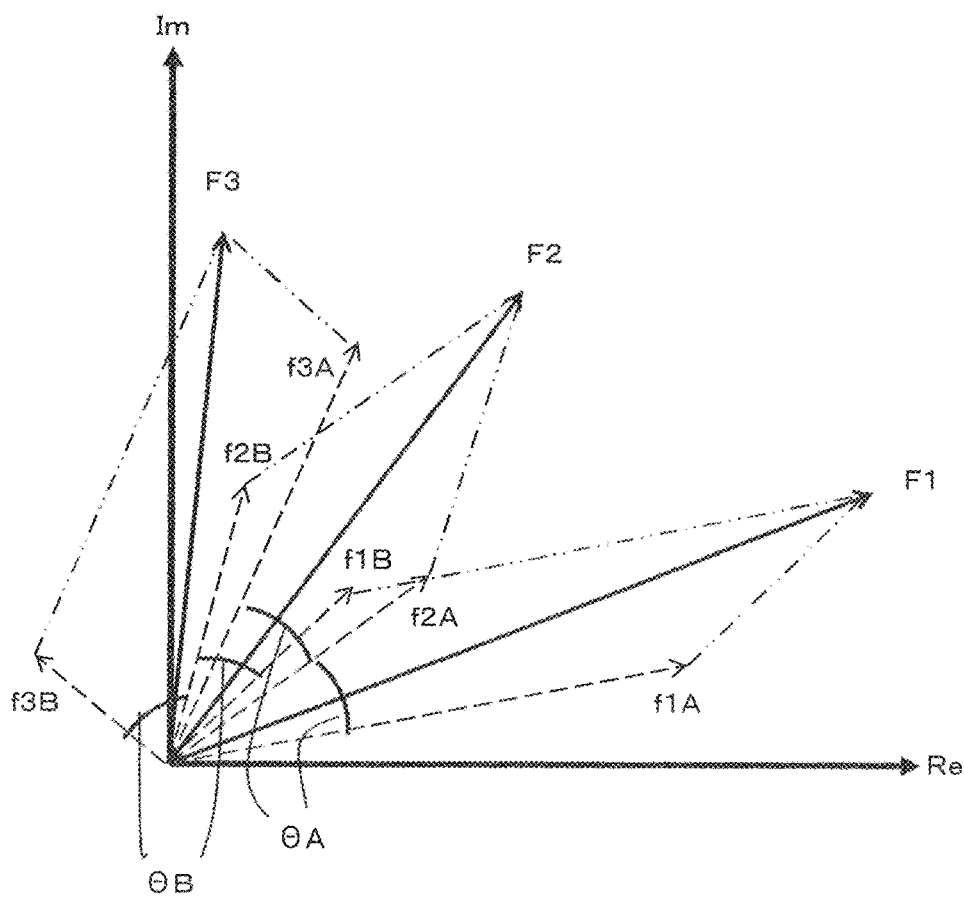
FIG. 31 is a diagram showing a relationship between synthetic spectra F1 to F3 on a complex plane.

FIG. 31 shows a relationship between synthetic spectra F1 to F3 on a complex plane. In the directions of the two vectors composing each of the synthetic spectra F1 to F3, the right vector corresponds to the power spectrum of a reflected wave from target A; i.e., vectors f1A, f2A and f3A, in FIG. 31. On the other hand, in the directions of the two vectors composing each of the synthetic spectra F1 to F3, the left vector corresponds to the power spectrum of a reflected wave from target B; i.e., vectors f1B, f2B and f3B in FIG. 31.

Under a constant difference Δf between the transmission frequencies, the phase difference between the reception signals corresponding to the respective transmission signals of the frequencies f1 and f2 is in proportion to the distance to a target. Therefore, the phase difference between the vectors f1A and f2A and the phase difference between the vectors f2A and f3A are of the same value θA, this phase difference θA being in proportion to the distance to target A. Similarly, the phase difference between the vectors f1B and f2B and the phase difference between the vectors f2B and f3B are of the same value θB, this phase difference θB being in proportion to the distance to target B.

By using a well-known method, the respective distances to targets A and B can be determined from the synthetic spectra F1 to F3 and the difference Δf between the transmission frequencies. This technique is disclosed in U.S. Pat. No. 6,703,967, for example. The entire disclosure of this publication is incorporated herein by reference.

Similar processing is also applicable when the transmitted signals have four or more frequencies.

Note that, before transmitting continuous wave CWs at N different frequencies, a process of determining the distance to and relative velocity of each target may be performed by the 2 frequency CW method. Then, under predetermined conditions, this process may be switched to a process of transmitting continuous waves CW at N different frequencies. For example, FFT computation may be performed by using the respective beat signals at the two frequencies, and if the power spectrum of each transmission frequency undergoes a change over time of 30% or more, the process may be switched. The amplitude of a reflected wave from each target undergoes a large change over time due to multipath influences and the like. When there exists a change of a predetermined magnitude or greater, it may be considered that plural targets may exist.

Moreover, the CW method is known to be unable to detect a target when the relative velocity between the radar system and the target is zero, i.e., when the Doppler frequency is zero. However, when a pseudo Doppler signal is determined by the following methods, for example, it is possible to detect a target by using that frequency.

(Method 1) A mixer that causes a certain frequency shift in the output of a receiving antenna is added. By using a transmission signal and a reception signal with a shifted frequency, a pseudo Doppler signal can be obtained.

(Method 2) A variable phase shifter to introduce phase changes continuously over time is inserted between the output of a receiving antenna and a mixer, thus adding a pseudo phase difference to the reception signal. By using a transmission signal and a reception signal with an added phase difference, a pseudo Doppler signal can be obtained.

An example of specific construction and operation of inserting a variable phase shifter to generate a pseudo Doppler signal under Method 2 is disclosed in Japanese Laid-Open Patent Publication No. 2004-257848. The entire disclosure of this publication is incorporated herein by reference.

When targets with zero or very little relative velocity need to be detected, the aforementioned processes of generating a pseudo Doppler signal may be adopted, or the process may be switched to a target detection process under the FMCW method.

Next, with reference to FIG. 32, a procedure of processing to be performed by the object detection apparatus 570 of the onboard radar system 510 will be described.

The example below will illustrate a case where continuous waves CW are transmitted at two different frequencies fp1 and fp2 (fp1<fp2), and the phase information of each reflected wave is utilized to respectively detect a distance with respect to a target.

Figure 32:
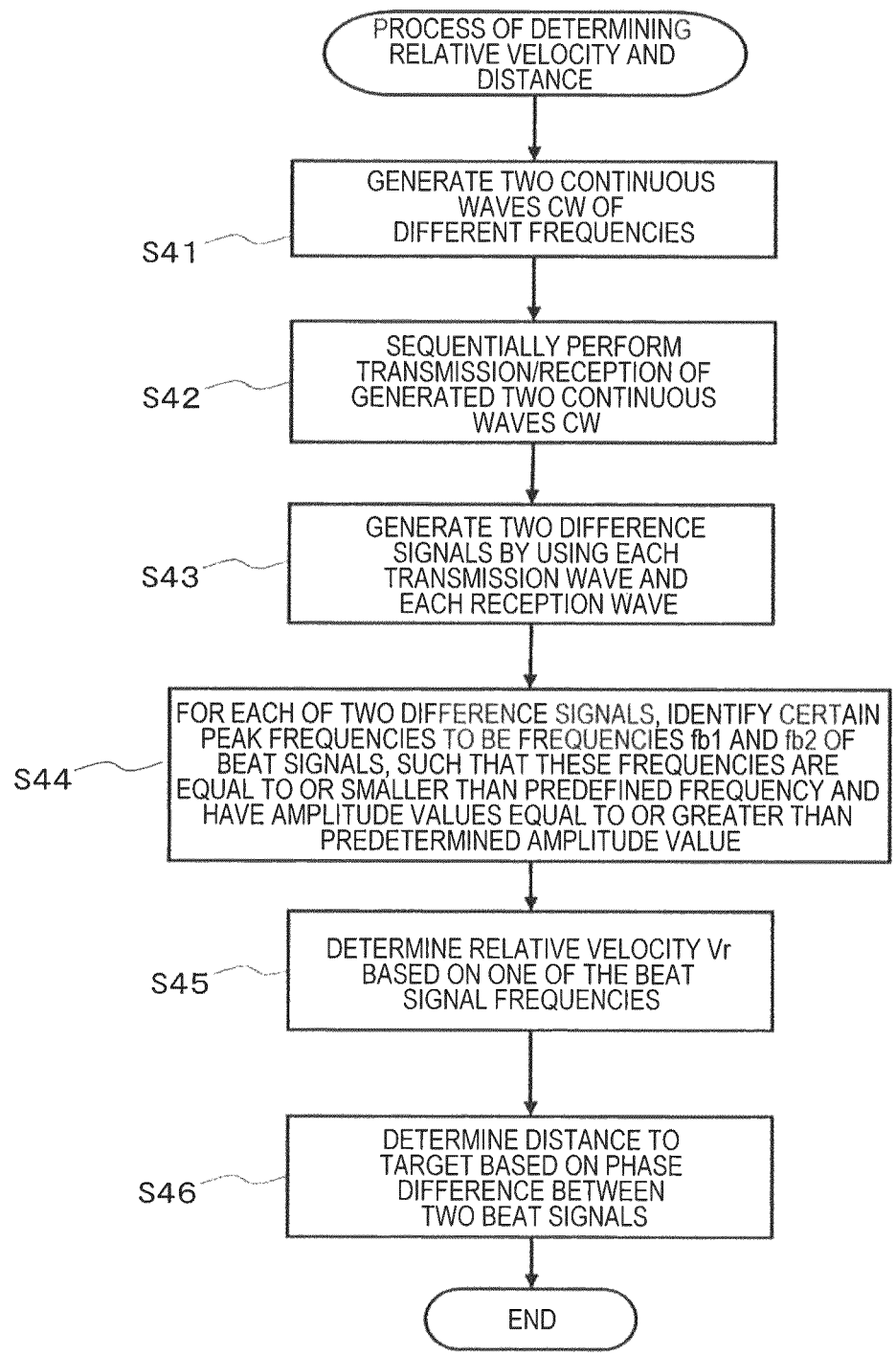
FIG. 32 is a flowchart showing the procedure of a process of determining relative velocity and distance according to a variant of the present disclosure.

FIG. 32 is a flowchart showing the procedure of a process of determining relative velocity and distance according to this variant.

At step S41, the triangular wave/CW wave generation circuit 581 generates two continuous waves CW of frequencies which are slightly apart, i.e., frequencies fp1 and fp2.

At step S42, the transmission antenna Tx and the reception antennas Rx perform transmission/reception of the generated series of continuous waves CW. Note that the process of step S41 and the process of step S42 are to be performed in parallel fashion by the triangular wave/CW wave generation circuit 581 and the transmission antenna Tx/reception antenna Rx, rather than step S42 following only after completion of step S41.

At step S43, each mixer 584 generates a difference signal by utilizing each transmission wave and each reception wave, whereby two difference signals are obtained. Each reception wave is inclusive of a reception wave emanating from a still object and a reception wave emanating from a target. Therefore, next, a process of identifying frequencies to be utilized as the beat signals is performed. Note that the process of step S41, the process of step S42, and the process of step 43 are to be performed in parallel fashion by the triangular wave/CW wave generation circuit 581, the transmission antenna Tx/reception antenna Rx, and the mixers 584, rather than step S42 following only after completion of step S41, or step S43 following only after completion of step S42.

At step S44, for each of the two difference signals, the object detection apparatus 570 identifies certain peak frequencies to be frequencies fb1 and fb2 of beat signals, such that these frequencies are equal to or smaller than a frequency which is predefined as a threshold value and yet they have amplitude values which are equal to or greater than a predetermined amplitude value, and that the difference between the two frequencies is equal to or smaller than a predetermined value.

At step S45, based on one of the two beat signal frequencies identified, the reception intensity calculation section 532 detects a relative velocity. The reception intensity calculation section 532 calculates the relative velocity according to Vr=fb1·c/2·fp1, for example. Note that a relative velocity may be calculated by utilizing each of the two beat signal frequencies, which will allow the reception intensity calculation section 532 to verify whether they match or not, thus enhancing the precision of relative velocity calculation.

At step S46, the reception intensity calculation section 532 determines a phase difference $\Delta\varphi$ between the two beat signals 1 and 2, and determines a distance $R=c\cdot\Delta\varphi/4\pi(fp2-fp1)$ to the target.

Through the above processes, the relative velocity and distance to a target can be detected.

Note that continuous waves CW may be transmitted at N different frequencies (where N is 3 or more), and by utilizing phase information of the respective reflected wave, distances to plural targets which are of the same relative velocity but at different positions may be detected.

In addition to the radar system 510, the vehicle 500 described above may further include another radar system. For example, the vehicle 500 may further include a radar system having a detection range toward the rear or the sides of the vehicle body. In the case of incorporating a radar system having a detection range toward the rear of the vehicle body, the radar system may monitor the rear, and if there is any danger of having another vehicle bump into the rear, make a response by issuing an alarm, for example. In the case of incorporating a radar system having a detection range toward the sides of the vehicle body, the radar system may monitor an adjacent lane when the driver's vehicle changes its lane, etc., and make a response by issuing an alarm or the like as necessary.

The applications of the above-described radar system 510 are not limited to onboard use only. Rather, the radar system 510 may be used as sensors for various purposes. For example, it may be used as a radar for monitoring the surroundings of a house or any other building. Alternatively, it may be used as a sensor for detecting the presence or absence of a person at a specific indoor place, or whether or not such a person is undergoing any motion, etc., without utilizing any optical images.

[Supplementary Details of Processing]

Other embodiments will be described in connection with the 2 frequency CW or FMCW techniques for array antennas as described above. As described earlier, in the example of FIG. 26, the reception intensity calculation section 532 applies a Fourier transform to the respective beat signals for the channels $Ch_1$ to $Ch_M$ (lower graph in FIG. 27) stored in the memory 531. These beat signals are complex signals, in order that the phase of the signal of computational interest be identified. This allows the direction of an arriving wave to be accurately identified. In this case, however, the computational load for Fourier transform increases, thus calling for a larger-scaled circuit.

In order to solve this problem, a scalar signal may be generated as a beat signal. For each of a plurality of beat signals that have been generated, two complex Fourier transforms may be performed with respect to the spatial axis direction, which conforms to the antenna array, and to the time axis direction, which conforms to the lapse of time, thus to obtain results of frequency analysis. As a result, with only a small amount of computation, beam formation can eventually be achieved so that directions of arrival of reflected waves can be identified, whereby results of frequency analysis can be obtained for the respective beams. As a patent document related to the present disclosure, the entire disclosure of the specification of U.S. Pat. No. 6,339,395 is incorporated herein by reference.

[Optical Sensor, e.g., Camera, and Millimeter Wave Radar]

Next, a comparison between the above-described array antenna and conventional antennas, as well as an exemplary application in which both of the present array antenna and an optical sensor (e.g., a camera) are utilized, will be described. Note that LIDAR or the like may be employed as the optical sensor.

A millimeter wave radar is able to directly detect a distance (range) to a target and a relative velocity thereof. Another characteristic is that its detection performance is not much deteriorated in the nighttime (including dusk), or in bad weather, e.g., rainfall, fog, or snowfall. On the other hand, it is believed that it is not just as easy for a millimeter wave radar to take a two-dimensional grasp of a target as it is for a camera. On the other hand, it is relatively easy for a camera to take a two-dimensional grasp of a target and recognize its shape. However, a camera may not be able to image a target in nighttime or bad weather, which presents a considerable problem. This problem is particularly outstanding when droplets of water have adhered to the portion through which to ensure lighting, or the eyesight is narrowed by a fog. This problem similarly exists for LIDAR or the like, which also pertains to the realm of optical sensors.

In these years, in answer to increasing demand for safer vehicle operation, driver assist systems for preventing collisions or the like are being developed. A driver assist system acquires an image in the direction of vehicle travel with a sensor such as a camera or a millimeter wave radar, and when any obstacle is recognized that is predicted to hinder vehicle travel, brakes or the like are automatically applied to prevent collisions or the like. Such a function of collision avoidance is expected to operate normally, even in nighttime or bad weather.

Hence, driver assist systems of a so-called fusion construction are gaining prevalence, where, in addition to a conventional optical sensor such as a camera, a millimeter wave radar is mounted as a sensor, thus realizing a recognition process that takes advantage of both. Such a driver assist system will be discussed later.

On the other hand, higher and higher functions are being required of the millimeter wave radar itself. A millimeter wave radar for onboard use mainly uses electromagnetic waves of the 76 GHz band. The antenna power of its antenna is restricted to below a certain level under each country's law or the like. For example, it is restricted to 0.01 W or below in Japan. Under such restrictions, a millimeter wave radar for onboard use is expected to satisfy the required performance that, for example, its detection range is 200 m or more; the antenna size is 60 mm×60 mm or less; its horizontal detection angle is 90 degrees or more; its range resolution is 20 cm or less; it is capable of short-range detection within 10 m; and so on. Conventional millimeter wave radars have used microstrip lines as waveguides, and patch antennas as antennas (hereinafter, these will both be referred to as "patch antennas"). However, with a patch antenna, it has been difficult to attain the aforementioned performance.

By using a slot array antenna to which the technique of the present disclosure is applied, the inventors have successfully achieved the aforementioned performance. As a result, a millimeter wave radar has been realized which is smaller in size, more efficient, and higher-performance than are conventional patch antennas and the like. In addition, by combining this millimeter wave radar and an optical sensor such as a camera, a small-sized, highly efficient, and high-performance fusion apparatus has been realized which has existed never before. This will be described in detail below.

Figure 33:
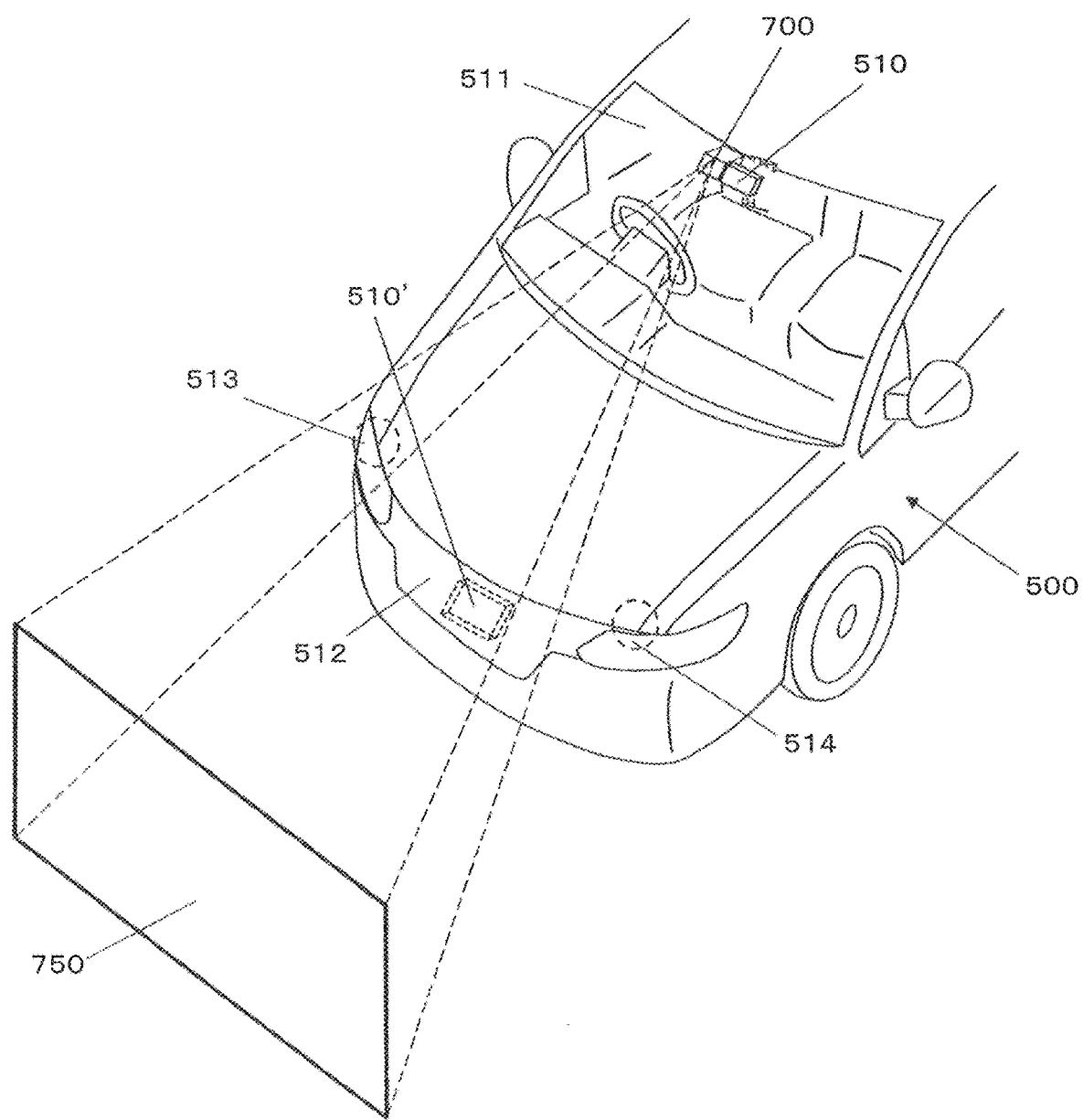
FIG. 33 is a diagram concerning a fusion apparatus in the vehicle 500, the fusion apparatus including: a radar system 510 having a slot array antenna to which the technique of the present disclosure is applied; and a camera 700.

FIG. 33 is a diagram concerning a fusion apparatus in a vehicle 500, the fusion apparatus including an onboard camera system 700 and a radar system 510 (hereinafter referred to also as the millimeter wave radar 510) having a slot array antenna to which the technique of the present disclosure is applied. With reference to this figure, various embodiments will be described below.

[Installment of Millimeter Wave Radar Within Vehicle Room]

A conventional patch antenna-based millimeter wave radar 510' is placed behind and inward of a grill 512 which is at the front nose of a vehicle. An electromagnetic wave that is radiated from an antenna goes through the apertures in the grill 512, and is radiated ahead of the vehicle 500. In this case, no dielectric layer, e.g., glass, exists that decays or reflects electromagnetic wave energy, in the region through which the electromagnetic wave passes. As a result, an electromagnetic wave that is radiated from the patch antenna-based millimeter wave radar 510' reaches over a long range, e.g., to a target which is 150 m or farther away. By receiving with the antenna the electromagnetic wave reflected therefrom, the millimeter wave radar 510' is able to detect a target. In this case, however, since the antenna is placed behind and inward of the grill 512 of the vehicle, the radar may be broken when the vehicle collides into an obstacle. Moreover, it may be soiled with mud or the like in rain, etc., and the soil that has adhered to the antenna may hinder radiation and reception of electromagnetic waves.

Similarly to the conventional manner, the millimeter wave radar 510 incorporating a slot array antenna according to an embodiment of the present disclosure may be placed behind the grill 512, which is located at the front nose of the vehicle (not shown). This allows the energy of the electromagnetic wave to be radiated from the antenna to be utilized by 100%, thus enabling long-range detection beyond the conventional level, e.g., detection of a target which is at a distance of 250 m or more.

Furthermore, the millimeter wave radar 510 according to an embodiment of the present disclosure can also be placed within the vehicle room, i.e., inside the vehicle. In that case, the millimeter wave radar 510 is placed inward of the windshield 511 of the vehicle, to fit in a space between the windshield 511 and a face of the rearview mirror (not shown) that is opposite to its specular surface. On the other hand, the conventional patch antenna-based millimeter wave radar 510' cannot be placed inside the vehicle room mainly for the two following reasons. A first reason is its large size, which prevents itself from being accommodated within the space between the windshield 511 and the rearview mirror. A second reason is that an electromagnetic wave that is radiated ahead reflects off the windshield 511 and decays due to dielectric loss, thus becoming unable to travel the desired distance. As a result, if a conventional patch antenna-based millimeter wave radar is placed within the vehicle room, only targets which are 100 m ahead or less can be detected, for example. On the other hand, a millimeter wave radar according to an embodiment of the present disclosure is able to detect a target which is at a distance of 200 m or more, despite reflection or decay at the windshield 511. This performance is equivalent to, or even greater than, the case where a conventional patch antenna-based millimeter wave radar is placed outside the vehicle room.

[Fusion Construction Based on Millimeter Wave Radar and Camera, Etc., being Placed Within Vehicle Room]

Currently, an optical imaging device such as a CCD camera is used as the main sensor in many a driver assist system (Driver Assist System). Usually, a camera or the like is placed within the vehicle room, inward of the windshield 511, in order to account for unfavorable influences of the external environment, etc. In this context, in order to minimize the influences of raindrops and the like, the camera or the like is placed in a region which is swept by the wipers (not shown) but is inward of the windshield 511.

In recent years, due to needs for improved performance of a vehicle in terms of e.g. automatic braking, there has been a desire for automatic braking or the like that is guaranteed to work regardless of whatever external environment may exist. In this case, if the only sensor in the driver assist system is an optical device such as a camera, a problem exists in that reliable operation is not guaranteed in nighttime or bad weather. This has led to the need for a driver assist system that incorporates not only an optical sensor (such as a camera) but also a millimeter wave radar, these being used for cooperative processing, so that reliable operation is achieved even in nighttime or bad weather.

As described earlier, a millimeter wave radar incorporating the present slot array antenna permits itself to be placed within the vehicle room, due to downsizing and remarkable enhancement in the efficiency of the radiated electromagnetic wave over that of a conventional patch antenna. By taking advantage of these properties, as shown in FIG. 33, the millimeter wave radar 510, which incorporates not only an optical sensor such as a camera (onboard camera system 700) but also the present slot array antenna, allows both to be placed inward of the windshield 511 of the vehicle 500. This has created the following novel effects.

(1) It is easier to install the driver assist system on the vehicle 500. The conventional patch antenna-based millimeter wave radar 510' has required a space behind the grill 512, which is at the front nose, in order to accommodate the radar. Since this space may include some sites that affect the structural design of the vehicle, if the size of the radar device is changed, it may have been necessary to reconsider the structural design. This inconvenience is avoided by placing the millimeter wave radar within the vehicle room.

Figure 34:
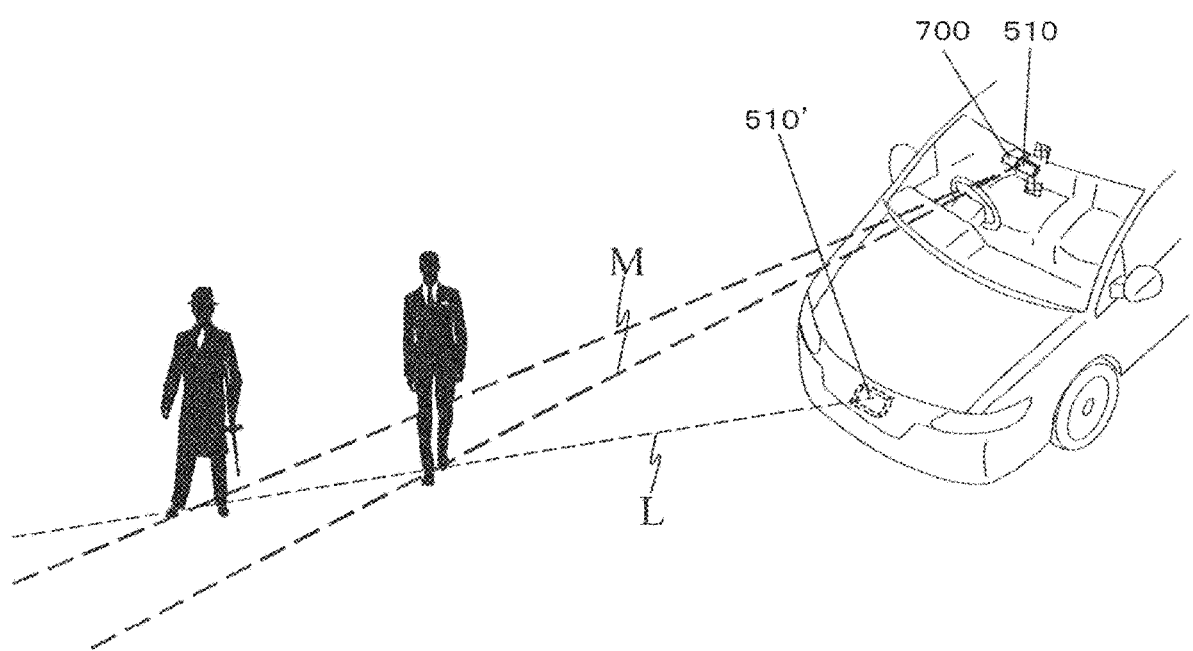
FIG. 34 is a diagram showing a relationship between where a millimeter wave radar 510 may be installed and where an onboard camera system 700 may be installed.

(2) Free from the influences of rain, nighttime, or other external environment factors to the vehicle, more reliable operation can be achieved. Especially, as shown in FIG. 34, by placing the millimeter wave radar (onboard radar system) 510 and the onboard camera system 700 at substantially the same position within the vehicle room, they can attain an identical field of view and line of sight, thus facilitating the "matching process" which will be described later, i.e., a process through which to establish that respective pieces of target information captured by them actually come from an identical object. On the other hand, if the millimeter wave radar 510' were placed behind the grill 512, which is at the front nose outside the vehicle room, its radar line of sight L would differ from a radar line of sight M of the case where it was placed within the vehicle room, thus resulting in a large offset with the image to be acquired by the onboard camera system 700.

(3) Reliability of the millimeter wave radar is improved. As described above, since the conventional patch antenna-based millimeter wave radar 510' is placed behind the grill 512, which is at the front nose, it is likely to gather soil, and may be broken even in a minor collision accident or the like. For these reasons, cleaning and functionality checks are always needed. Moreover, as will be described below, if the position or direction of attachment of the millimeter wave radar becomes shifted due to an accident or the like, it is necessary to reestablish alignment with respect to the camera. The chances of such occurrences are reduced by placing the millimeter wave radar within the vehicle room, whereby the aforementioned inconveniences are avoided.

In a driver assist system of such fusion construction, the optical sensor, e.g., a camera, and the millimeter wave radar 510 incorporating the present slot array antenna may have an integrated construction, i.e., being in fixed position with respect to each other. In that case, certain relative positioning should be kept between the optical axis of the optical sensor such as a camera and the directivity of the antenna of the millimeter wave radar, as will be described later. When this driver assist system having an integrated construction is fixed within the vehicle room of the vehicle 500, the optical axis of the camera, etc., should be adjusted so as to be oriented in a certain direction ahead of the vehicle. For these matters, see US Patent Application Publication No. 2015/193366, US Patent Application Publication No. 2015/0264230, U.S. patent application Ser. No. 15/067,503, U.S. patent application Ser. No. 15/248,141, and U.S. patent application Ser. No. 15/248,149, and U.S. patent application Ser. No. 15/248,156, which are incorporated herein by reference. Related techniques concerning the camera are described in the specification of U.S. Pat. No. 7,355,524, and the specification of U.S. Pat. No. 7,420,159, the entire disclosure of each which is incorporated herein by reference.

Regarding placement of an optical sensor such as a camera and a millimeter wave radar within the vehicle room, see, for example, the specification of U.S. Pat. No. 8,604,968, the specification of U.S. Pat. No. 8,614,640, and the specification of U.S. Pat. No. 7,978,122, the entire disclosure of each which is incorporated herein by reference. However, at the time when these patents were filed for, only conventional antennas with patch antennas were the known millimeter wave radars, and thus observation was not possible over sufficient distances. For example, the distance that is observable with a conventional millimeter wave radar is considered to be at most 100 m to 150 m. Moreover, when a millimeter wave radar is placed inward of the windshield, the large radar size inconveniently blocks the driver's field of view, thus hindering safe driving. On the other hand, a millimeter wave radar incorporating a slot array antenna according to an embodiment of the present disclosure is capable of being placed within the vehicle room because of its small size and remarkable enhancement in the efficiency of the radiated electromagnetic wave over that of a conventional patch antenna. This enables a long-range observation over 200 m, while not blocking the driver's field of view.

[Adjustment of Position of Attachment Between Millimeter Wave Radar and Camera, Etc.,]

In the processing under fusion construction (which hereinafter may be referred to as a "fusion process"), it is desired that an image which is obtained with a camera or the like and the radar information which is obtained with the millimeter wave radar map onto the same coordinate system because, if they differ as to position and target size, cooperative processing between both will be hindered.

This involves adjustment from the following three standpoints.

(1) The optical axis of the camera or the like and the antenna directivity of the millimeter wave radar must have a certain fixed relationship.

It is required that the optical axis of the camera or the like and the antenna directivity of the millimeter wave radar are matched. Alternatively, a millimeter wave radar may include two or more transmission antennas and two or more reception antennas, the directivities of these antennas being intentionally made different. Therefore, it is necessary to guarantee that at least a certain known relationship exists between the optical axis of the camera or the like and the directivities of these antennas.

In the case where the camera or the like and the millimeter wave radar have the aforementioned integrated construction, i.e., being in fixed position to each other, the relative positioning between the camera or the like and the millimeter wave radar stays fixed. Therefore, the aforementioned requirements are satisfied with respect to such an integrated construction. On the other hand, in a conventional patch antenna or the like, where the millimeter wave radar is placed behind the grill 512 of the vehicle 500, the relative positioning between them is usually to be adjusted according to (2) below.

(2) A certain fixed relationship exists between an image acquired with the camera or the like and radar information of the millimeter wave radar in an initial state (e.g., upon shipment) of having been attached to the vehicle.

The positions of attachment of the optical sensor such as a camera and the millimeter wave radar 510 or 510' on the vehicle 500 will finally be determined in the following manner. At a predetermined position 800 ahead of the vehicle 500, a chart to serve as a reference or a target which is subject to observation by the radar (which will hereinafter be referred to as, respectively, a "reference chart" and a "reference target", and collectively as the "benchmark") is accurately positioned. This is observed with the optical sensor such as a camera or with the millimeter wave radar 510. The observation information regarding the observed benchmark is compared against previously-stored shape information or the like of the benchmark, and the current offset information is quantitated. Based on this offset information, by at least one of the following means, the positions of attachment of the optical sensor such as a camera and the millimeter wave radar 510 or 510' are adjusted or corrected. Any other means may also be employed that can provide similar results.

(i) Adjust the positions of attachment of the camera and the millimeter wave radar so that the benchmark will come at a midpoint between the camera and the millimeter wave radar. This adjustment may be done by using a jig or tool, etc., which is separately provided.

(ii) Determine an offset amounts in the azimuths of the camera and the millimeter wave radar relative to the benchmark, and through image processing of the camera image and radar processing, correct for these azimuth offset amounts.

What is to be noted is that, in the case where the optical sensor 700 such as a camera and the millimeter wave radar 510 incorporating a slot array antenna according to an embodiment of the present disclosure have an integrated construction, i.e., being in fixed position to each other, adjusting an offset of either the camera or the radar with respect to the benchmark will make the offset amount known for the other as well, thus making it unnecessary to check for the other's offset with respect to the benchmark.

Specifically, with respect to the onboard camera system 700, a reference chart may be placed at a predetermined position 750, and an image taken by the camera is compared against advance information indicating where in the field of view of the camera the reference chart image is supposed to be located, thereby detecting an offset amount. Based on this, the camera is adjusted by at least one of the above means (i) and (ii). Next, the offset amount which has been ascertained for the camera is translated into an offset amount of the millimeter wave radar. Thereafter, an offset amount adjustment is made with respect to the radar information, by at least one of the above means (i) and (ii).

Alternatively, this may be performed on the basis of the millimeter wave radar 510. In other words, with respect to the millimeter wave radar 510, a reference target may be placed at a predetermined position 800, and the radar information thereof is compared against advance information indicating where in the field of view of the millimeter wave radar 510 the reference target is supposed to be located, thereby detecting an offset amount. Based on this, the millimeter wave radar 510 is adjusted by at least one of the above means (i) and (ii). Next, the offset amount which has been ascertained for the millimeter wave radar is translated into an offset amount of the camera. Thereafter, an offset amount adjustment is made with respect to the image information obtained by the camera, by at least one of the above means (i) and (ii).

(3) Even after an initial state of the vehicle, a certain relationship is maintained between an image acquired with the camera or the like and radar information of the millimeter wave radar.

Usually, an image acquired with the camera or the like and radar information of the millimeter wave radar are supposed to be fixed in the initial state, and hardly vary unless in an accident of the vehicle or the like. However, if an offset in fact occurs between these, an adjustment is possible by the following means.

The camera is attached in such a manner that portions 513 and 514 (characteristic points) that are characteristic of the driver's vehicle fit within its field of view, for example. The positions at which these characteristic points are actually imaged by the camera are compared against the information of the positions to be assumed by these characteristic points when the camera is attached accurately in place, and an offset amount(s) is detected therebetween. Based on this detected offset amount(s), the position of any image that is taken thereafter may be corrected, whereby an offset of the physical position of attachment of the camera can be corrected for. If this correction sufficiently embodies the performance that is required of the vehicle, then the adjustment per the above (2) may not be needed. By regularly performing this adjustment during startup or operation of the vehicle 500, even if an offset of the camera or the like occurs anew, it is possible to correct for the offset amount, thus helping safe travel.

However, this means is generally considered to result in poorer accuracy of adjustment than with the above means (2). When the adjustment is to be made based on an image which is obtained by shooting a benchmark with a camera, the azimuth of the benchmark will be determined highly accurately, whereby a high accuracy of adjustment can be easily attained. However, this means utilizes an image of a part of the vehicle body for adjustment, instead of a benchmark, thus making it somewhat difficult to enhance the accuracy of azimuth determination. Thus, a poorer accuracy of adjustment will result. However, it may still be effective as a means of correction when the position of attachment of the camera or the like is considerably altered for reasons such as an accident or a large external force being applied to the camera or the like within the vehicle room, etc.

[Mapping of Target as Detected by Millimeter Wave Radar and Camera or the Like: Matching Process]

In a fusion process, for a given target, it needs to be established that an image thereof which is acquired with a camera or the like and radar information which is acquired with the millimeter wave radar pertain to "the same target". For example, suppose that two obstacles (first and second obstacles), e.g., two bicycles, have appeared ahead of the vehicle 500. These two obstacles will be captured as camera images, and detected as radar information of the millimeter wave radar. At this time, the camera image and the radar information with respect to the first obstacle need to be mapped to each other so that they are both directed to the same target. Similarly, the camera image and the radar information with respect to the second obstacle need to be mapped to each other so that they are both directed to the same target. If the camera image of the first obstacle and the millimeter wave radar information of the second obstacle are mistakenly recognized to pertain to an identical target, a considerable accident may occur. Hereinafter, in the present specification, such a process of determining whether a target in a camera image and a target in a radar image pertain to the same target may be referred to as a "matching process".

This matching process may be implemented by various detection devices (or methods) described below. Hereinafter, these will be specifically described. Note that the each of the following detection devices is to be installed in the vehicle, and at least includes a millimeter wave radar detection section, an image detection section (e.g., a camera) which is oriented in a direction overlapping the direction of detection by the millimeter wave radar detection section, and a matching section. Herein, the millimeter wave radar detection section includes a slot array antenna according to any of the embodiments of the present disclosure, and at least acquires radar information in its own field of view. The image acquisition section at least acquires image information in its own field of view. The matching section includes a processing circuit which matches a result of detection by the millimeter wave radar detection section against a result of detection by the image detection section to determine whether or not the same target is being detected by the two detection sections. Herein, the image detection section may be composed of a selected one of, or selected two or more of, an optical camera, LIDAR, an infrared radar, and an ultrasonic radar. The following detection devices differ from one another in terms of the detection process at their respective matching section.

In a first detection device, the matching section performs two matches as follows. A first match involves, for a target of interest that has been detected by the millimeter wave radar detection section, obtaining distance information and lateral position information thereof, and also finding a target that is the closest to the target of interest among a target or two or more targets detected by the image detection section, and detecting a combination(s) thereof. A second match involves, for a target of interest that has been detected by the image detection section, obtaining distance information and lateral position information thereof, and also finding a target that is the closest to the target of interest among a target or two or more targets detected by the millimeter wave radar detection section, and detecting a combination(s) thereof. Furthermore, this matching section determines whether there is any matching combination between the combination(s) of such targets as detected by the millimeter wave radar detection section and the combination(s) of such targets as detected by the image detection section. Then, if there is any matching combination, it is determined that the same object is being detected by the two detection sections. In this manner, a match is attained between the respective targets that have been detected by the millimeter wave radar detection section and the image detection section.

A related technique is described in the specification of U.S. Pat. No. 7,358,889, the entire disclosure of which is incorporated herein by reference. In this publication, the image detection section is illustrated by way of a so-called stereo camera that includes two cameras. However, this technique is not limited thereto. In the case where the image detection section includes a single camera, detected targets may be subjected to an image recognition process or the like as appropriate, in order to obtain distance information and lateral position information of the targets. Similarly, a laser sensor such as a laser scanner may be used as the image detection section.

In a second detection device, the matching section matches a result of detection by the millimeter wave radar detection section and a result of detection by the image detection section every predetermined period of time. If the matching section determines that the same target was being detected by the two detection sections in the previous result of matching, it performs a match by using this previous result of matching. Specifically, the matching section matches a target which is currently detected by the millimeter wave radar detection section and a target which is currently detected by the image detection section, against the target which was determined in the previous result of matching to be being detected by the two detection sections. Then, based on the result of matching for the target which is currently detected by the millimeter wave radar detection section and the result of matching for the target which is currently detected by the image detection section, the matching section determines whether or not the same target is being detected by the two detection sections. Thus, rather than directly matching the results of detection by the two detection sections, this detection device performs a chronological match between the two results of detection and a previous result of matching. Therefore, the accuracy of detection is improved over the case of only performing a momentary match, whereby stable matching is realized. In particular, even if the accuracy of the detection section drops momentarily, matching is still possible because of utilizing past results of matching. Moreover, by utilizing the previous result of matching, this detection device is able to easily perform a match between the two detection sections.

In the current match which utilizes the previous result of matching, if the matching section of this detection device determines that the same object is being detected by the two detection sections, then the matching section of this detection device excludes this determined object in performing matching between objects which are currently detected by the millimeter wave radar detection section and objects which are currently detected by the image detection section. Then, this matching section determines whether there exists any identical object that is currently detected by the two detection sections. Thus, while taking into account the result of chronological matching, the object detection device also makes a momentary match based on two results of detection that are obtained from moment to moment. As a result, the object detection device is able to surely perform a match for any object that is detected during the current detection.

A related technique is described in the specification of U.S. Pat. No. 7,417,580, the entire disclosure of which is incorporated herein by reference. In this publication, the image detection section is illustrated by way of a so-called stereo camera that includes two cameras. However, this technique is not limited thereto. In the case where the image detection section includes a single camera, detected targets may be subjected to an image recognition process or the like as appropriate, in order to obtain distance information and lateral position information of the targets. Similarly, a laser sensor such as a laser scanner may be used as the image detection section.

In a third detection device, the two detection sections and matching section perform detection of targets and performs matches therebetween at predetermined time intervals, and the results of such detection and the results of such matching are chronologically stored to a storage medium, e.g., memory. Then, based on a rate of change in the size of a target in the image as detected by the image detection section, and on a distance to a target from the driver's vehicle and its rate of change (relative velocity with respect to the driver's vehicle) as detected by the millimeter wave radar detection section, the matching section determines whether the target which has been detected by the image detection section and the target which has been detected by the millimeter wave radar detection section are an identical object.

When determining that these targets are an identical object, based on the position of the target in the image as detected by the image detection section, and on the distance to the target from the driver's vehicle and/or its rate of change as detected by the millimeter wave radar detection section, the matching section predicts a possibility of collision with the vehicle.

A related technique is described in the specification of U.S. Pat. No. 6,903,677, the entire disclosure of which is incorporated herein by reference.

As described above, in a fusion process of a millimeter wave radar and an imaging device such as a camera, an image which is obtained with the camera or the like and radar information which is obtained with the millimeter wave radar are matched against each other. A millimeter wave radar incorporating the aforementioned array antenna according to an embodiment of the present disclosure can be constructed so as to have a small size and high performance. Therefore, high performance and downsizing, etc., can be achieved for the entire fusion process including the aforementioned matching process. This improves the accuracy of target recognition, and enables safer travel control for the vehicle.

[Other Fusion Processes]

In a fusion process, various functions are realized based on a matching process between an image which is obtained with a camera or the like and radar information which is obtained with the millimeter wave radar detection section. Examples of processing apparatuses that realize representative functions of a fusion process will be described below.

Each of the following processing apparatuses is to be installed in a vehicle, and at least includes: a millimeter wave radar detection section to transmit or receive electromagnetic waves in a predetermined direction; an image acquisition section, such as a monocular camera, that has a field of view overlapping the field of view of the millimeter wave radar detection section; and a processing section which obtains information therefrom to perform target detection and the like. The millimeter wave radar detection section acquires radar information in its own field of view. The image acquisition section acquires image information in its own field of view. A selected one, or selected two or more of, an optical camera, LIDAR, an infrared radar, and an ultrasonic radar may be used as the image acquisition section. The processing section can be implemented by a processing circuit which is connected to the millimeter wave radar detection section and the image acquisition section. The following processing apparatuses differ from one another with respect to the content of processing by this processing section.

In a first processing apparatus, the processing section extracts, from an image which is captured by the image acquisition section, a target which is recognized to be the same as the target which is detected by the millimeter wave radar detection section. In other words, a matching process according to the aforementioned detection device is performed. Then, it acquires information of a right edge and a left edge of the extracted target image, and derives locus approximation lines, which are straight lines or predetermined curved lines for approximating loci of the acquired right edge and the left edge, are derived for both edges. The edge which has a larger number of edges existing on the locus approximation line is selected as a true edge of the target. The lateral position of the target is derived on the basis of the position of the edge that has been selected as a true edge. This permits a further improvement on the accuracy of detection of a lateral position of the target.

A related technique is described in the specification of U.S. Pat. No. 8,610,620, the entire disclosure of which is incorporated herein by reference.

In a second processing apparatus, in determining the presence of a target, the processing section alters a determination threshold to be used in checking for a target presence in radar information, on the basis of image information. Thus, if a target image that may be an obstacle to vehicle travel has been confirmed with a camera or the like, or if the presence of a target has been estimated, etc., for example, the determination threshold for the target detection by the millimeter wave radar detection section can be optimized so that more accurate target information can be obtained. In other words, if the possibility of the presence of an obstacle is high, the determination threshold is altered so that this processing apparatus will surely be activated. On the other hand, if the possibility of the presence of an obstacle is low, the determination threshold is altered so that unwanted activation of this processing apparatus is prevented. This permits appropriate activation of the system.

Furthermore in this case, based on radar information, the processing section may designate a region of detection for the image information, and estimate a possibility of the presence of an obstacle on the basis of image information within this region. This makes for a more efficient detection process.

A related technique is described in the specification of U.S. Pat. No. 7,570,198, the entire disclosure of which is incorporated herein by reference.

In a third processing apparatus, the processing section performs combined displaying where images obtained from a plurality of different imaging devices and a millimeter wave radar detection section and an image signal based on radar information are displayed on at least one display device. In this displaying process, horizontal and vertical synchronizing signals are synchronized between the plurality of imaging devices and the millimeter wave radar detection section, and among the image signals from these devices, selective switching to a desired image signal is possible within one horizontal scanning period or one vertical scanning period. This allows, on the basis of the horizontal and vertical synchronizing signals, images of a plurality of selected image signals to be displayed side by side; and, from the display device, a control signal for setting a control operation in the desired imaging device and the millimeter wave radar detection section is sent.

When a plurality of different display devices display respective images or the like, it is difficult to compare the respective images against one another. Moreover, when display devices are provided separately from the third processing apparatus itself, there is poor operability for the device. The third processing apparatus would overcome such shortcomings.

A related technique is described in the specification of U.S. Pat. No. 6,628,299 and the specification of U.S. Pat. No. 7,161,561, the entire disclosure of each of which is incorporated herein by reference.

In a fourth processing apparatus, with respect to a target which is ahead of a vehicle, the processing section instructs an image acquisition section and a millimeter wave radar detection section to acquire an image and radar information containing that target. From within such image information, the processing section determines a region in which the target is contained. Furthermore, the processing section extracts radar information within this region, and detects a distance from the vehicle to the target and a relative velocity between the vehicle and the target. Based on such information, the processing section determines a possibility that the target will collide against the vehicle. This enables an early detection of a possible collision with a target.

A related technique is described in the specification of U.S. Pat. No. 8,068,134, the entire disclosure of which is incorporated herein by reference.

In a fifth processing apparatus, based on radar information or through a fusion process which is based on radar information and image information, the processing section recognizes a target or two or more targets ahead of the vehicle. The "target" encompasses any moving entity such as other vehicles or pedestrians, traveling lanes indicated by white lines on the road, road shoulders and any still objects (including gutters, obstacles, etc.), traffic lights, pedestrian crossings, and the like that may be there. The processing section may encompass a GPS (Global Positioning System) antenna. By using a GPS antenna, the position of the driver's vehicle may be detected, and based on this position, a storage device (referred to as a map information database device) that stores road map information may be searched in order to ascertain a current position on the map. This current position on the map may be compared against a target or two or more targets that have been recognized based on radar information or the like, whereby the traveling environment may be recognized. On this basis, the processing section may extract any target that is estimated to hinder vehicle travel, find safer traveling information, and display it on a display device, as necessary, to inform the driver.

A related technique is described in the specification of U.S. Pat. No. 6,191,704, the entire disclosure of which is incorporated herein by reference.

The fifth processing apparatus may further include a data communication device (having communication circuitry) that communicates with a map information database device which is external to the vehicle. The data communication device may access the map information database device, with a period of e.g. once a week or once a month, to download the latest map information therefrom. This allows the aforementioned processing to be performed with the latest map information.

Furthermore, the fifth processing apparatus may compare between the latest map information that was acquired during the aforementioned vehicle travel and information that is recognized of a target or two or more targets based on radar information, etc., in order to extract target information (hereinafter referred to as "map update information") that is not included in the map information. Then, this map update information may be transmitted to the map information database device via the data communication device. The map information database device may store this map update information in association with the map information that is within the database, and update the current map information itself, if necessary. In performing the update, respective pieces of map update information that are obtained from a plurality of vehicles may be compared against one another to check certainty of the update.

Note that this map update information may contain more detailed information than the map information which is carried by any currently available map information database device. For example, schematic shapes of roads may be known from commonly-available map information, but it typically does not contain information such as the width of the road shoulder, the width of the gutter that may be there, any newly occurring bumps or dents, shapes of buildings, and so on. Neither does it contain heights of the roadway and the sidewalk, how a slope may connect to the sidewalk, etc. Based on conditions which are separately set, the map information database device may store such detailed information (hereinafter referred to as "map update details information") in association with the map information. Such map update details information provides a vehicle (including the driver's vehicle) with information which is more detailed than the original map information, thereby rending itself available for not only the purpose of ensuring safe vehicle travel but also some other purposes. As used herein, a "vehicle (including the driver's vehicle)" may be e.g. an automobile, a motorcycle, a bicycle, or any autonomous vehicle to become available in the future, e.g., an electric wheelchair. The map update details information is to be used when any such vehicle may travel.

(Recognition Via Neural Network)

Each of the first to fifth processing apparatuses may further include a sophisticated apparatus of recognition. The sophisticated apparatus of recognition may be provided external to the vehicle. In that case, the vehicle may include a high-speed data communication device that communicates with the sophisticated apparatus of recognition. The sophisticated apparatus of recognition may be constructed from a neural network, which may encompass so-called deep learning and the like. This neural network may include a convolutional neural network (hereinafter referred to as "CNN"), for example. A CNN, a neural network that has proven successful in image recognition, is characterized by possessing one or more sets of two layers, namely, a convolutional layer and a pooling layer.

There exists at least three kinds of information as follows, any of which may be input to a convolutional layer in the processing apparatus:

(1) information that is based on radar information which is acquired by the millimeter wave radar detection section;

(2) information that is based on specific image information which is acquired, based on radar information, by the image acquisition section; or (3) fusion information that is based on radar information and image information which is acquired by the image acquisition section, or information that is obtained based on such fusion information.

Based on information of any of the above kinds, or information based on a combination thereof, product-sum operations corresponding to a convolutional layer are performed. The results are input to the subsequent pooling layer, where data is selected according to a predetermined rule. In the case of max pooling where a maximum value among pixel values is chosen, for example, the rule may dictate that a maximum value be chosen for each split region in the convolutional layer, this maximum value being regarded as the value of the corresponding position in the pooling layer.

A sophisticated apparatus of recognition that is composed of a CNN may include a single set of a convolutional layer and a pooling layer, or a plurality of such sets which are cascaded in series. This enables accurate recognition of a target, which is contained in the radar information and the image information, that may be around a vehicle.

Related techniques are described in the U.S. Pat. No. 8,861,842, the specification of U.S. Pat. No. 9,286,524, and the specification of US Patent Application Publication No. 2016/0140424, the entire disclosure of each of which is incorporated herein by reference.

In a sixth processing apparatus, the processing section performs processing that is related to headlamp control of a vehicle. When a vehicle travels in nighttime, the driver may check whether another vehicle or a pedestrian exists ahead of the driver's vehicle, and control a beam(s) from the headlamp(s) of the driver's vehicle to prevent the driver of the other vehicle or the pedestrian from being dazzled by the headlamp(s) of the driver's vehicle. This sixth processing apparatus automatically controls the headlamp(s) of the driver's vehicle by using radar information, or a combination of radar information and an image taken by a camera or the like.

Based on radar information, or through a fusion process based on radar information and image information, the processing section detects a target that corresponds to a vehicle or pedestrian ahead of the vehicle. In this case, a vehicle ahead of a vehicle may encompass a preceding vehicle that is ahead, a vehicle or a motorcycle in the oncoming lane, and so on. When detecting any such target, the processing section issues a command to lower the beam(s) of the headlamp(s). Upon receiving this command, the control section (control circuit) which is internal to the vehicle may control the headlamp(s) to lower the beam(s) therefrom.

Related techniques are described in the specification of U.S. Pat. No. 6,403,942, the specification of U.S. Pat. No. 6,611,610, the specification of U.S. Pat. No. 8,543,277, the specification of U.S. Pat. No. 8,593,521, and the specification of U.S. Pat. No. 8,636,393, the entire disclosure of each of which is incorporated herein by reference.

According to the above-described processing by the millimeter wave radar detection section, and the above-described fusion process by the millimeter wave radar detection section and an imaging device such as a camera, the millimeter wave radar can be constructed so as to have a small size and high performance, whereby high performance and downsizing, etc., can be achieved for the radar processing or the entire fusion process. This improves the accuracy of target recognition, and enables safer travel control for the vehicle.

Application Example 2: Various Monitoring Systems (Natural Elements, Buildings, Roads, Watch, Security)

A millimeter wave radar (radar system) incorporating an array antenna according to an embodiment of the present disclosure also has a wide range of applications in the fields of monitoring, which may encompass natural elements, weather, buildings, security, nursing care, and the like. In a monitoring system in this context, a monitoring apparatus that includes the millimeter wave radar may be installed e.g. at a fixed position, in order to perpetually monitor a subject(s) of monitoring. In realizing this, given a subject(s) of monitoring, the millimeter wave radar has its resolution of detection adjusted and set to an optimum value.

A millimeter wave radar incorporating an array antenna according to an embodiment of the present disclosure is capable of detection with a radio frequency electromagnetic wave exceeding e.g. 100 GHz. As for the modulation band in those schemes which are used in radar recognition, e.g., the FMCW method, the millimeter wave radar currently achieves a wide band exceeding 4 GHz, which supports the aforementioned Ultra Wide Band (UWB). Note that the modulation band is related to the range resolution. In a conventional patch antenna, the modulation band was up to about 600 MHz, thus resulting in a range resolution of 25 cm. On the other hand, a millimeter wave radar associated with the present array antenna has a range resolution of 3.75 cm, indicative of a performance which rivals the range resolution of conventional LIDAR. Whereas an optical sensor such as LIDAR is unable to detect a target in nighttime or bad weather as mentioned above, a millimeter wave radar is always capable of detection, regardless of daytime or nighttime and irrespective of weather. As a result, a millimeter wave radar associated with the present array antenna is available for a variety of applications which were not possible with a millimeter wave radar incorporating any conventional patch antenna.

Figure 35:
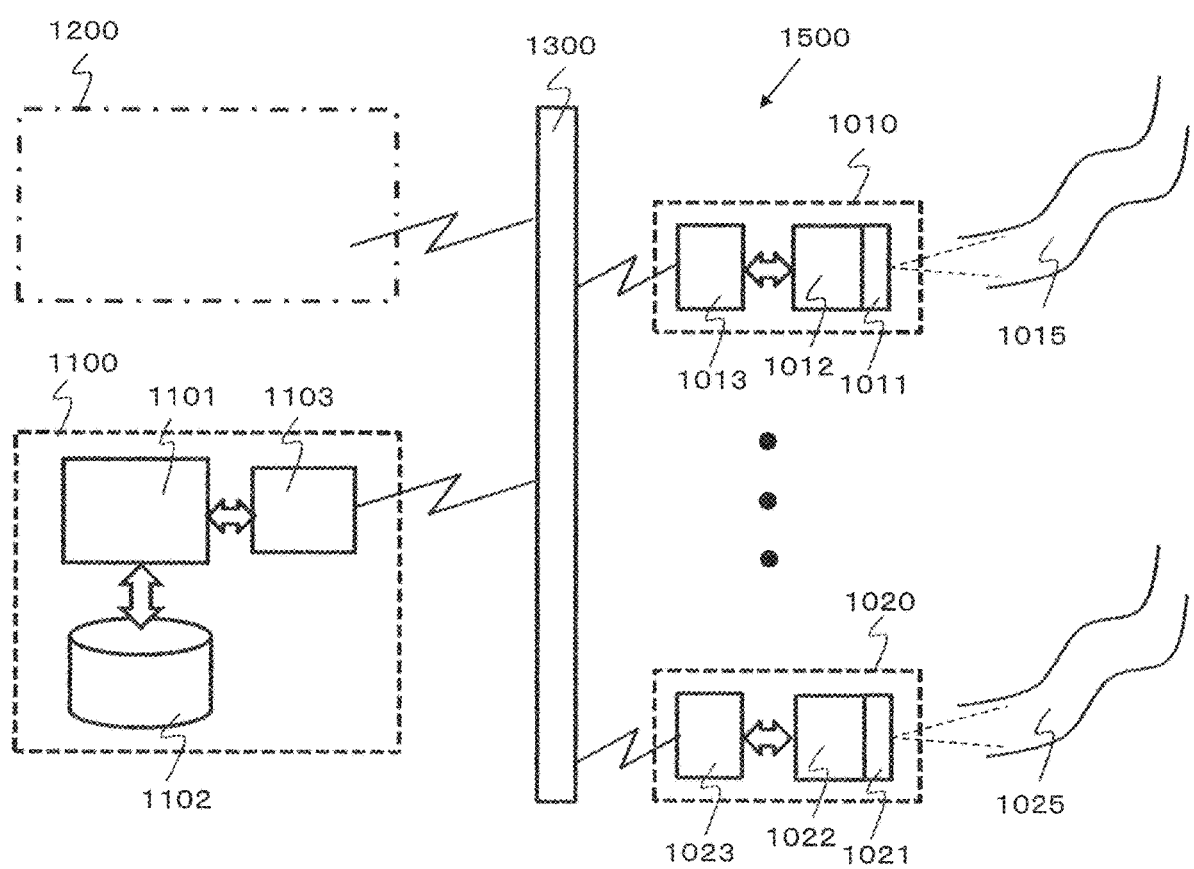
FIG. 35 is a diagram showing an exemplary construction for a monitoring system 1500 based on millimeter wave radar.

FIG. 35 is a diagram showing an exemplary construction for a monitoring system 1500 based on millimeter wave radar. The monitoring system 1500 based on millimeter wave radar at least includes a sensor section 1010 and a main section 1100. The sensor section 1010 at least includes an antenna 1011 which is aimed at the subject of monitoring 1015, a millimeter wave radar detection section 1012 which detects a target based on a transmitted or received electromagnetic wave, and a communication section (communication circuit) 1013 which transmits detected radar information. The main section 1100 at least includes a communication section (communication circuit) 1103 which receives radar information, a processing section (processing circuit) 1101 which performs predetermined processing based on the received radar information, and a data storage section (storage medium) 1102 in which past radar information and other information that is needed for the predetermined processing, etc., are stored. Telecommunication lines 1300 exist between the sensor section 1010 and the main section 1100, via which transmission and reception of information and commands occur between them. As used herein, the telecommunication lines may encompass any of a general-purpose communications network such as the Internet, a mobile communications network, dedicated telecommunication lines, and so on, for example. Note that the present monitoring system 1500 may be arranged so that the sensor section 1010 and the main section 1100 are directly connected, rather than via telecommunication lines. In addition to the millimeter wave radar, the sensor section 1010 may also include an optical sensor such as a camera. This will permit target recognition through a fusion process which is based on radar information and image information from the camera or the like, thus enabling a more sophisticated detection of the subject of monitoring 1015 or the like.

Hereinafter, examples of monitoring systems embodying these applications will be specifically described.

[Natural Element Monitoring System]

A first monitoring system is a system that monitors natural elements (hereinafter referred to as a "natural element monitoring system"). With reference to FIG. 35, this natural element monitoring system will be described. Subjects of monitoring 1015 of the natural element monitoring system 1500 may be, for example, a river, the sea surface, a mountain, a volcano, the ground surface, or the like. For example, when a river is the subject of monitoring 1015, the sensor section 1010 being secured to a fixed position perpetually monitors the water surface of the river 1015. This water surface information is perpetually transmitted to a processing section 1101 in the main section 1100. Then, if the water surface reaches a certain height or above, the processing section 1101 informs a distinct system 1200 which separately exists from the monitoring system (e.g., a weather observation monitoring system), via the telecommunication lines 1300. Alternatively, the processing section 1101 may send information to a system (not shown) which manages the water gate, whereby the system if instructed to automatically close a water gate, etc. (not shown) which is provided at the river 1015.

The natural element monitoring system 1500 is able to monitor a plurality of sensor sections 1010, 1020, etc., with the single main section 1100. When the plurality of sensor sections are distributed over a certain area, the water levels of rivers in that area can be grasped simultaneously. This allows to make an assessment as to how the rainfall in this area may affect the water levels of the rivers, possibly leading to disasters such as floods. Information concerning this can be conveyed to the distinct system 1200 (e.g., a weather observation monitoring system) via the telecommunication lines 1300. Thus, the distinct system 1200 (e.g., a weather observation monitoring system) is able to utilize the conveyed information for weather observation or disaster prediction in a wider area.

The natural element monitoring system 1500 is also similarly applicable to any natural element other than a river. For example, the subject of monitoring of a monitoring system that monitors tsunamis or storm surges is the sea surface level. It is also possible to automatically open or close the water gate of a seawall in response to a rise in the sea surface level. Alternatively, the subject of monitoring of a monitoring system that monitors landslides to be caused by rainfall, earthquakes, or the like may be the ground surface of a mountainous area, etc.

[Traffic Monitoring System]

A second monitoring system is a system that monitors traffic (hereinafter referred to as a "traffic monitoring system"). The subject of monitoring of this traffic monitoring system may be, for example, a railroad crossing, a specific railroad, an airport runway, a road intersection, a specific road, a parking lot, etc.

For example, when the subject of monitoring is a railroad crossing, the sensor section 1010 is placed at a position where the inside of the crossing can be monitored. In this case, in addition to the millimeter wave radar, the sensor section 1010 may also include an optical sensor such as a camera, which will allow a target (subject of monitoring) to be detected from more perspectives, through a fusion process based on radar information and image information. The target information which is obtained with the sensor section 1010 is sent to the main section 1100 via the telecommunication lines 1300. The main section 1100 collects other information (e.g., train schedule information) that may be needed in a more sophisticated recognition process or control, and issues necessary control instructions or the like based thereon. As used herein, a necessary control instruction may be, for example, an instruction to stop a train when a person, a vehicle, etc. is found inside the crossing when it is closed.

If the subject of monitoring is a runway at an airport, for example, a plurality of sensor sections 1010, 1020, etc., may be placed along the runway so as to achieve a predetermined resolution, e.g., a resolution that allows any foreign object on the runway that is 5 cm by 5 cm or larger to be detected. The monitoring system 1500 perpetually monitors the runway, regardless of daytime or nighttime and irrespective of weather. This function is enabled by the very ability of the millimeter wave radar according to an embodiment of the present disclosure to support UWB. Moreover, since the present millimeter wave radar can be embodied with a small size, a high resolution, and a low cost, it provides a realistic solution for covering the entire runway surface from end to end. In this case, the main section 1100 keeps the plurality of sensor sections 1010, 1020, etc., under integrated management. If a foreign object is found on the runway, the main section 1100 transmits information concerning the position and size of the foreign object to an air-traffic control system (not shown). Upon receiving this, the air-traffic control system temporarily prohibits takeoff and landing on that runway. In the meantime, the main section 1100 transmits information concerning the position and size of the foreign object to a separately-provided vehicle, which automatically cleans the runway surface, etc., for example. Upon receive this, the cleaning vehicle may autonomously move to the position where the foreign object exists, and automatically remove the foreign object. Once removal of the foreign object is completed, the cleaning vehicle transmits information of the completion to the main section 1100. Then, the main section 1100 again confirms that the sensor section 1010 or the like which has detected the foreign object now reports that "no foreign object exists" and that it is safe now, and informs the air-traffic control system of this. Upon receiving this, the air-traffic control system may lift the prohibition of takeoff and landing from the runway.

Furthermore, in the case where the subject of monitoring is a parking lot, for example, it may be possible to automatically recognize which position in the parking lot is currently vacant. A related technique is described in the specification of U.S. Pat. No. 6,943,726, the entire disclosure of which is incorporated herein by reference.

[Security Monitoring System]

A third monitoring system is a system that monitors a trespasser into a piece of private land or a house (hereinafter referred to as a "security monitoring system"). The subject of monitoring of this security monitoring system may be, for example, a specific region within a piece of private land or a house, etc.

For example, if the subject of monitoring is a piece of private land, the sensor section(s) 1010 may be placed at one position, or two or more positions where the sensor section(s) 1010 is able to monitor it. In this case, in addition to the millimeter wave radar, the sensor section(s) 1010 may also include an optical sensor such as a camera, which will allow a target (subject of monitoring) to be detected from more perspectives, through a fusion process based on radar information and image information. The target information which was obtained by the sensor section 1010(s) is sent to the main section 1100 via the telecommunication lines 1300. The main section 1100 collects other information (e.g., reference data or the like needed to accurately recognize whether the trespasser is a person or an animal such as a dog or a bird) that may be needed in a more sophisticated recognition process or control, and issues necessary control instructions or the like based thereon. As used herein, a necessary control instruction may be, for example, an instruction to sound an alarm or activate lighting that is installed in the premises, and also an instruction to directly report to a person in charge of the premises via mobile telecommunication lines or the like, etc. The processing section 1101 in the main section 1100 may allow an internalized, sophisticated apparatus of recognition (that adopts deep learning or a like technique) to recognize the detected target. Alternatively, such a sophisticated apparatus of recognition may be provided externally, in which case the sophisticated apparatus of recognition may be connected via the telecommunication lines 1300.

A related technique is described in the specification of U.S. Pat. No. 7,425,983, the entire disclosure of which is incorporated herein by reference.

Another embodiment of such a security monitoring system may be a human monitoring system to be installed at a boarding gate at an airport, a station wicket, an entrance of a building, or the like. The subject of monitoring of such a human monitoring system may be, for example, a boarding gate at an airport, a station wicket, an entrance of a building, or the like.

If the subject of monitoring is a boarding gate at an airport, the sensor section(s) 1010 may be installed in a machine for checking personal belongings at the boarding gate, for example. In this case, there may be two checking methods as follows. In a first method, the millimeter wave radar transmits an electromagnetic wave, and receives the electromagnetic wave as it reflects off a passenger (which is the subject of monitoring), thereby checking personal belongings or the like of the passenger. In a second method, a weak millimeter wave which is radiated from the passenger's own body is received by the antenna, thus checking for any foreign object that the passenger may be hiding. In the latter method, the millimeter wave radar preferably has a function of scanning the received millimeter wave. This scanning function may be implemented by using digital beam forming, or through a mechanical scanning operation. Note that the processing by the main section 1100 may utilize a communication process and a recognition process similar to those in the above-described examples.

[Building Inspection System (Non-Destructive Inspection)]

A fourth monitoring system is a system that monitors or checks the concrete material of a road, a railroad overpass, a building, etc., or the interior of a road or the ground, etc., (hereinafter referred to as a "building inspection system"). The subject of monitoring of this building inspection system may be, for example, the interior of the concrete material of an overpass or a building, etc., or the interior of a road or the ground, etc.

For example, if the subject of monitoring is the interior of a concrete building, the sensor section 1010 is structured so that the antenna 1011 can make scan motions along the surface of a concrete building. As used herein, "scan motions" may be implemented manually, or a stationary rail for the scan motion may be separately provided, upon which to cause the movement by using driving power from an electric motor or the like. In the case where the subject of monitoring is a road or the ground, the antenna 1011 may be installed face-down on a vehicle or the like, and the vehicle may be allowed to travel at a constant velocity, thus creating a "scan motion". The electromagnetic wave to be used by the sensor section 1010 may be a millimeter wave in e.g. the so-called terahertz region, exceeding 100 GHz. As described earlier, even with an electromagnetic wave over e.g. 100 GHz, an array antenna according to an embodiment of the present disclosure can be adapted to have smaller losses than do conventional patch antennas or the like. An electromagnetic wave of a higher frequency is able to permeate deeper into the subject of checking, such as concrete, thereby realizing a more accurate non-destructive inspection. Note that the processing by the main section 1100 may also utilize a communication process and a recognition process similar to those in the other monitoring systems described above.

A related technique is described in the specification of U.S. Pat. No. 6,661,367, the entire disclosure of which is incorporated herein by reference.

[Human Monitoring System]

A fifth monitoring system is a system that watches over a person who is subject to nursing care (hereinafter referred to as a "human watch system"). The subject of monitoring of this human watch system may be, for example, a person under nursing care or a patient in a hospital, etc.

For example, if the subject of monitoring is a person under nursing care within a room of a nursing care facility, the sensor section(s) 1010 is placed at one position, or two or more positions inside the room where the sensor section(s) 1010 is able to monitor the entirety of the inside of the room. In this case, in addition to the millimeter wave radar, the sensor section 1010 may also include an optical sensor such as a camera. In this case, the subject of monitoring can be monitored from more perspectives, through a fusion process based on radar information and image information. On the other hand, when the subject of monitoring is a person, from the standpoint of privacy protection, monitoring with a camera or the like may not be appropriate. Therefore, sensor selections must be made while taking this aspect into consideration. Note that target detection by the millimeter wave radar will allow a person, who is the subject of monitoring, to be captured not by his or her image, but by a signal (which is, as it were, a shadow of the person). Therefore, the millimeter wave radar may be considered as a desirable sensor from the standpoint of privacy protection.

Information of the person under nursing care which has been obtained by the sensor section(s) 1010 is sent to the main section 1100 via the telecommunication lines 1300. The main section 1100 collects other information (e.g., reference data or the like needed to accurately recognize target information of the person under nursing care) that may be needed in a more sophisticated recognition process or control, and issues necessary control instructions or the like based thereon. As used herein, a necessary control instruction may be, for example, an instruction to directly report a person in charge based on the result of detection, etc. The processing section 1101 in the main section 1100 may allow an internalized, sophisticated apparatus of recognition (that adopts deep learning or a like technique) to recognize the detected target. Alternatively, such a sophisticated apparatus of recognition may be provided externally, in which case the sophisticated apparatus of recognition may be connected via the telecommunication lines 1300.

In the case where a person is the subject of monitoring of the millimeter wave radar, at least the two following functions may be added.

A first function is a function of monitoring the heart rate and/or the respiratory rate. In the case of a millimeter wave radar, an electromagnetic wave is able to see through the clothes to detect the position and motions of the skin surface of a person's body. First, the processing section 1101 detects a person who is the subject of monitoring and an outer shape thereof. Next, in the case of detecting a heart rate, for example, a position on the body surface where the heartbeat motions are easy to detect may be identified, and the motions there may be chronologically detected. This allows a heart rate per minute to be detected, for example. The same is also true when detecting a respiratory rate. By using this function, the health status of a person under nursing care can be perpetually checked, thus enabling a higher-quality watch over a person under nursing care.

A second function is a function of fall detection. A person under nursing care such as an elderly person may fall from time to time, due to weakened legs and feet. When a person falls, the velocity or acceleration of a specification site of the person's body, e.g., the head, will reach a certain level or greater. When the subject of monitoring of the millimeter wave radar is a person, the relative velocity or acceleration of the target of interest can be perpetually detected. Therefore, by identifying the head as the subject of monitoring, for example, and chronologically detecting its relative velocity or acceleration, a fall can be recognized when a velocity of a certain value or greater is detected. When recognizing a fall, the processing section 1101 can issue an instruction or the like corresponding to pertinent nursing care assistance, for example.

Note that the sensor section(s) 1010 is secured to a fixed position(s) in the above-described monitoring system or the like. However, the sensor section(s) 1010 can also be installed on a moving entity, e.g., a robot, a vehicle, a flying object such as a drone. As used herein, the vehicle or the like may encompass not only an automobile, but also a smaller sized moving entity such as an electric wheelchair, for example. In this case, this moving entity may include an internal GPS unit which allows its own current position to be always confirmed. In addition, this moving entity may also have a function of further improving the accuracy of its own current position by using map information and the map update information which has been described with respect to the aforementioned fifth processing apparatus.

Furthermore, in any device or system that is similar to the above-described first to third detection devices, first to sixth processing apparatuses, first to fifth monitoring systems, etc., a like construction may be adopted to utilize an array antenna or a millimeter wave radar according to an embodiment of the present disclosure.

Application Example 3: Communication System

First Example of Communication System

The waveguide device and antenna device (array antenna) according to the present disclosure can be used for the transmitter and/or receiver with which a communication system (telecommunication system) is constructed. The waveguide device and antenna device according to the present disclosure are composed of layered conductive members, and therefore are able to keep the transmitter and/or receiver size smaller than in the case of using a hollow waveguide. Moreover, there is no need for dielectric, and thus the dielectric loss of electromagnetic waves can be kept smaller than in the case of using a microstrip line. Therefore, a communication system including a small and highly efficient transmitter and/or receiver can be constructed.

Such a communication system may be an analog type communication system which transmits or receives an analog signal that is directly modulated. However, a digital communication system may be adopted in order to construct a more flexible and higher-performance communication system.

Hereinafter, with reference to FIG. 36, a digital communication system 800A in which a waveguide device and an antenna device according to an embodiment of the present disclosure are used will be described.

Figure 36:
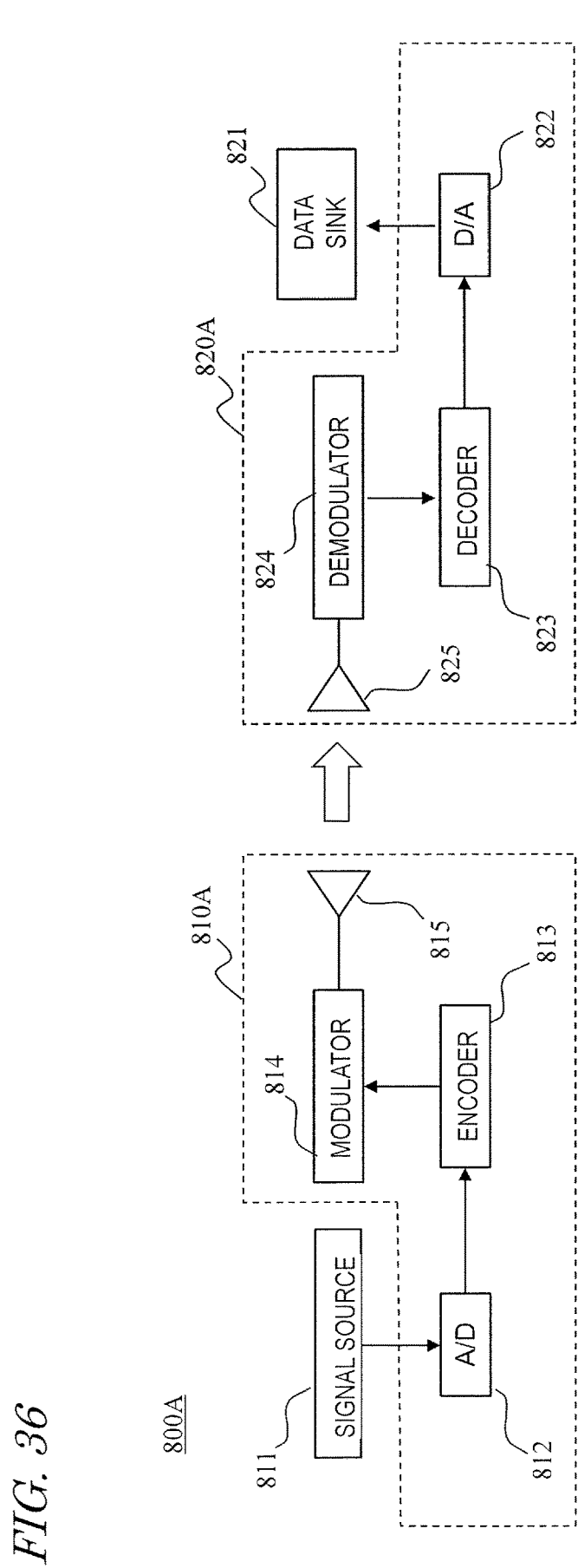
FIG. 36 is a block diagram showing a construction for a digital communication system 800A.

FIG. 36 is a block diagram showing a construction for the digital communication system 800A. The communication system 800A includes a transmitter 810A and a receiver 820A. The transmitter 810A includes an analog to digital (A/D) converter 812, an encoder 813, a modulator 814, and a transmission antenna 815. The receiver 820A includes a reception antenna 825, a demodulator 824, a decoder 823, and a digital to analog (D/A) converter 822. The at least one of the transmission antenna 815 and the reception antenna 825 may be implemented by using an array antenna according to an embodiment of the present disclosure. In this exemplary application, the circuitry including the modulator 814, the encoder 813, the A/D converter 812, and so on, which are connected to the transmission antenna 815, is referred to as the transmission circuit. The circuitry including the demodulator 824, the decoder 823, the D/A converter 822, and so on, which are connected to the reception antenna 825, is referred to as the reception circuit. The transmission circuit and the reception circuit may be collectively referred to as the communication circuit.

With the analog to digital (A/D) converter 812, the transmitter 810A converts an analog signal which is received from the signal source 811 to a digital signal. Next, the digital signal is encoded by the encoder 813. As used herein, "encoding" means altering the digital signal to be transmitted into a format which is suitable for communication. Examples of such encoding include CDM (Code-Division Multiplexing) and the like. Moreover, any conversion for effecting TDM (Time-Division Multiplexing) or FDM (Frequency Division Multiplexing), or OFDM (Orthogonal Frequency Division Multiplexing) is also an example of encoding. The encoded signal is converted by the modulator 814 into a radio frequency signal, so as to be transmitted from the transmission antenna 815.

In the field of communications, a wave representing a signal to be superposed on a carrier wave may be referred to as a "signal wave"; however, the term "signal wave" as used in the present specification does not carry that definition. A "signal wave" as referred to in the present specification is broadly meant to be any electromagnetic wave to propagate in a waveguide, or any electromagnetic wave for transmission/reception via an antenna element.

The receiver 820A restores the radio frequency signal that has been received by the reception antenna 825 to a low-frequency signal at the demodulator 824, and to a digital signal at the decoder 823. The decoded digital signal is restored to an analog signal by the digital to analog (D/A) converter 822, and is sent to a data sink (data receiver) 821. Through the above processes, a sequence of transmission and reception processes is completed.

When the communicating agent is a digital appliance such as a computer, analog to digital conversion of the transmission signal and digital to analog conversion of the reception signal are not needed in the aforementioned processes. Thus, the analog to digital converter 812 and the digital to analog converter 822 in FIG. 36 may be omitted. A system of such construction is also encompassed within a digital communication system.

In a digital communication system, in order to ensure signal intensity or expand channel capacity, various methods may be adopted. Many such methods are also effective in a communication system which utilizes radio waves of the millimeter wave band or the terahertz band.

Radio waves in the millimeter wave band or the terahertz band have higher straightness than do radio waves of lower frequencies, and undergoes less diffraction, i.e., bending around into the shadow side of an obstacle. Therefore, it is not uncommon for a receiver to fail to directly receive a radio wave that has been transmitted from a transmitter. Even in such situations, reflected waves may often be received, but a reflected wave of a radio wave signal is often poorer in quality than is the direct wave, thus making stable reception more difficult. Furthermore, a plurality of reflected waves may arrive through different paths. In that case, the reception waves with different path lengths might differ in phase from one another, thus causing multi-path fading.

As a technique for improving such situations, a so-called antenna diversity technique may be used. In this technique, at least one of the transmitter and the receiver includes a plurality of antennas. If the plurality of antennas are parted by distances which differ from one another by at least about the wavelength, the resulting states of the reception waves will be different. Accordingly, the antenna that is capable of transmission/reception with the highest quality among all is selectively used, thereby enhancing the reliability of communication. Alternatively, signals which are obtained from more than one antenna may be merged for an improved signal quality.

In the communication system 800A shown in FIG. 36, for example, the receiver 820A may include a plurality of reception antennas 825. In this case, a switcher exists between the plurality of reception antennas 825 and the demodulator 824. Through the switcher, the receiver 820A connects the antenna that provides the highest-quality signal among the plurality of reception antennas 825 to the demodulator 824. In this case, the transmitter 810A may also include a plurality of transmission antennas 815.

Second Example of Communication System

Figure 37:
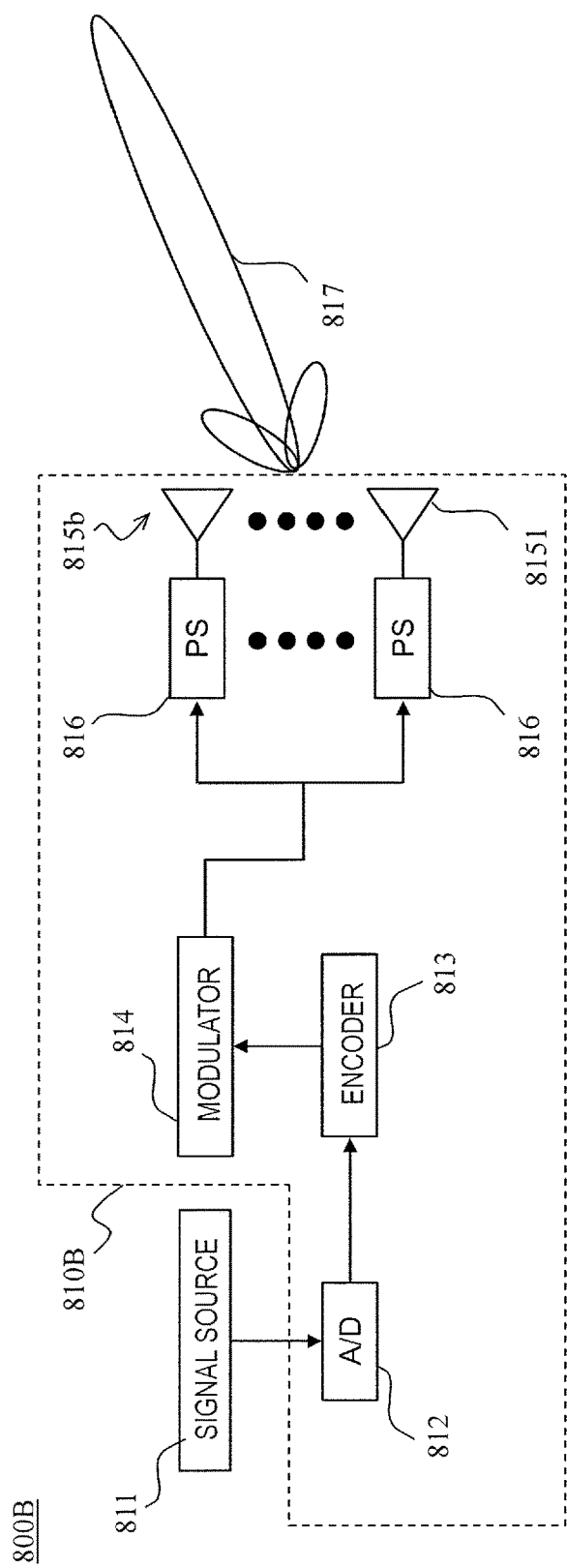
FIG. 37 is a block diagram showing an exemplary communication system 800B including a transmitter 810B which is capable of changing its radio wave radiation pattern.

FIG. 37 is a block diagram showing an example of a communication system 800B including a transmitter 810B which is capable of varying the radiation pattern of radio waves. In this exemplary application, the receiver is identical to the receiver 820A shown in FIG. 36; for this reason, the receiver is omitted from illustration in FIG. 37. In addition to the construction of the transmitter 810A, the transmitter 810B also includes an antenna array 815*b*, which includes a plurality of antenna elements 8151. The antenna array 815*b* may be an array antenna according to an embodiment of the present disclosure. The transmitter 810B further includes a plurality of phase shifters (PS) 816 which are respectively connected between the modulator 814 and the plurality of antenna elements 8151. In the transmitter 810B, an output of the modulator 814 is sent to the plurality of phase shifters 816, where phase differences are imparted and the resultant signals are led to the plurality of antenna elements 8151. In the case where the plurality of antenna elements 8151 are disposed at equal intervals, if a radio frequency signal whose phase differs by a certain amount with respect to an adjacent antenna element is fed to each antenna element 8151, a main lobe 817 of the antenna array 815*b* will be oriented in an azimuth which is inclined from the front, this inclination being in accordance with the phase difference. This method may be referred to as beam forming.

The azimuth of the main lobe 817 may be altered by allowing the respective phase shifters 816 to impart varying phase differences. This method may be referred to as beam steering. By finding phase differences that are conducive to the best transmission/reception state, the reliability of communication can be enhanced. Although the example here illustrates a case where the phase difference to be imparted by the phase shifters 816 is constant between any adjacent antenna elements 8151, this is not limiting. Moreover, phase differences may be imparted so that the radio wave will be radiated in an azimuth which allows not only the direct wave but also reflected waves to reach the receiver.

A method called null steering can also be used in the transmitter 810B. This is a method where phase differences are adjusted to create a state where the radio wave is radiated in no specific direction. By performing null steering, it becomes possible to restrain radio waves from being radiated toward any other receiver to which transmission of the radio wave is not intended. This can avoid interference. Although a very broad frequency band is available to digital communication utilizing millimeter waves or terahertz waves, it is nonetheless preferable to make as efficient a use of the bandwidth as possible. By using null steering, plural instances of transmission/reception can be performed within the same band, whereby efficiency of utility of the bandwidth can be enhanced. A method which enhances the efficiency of utility of the bandwidth by using techniques such as beam forming, beam steering, and null steering may sometimes be referred to as SDMA (Spatial Division Multiple Access).

Third Example of Communication System

In order to increase the channel capacity in a specific frequency band, a method called MIMO (Multiple-Input and Multiple-Output) may be adopted. Under MIMO, a plurality of transmission antennas and a plurality of reception antennas are used. A radio wave is radiated from each of the plurality of transmission antennas. In one example, respectively different signals may be superposed on the radio waves to be radiated. Each of the plurality of reception antennas receives all of the transmitted plurality of radio waves. However, since different reception antennas will receive radio waves that arrive through different paths, differences will occur among the phases of the received radio waves. By utilizing these differences, it is possible to, at the receiver side, separate the plurality of signals which were contained in the plurality of radio waves.

The waveguide device and antenna device according to the present disclosure can also be used in a communication system which utilizes MIMO. Hereinafter, an example such a communication system will be described.

Figure 38:
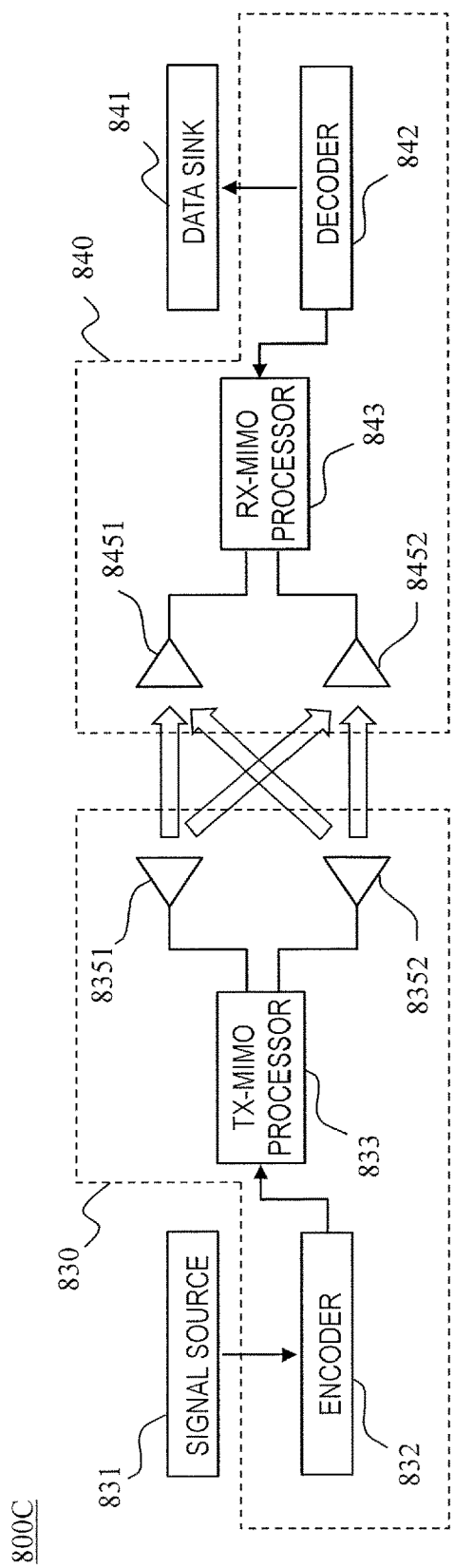
FIG. 38 is a block diagram showing an exemplary communication system 800C implementing a MIMO function.

FIG. 38 is a block diagram showing an example of a communication system 800C implementing a MIMO function. In the communication system 800C, a transmitter 830 includes an encoder 832, a TX-MIMO processor 833, and two transmission antennas 8351 and 8352. A receiver 840 includes two reception antennas 8451 and 8452, an RX-MIMO processor 843, and a decoder 842. Note that the number of transmission antennas and the number of reception antennas may each be greater than two. Herein, for ease of explanation, an example where there are two antennas of each kind will be illustrated. In general, the channel capacity of an MIMO communication system will increase in proportion to the number of whichever is the fewer between the transmission antennas and the reception antennas.

Having received a signal from the data signal source 831, the transmitter 830 encodes the signal at the encoder 832 so that the signal is ready for transmission. The encoded signal is distributed by the TX-MIMO processor 833 between the two transmission antennas 8351 and 8352.

In a processing method according to one example of the MIMO method, the TX-MIMO processor 833 splits a sequence of encoded signals into two, i.e., as many as there are transmission antennas 8352, and sends them in parallel to the transmission antennas 8351 and 8352. The transmission antennas 8351 and 8352 respectively radiate radio waves containing information of the split signal sequences. When there are N transmission antennas, the signal sequence is split into N. The radiated radio waves are simultaneously received by the two reception antennas 8451 and 8452. In other words, in the radio waves which are received by each of the reception antennas 8451 and 8452, the two signals which were split at the time of transmission are mixedly contained. Separation between these mixed signals is achieved by the RX-MIMO processor 843.

The two mixed signals can be separated by paying attention to the phase differences between the radio waves, for example. A phase difference between two radio waves of the case where the radio waves which have arrived from the transmission antenna 8351 are received by the reception antennas 8451 and 8452 is different from a phase difference between two radio waves of the case where the radio waves which have arrived from the transmission antenna 8352 are received by the reception antennas 8451 and 8452. That is, the phase difference between reception antennas differs depending on the path of transmission/reception. Moreover, unless the spatial relationship between a transmission antenna and a reception antenna is changed, the phase difference therebetween remains unchanged. Therefore, based on correlation between reception signals received by the two reception antennas, as shifted by a phase difference which is determined by the path of transmission/reception, it is possible to extract any signal that is received through that path of transmission/reception. The RX-MIMO processor 843 may separate the two signal sequences from the reception signal e.g. by this method, thus restoring the signal sequence before the split. The restored signal sequence still remains encoded, and therefore is sent to the decoder 842 so as to be restored to the original signal there. The restored signal is sent to the data sink 841.

Although the MIMO communication system 800C in this example transmits or receives a digital signal, an MIMO communication system which transmits or receives an analog signal can also be realized. In that case, in addition to the construction of FIG. 38, an analog to digital converter and a digital to analog converter as have been described with reference to FIG. 36 are provided. Note that the information to be used in distinguishing between signals from different transmission antennas is not limited to phase difference information. Generally speaking, for a different combination of a transmission antenna and a reception antenna, the received radio wave may differ not only in terms of phase, but also in scatter, fading, and other conditions. These are collectively referred to as CSI (Channel State Information). CSI may be utilized in distinguishing between different paths of transmission/reception in a system utilizing MIMO.

Note that it is not an essential requirement that the plurality of transmission antennas radiate transmission waves containing respectively independent signals. So long as separation is possible at the reception antenna side, each transmission antenna may radiate a radio wave containing a plurality of signals. Moreover, beam forming may be performed at the transmission antenna side, while a transmission wave containing a single signal, as a synthetic wave of the radio waves from the respective transmission antennas, may be formed at the reception antenna. In this case, too, each transmission antenna is adapted so as to radiate a radio wave containing a plurality of signals.

In this third example, too, as in the first and second examples, various methods such as CDM, FDM, TDM, and OFDM may be used as a method of signal encoding.

In a communication system, a circuit board that implements an integrated circuit (referred to as a signal processing circuit or a communication circuit) for processing signals may be stacked as a layer on the waveguide device and antenna device according to an embodiment of the present disclosure. Since the waveguide device and antenna device according to an embodiment of the present disclosure is structured so that plate-like conductive members are layered therein, it is easy to further stack a circuit board thereupon. By adopting such an arrangement, a transmitter and a receiver which are smaller in volume than in the case where a hollow waveguide or the like is employed can be realized.

In the first to third examples of the communication system as described above, each element of a transmitter or a receiver, e.g., an analog to digital converter, a digital to analog converter, an encoder, a decoder, a modulator, a demodulator, a TX-MIMO processor, or an RX-MIMO processor, is illustrated as one independent element in FIGS. 36, 37, and 38; however, these do not need to be discrete. For example, all of these elements may be realized by a single integrated circuit. Alternatively, some of these elements may be combined so as to be realized by a single integrated circuit. Either case qualifies as an embodiment of the present invention so long as the functions which have been described in the present disclosure are realized thereby.

Furthermore, the present disclosure encompasses microwave IC waveguide device modules as recited in the following Items.

[Item 1]

A microwave IC waveguide device module comprising:

a substrate having a first face and a second face which is opposite from the first face;

a microwave IC provided at the first face side of the substrate;

a waveguide member provided at the second face side of the substrate, the waveguide member having an electrically conductive waveguide face which opposes the second face of the substrate, the waveguide face having a stripe shape extending in a manner of following along the substrate;

an electrically conductive member covering at least a portion of the second face that extends in a manner of following along the waveguide face; and an artificial magnetic conductor extending on both sides of the waveguide member.

[Item 2]

The microwave IC waveguide device module of Item 1 wherein the electrically conductive member is disposed between the second face of the substrate and the first face.

A waveguide device and antenna device according to the present disclosure may be used for various applications where transmission/reception of electromagnetic waves of the gigahertz band or the terahertz band is performed. In particular, it is suitably used in onboard radars and wireless communication systems where downsizing is desired.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2016-065282 filed on Mar. 29, 2016, the entire contents of which are hereby incorporated by reference.

What is claimed is:

1. A microwave IC waveguide device module comprising:
a substrate having a throughhole, the substrate having a first face and a second face which is opposite from the first face;
a microwave IC provided on or above the first face of the substrate;
a waveguide member provided below the second face of the substrate, the waveguide member having an electrically conductive waveguide face which opposes the throughhole, the waveguide face having a stripe shape extending in a manner of following along the substrate;
an electrically conductive member covering at least a portion of the second face that extends in a manner of following along the waveguide face; and
an artificial magnetic conductor extending on both sides of the waveguide member, wherein,
the microwave IC includes a terminal pair, the terminal pair comprising a signal terminal and a ground terminal;
the substrate includes an inner-wall electrically conductive portion covering an inner wall of the throughhole and being electrically connected with the electrically conductive member; and
the signal terminal and the ground terminal are electrically connected respectively with two portions of the inner-wall electrically conductive portion opposing each other with the throughhole interposed therebetween.

2. The microwave IC waveguide device module of claim 1, wherein,
the artificial magnetic conductor includes a plurality of electrically conductive rods, and a conductive plate connected to roots of the plurality of electrically conductive rods; and
leading ends of at least some of the plurality of electrically conductive rods oppose the electrically conductive member.

3. The microwave IC waveguide device module of claim 1, wherein,
the artificial magnetic conductor includes a plurality of electrically conductive rods, and a conductive plate connected to roots of the plurality of electrically conductive rods;
leading ends of at least some of the plurality of electrically conductive rods oppose the electrically conductive member;
a distance between one end of the waveguide member and a portion of the waveguide member that opposes a center of the throughhole is smaller than a distance between the root of each electrically conductive rod and the electrically conductive member; and the one end is surrounded by at least some of the plurality of electrically conductive rods.

4. The microwave IC waveguide device module of claim 1, wherein a direction that the waveguide member extends in a site opposing the throughhole is parallel to a direction along an assumed line connecting the signal terminal and the ground terminal of the microwave IC.

5. The microwave IC waveguide device module of claim 1, wherein,
the two portions opposing each other with the throughhole interposed therebetween are at two different positions on the inner-wall electrically conductive portion, the two different positions opposing each other on the inner wall of the throughhole at an opening thereof; and
the signal terminal and the ground terminal are electrically connected to the two different positions.

6. The microwave IC waveguide device module of claim 3, further comprising
an aperture-edge electrically conductive portion covering at least portions of the first face, and connecting to the inner-wall electrically conductive portion at least at two positions sandwiching an opening of the throughhole on the first face side, wherein
the signal terminal and the ground terminal are electrically connected respectively to two opposing positions of the aperture-edge electrically conductive portion.

7. The microwave IC waveguide device module of claim 1, further comprising
an aperture-edge electrically conductive portion covering at least portions of the first face, and connecting to the inner-wall electrically conductive portion at least at two positions sandwiching an opening of the throughhole on the first face side, wherein
the signal terminal and the ground terminal are electrically connected respectively to two opposing positions of the aperture-edge electrically conductive portion;
an interval between the signal terminal and an edge of the opening is smaller than a distance from the edge of the opening to a center of the opening; and
an interval between the ground terminal and the edge of the opening is smaller than the distance from the edge of the opening to the center of the opening.

8. The microwave IC waveguide device module of claim 5, wherein the inner-wall electrically conductive portion extends over to the first face of the substrate.

9. The microwave IC waveguide device module of claim 3, wherein a cross-sectional shape of the inner-wall electrically conductive portion taken along an assumed plane which is perpendicular to a penetration direction of the throughhole is a rectangular shape.

10. The microwave IC waveguide device module of claim 1, wherein,
the artificial magnetic conductor includes a plurality of electrically conductive rods, and a conductive plate connected to roots of the plurality of electrically conductive rods;
leading ends of at least some of the plurality of electrically conductive rods oppose the electrically conductive member;
a distance between one end of the waveguide member and a portion of the waveguide member that opposes a center of the throughhole is smaller than a distance between the root of each electrically conductive rod and the electrically conductive member;
the one end is surrounded by at least some of the plurality of electrically conductive rods;

a cross-sectional shape of the inner-wall electrically conductive portion taken along an assumed plane which is perpendicular to a penetration direction of the throughhole is a rectangular shape; and corners of the cross-sectional shape of the inner-wall electrically conductive portion are each an interconnecting shape which is chamfered or fillet.

11. The microwave IC waveguide device module of claim 10, wherein the electrically conductive member is provided below the second face of the substrate.

12. The microwave IC waveguide device module of claim 2, wherein,
a distance between one end of the waveguide member and a portion of the waveguide member that opposes a center of the throughhole is smaller than a distance between the root of each electrically conductive rod and the electrically conductive member;
the one end is surrounded by at least some of the plurality of electrically conductive rods; and
the electrically conductive member is an electrical conductor layer defining an internal layer of the substrate.

13. The microwave IC waveguide device module of claim 10, wherein the inner-wall electrically conductive portion is a solder layer fixed to the inner wall of the throughhole.

14. The microwave IC waveguide device module of claim 10, wherein the inner-wall electrically conductive portion is one integral piece of metal that is provided in the throughhole.

15. The microwave IC waveguide device module of claim 1, further comprising another artificial magnetic conductor above the first face of the substrate, wherein,
the artificial magnetic conductor includes
a plurality of electrically conductive rods, and
a conductive plate connected to roots of the plurality of electrically conductive rods;
leading ends of at least some of the plurality of electrically conductive rods oppose the electrically conductive member;
the other artificial magnetic conductor includes
a plurality of further electrically conductive rods,
a further conductive plate that is connected to roots of the plurality of further electrically conductive rods, and
a further electrically conductive member; and
the microwave IC is located between at least some of the plurality of further electrically conductive rods and at least a portion of the further electrically conductive member.

16. The microwave IC waveguide device module of claim 1, further comprising another artificial magnetic conductor above the first face of the substrate, wherein,
the artificial magnetic conductor includes
a plurality of electrically conductive rods, and
a conductive plate connected to roots of the plurality of electrically conductive rods;
leading ends of at least some of the plurality of electrically conductive rods oppose the electrically conductive member;
a distance between one end of the waveguide member and a portion of the waveguide member that opposes a center of the throughhole is smaller than a distance between the root of each electrically conductive rod and the electrically conductive member;
the one end is surrounded by at least some of the plurality of electrically conductive rods;
the other artificial magnetic conductor includes
a plurality of further electrically conductive rods,
a further conductive plate that is connected to roots of the plurality of further electrically conductive rods, and
a further electrically conductive member; and
the microwave IC is located between at least some of the plurality of further electrically conductive rods and at least a portion of the further electrically conductive member.

17. The microwave IC waveguide device module of claim 15, wherein the electrically conductive member extends beyond the portion of the second face extending in a manner of following along the waveguide face, and composes at least a portion of the further electrically conductive member.

18. The microwave IC waveguide device module of claim 17, wherein leading ends of at least some of the plurality of further electrically conductive rods oppose the microwave IC.

19. The microwave IC waveguide device module of claim 18, wherein the further electrically conductive member is provided on or above the first face of the substrate.

20. The microwave IC waveguide device module of claim 18, wherein the electrically conductive member is provided below the second face of the substrate.

21. The microwave IC waveguide device module of claim 18, wherein the electrically conductive member defines an internal layer of the substrate.

22. The microwave IC waveguide device module of claim 1, further comprising
another artificial magnetic conductor above the first face of the substrate; and
a resin layer, wherein,
the other artificial magnetic conductor includes
a plurality of further electrically conductive rods,
a further conductive plate that is connected to roots of the plurality of further electrically conductive rods, and
a further electrically conductive member;
the microwave IC is located between at least some of the plurality of further electrically conductive rods and at least a portion of the further electrically conductive member;
the resin layer is arranged between the microwave IC and at least some of the plurality of further electrically conductive rods; and
the resin layer is in contact with at least one of the microwave IC and leading ends of at least some of the plurality of further electrically conductive rods.

23. The microwave IC waveguide device module of claim 22, wherein the resin layer is in contact with the microwave IC and leading ends of at least some of the plurality of further electrically conductive rods.

24. The microwave IC waveguide device module of claim 1, further comprising
another artificial magnetic conductor above the first face of the substrate; and
a heat sink, wherein,
the other artificial magnetic conductor includes
a plurality of further electrically conductive rods,
a further conductive plate that is connected to roots of the plurality of further electrically conductive rods, and
a further electrically conductive member;
the microwave IC is located between at least some of the plurality of further electrically conductive rods and at least a portion of the further electrically conductive member; and the heat sink is thermally connected to the further conductive plate.

25. The microwave IC waveguide device module of claim 1, further comprising
another artificial magnetic conductor above the first face of the substrate;
an insulation layer made of an electrically insulative material; and
a heat sink, wherein,
the other artificial magnetic conductor includes
a plurality of further electrically conductive rods,
a further conductive plate that is connected to roots of the plurality of further electrically conductive rods, and
a further electrically conductive member;
the microwave IC is located between at least some of the plurality of further electrically conductive rods and at least a portion of the further electrically conductive member;
the heat sink is thermally connected to the further conductive plate; and
the insulation layer is arranged between the microwave IC and at least some of the plurality of further electrically conductive rods.

26. The microwave IC waveguide device module of claim 1, further comprising
another artificial magnetic conductor above the first face of the substrate;
an insulation layer made of an electrically insulative material; and
a heat sink, wherein,
the artificial magnetic conductor includes
a plurality of electrically conductive rods, and
a conductive plate connected to roots of the plurality of electrically conductive rods;
leading ends of at least some of the plurality of electrically conductive rods oppose the electrically conductive member;
a distance between one end of the waveguide member and a portion of the waveguide member that opposes a center of the throughhole is smaller than a distance between the root of each electrically conductive rod and the electrically conductive member;
the one end is surrounded by at least some of the plurality of electrically conductive rods;
the other artificial magnetic conductor includes
a plurality of further electrically conductive rods,
a further conductive plate that is connected to roots of the plurality of further electrically conductive rods, and
a further electrically conductive member;
the microwave IC is located between at least some of the plurality of further electrically conductive rods and at least a portion of the further electrically conductive member;
the heat sink is thermally connected to the further conductive plate; and
the insulation layer is arranged between the microwave IC and at least some of the plurality of further electrically conductive rods.

* * * * *